US008963336B2

(12) United States Patent
Jung et al.

(10) Patent No.: US 8,963,336 B2
(45) Date of Patent: Feb. 24, 2015

(54) SEMICONDUCTOR PACKAGES, METHODS OF MANUFACTURING THE SAME, AND SEMICONDUCTOR PACKAGE STRUCTURES INCLUDING THE SAME

(71) Applicants: Deok-young Jung, Seoul (KR); Pil-kyu Kang, Anyang-si (KR); Byung-lyul Park, Seoul (KR); Ji-soon Park, Suwon-si (KR); Seong-min Son, Hwaseong-si (KR); Jin-ho An, Seoul (KR); Ji-hwang Kim, Cheonan-si (KR)

(72) Inventors: Deok-young Jung, Seoul (KR); Pil-kyu Kang, Anyang-si (KR); Byung-lyul Park, Seoul (KR); Ji-soon Park, Suwon-si (KR); Seong-min Son, Hwaseong-si (KR); Jin-ho An, Seoul (KR); Ji-hwang Kim, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/333,509

(22) Filed: Jul. 16, 2014

(65) Prior Publication Data

US 2014/0327150 A1 Nov. 6, 2014

Related U.S. Application Data

(63) Continuation-in-part of application No. 13/955,259, filed on Jul. 31, 2013, now Pat. No. 8,802,495.

(30) Foreign Application Priority Data

Aug. 3, 2012 (KR) ........................ 10-2012-0085396

(51) Int. Cl.
*H01L 29/40* (2006.01)
*H01L 23/48* (2006.01)

(52) U.S. Cl.
CPC ................................. *H01L 23/481* (2013.01)
USPC ........................................................... 257/774

(58) Field of Classification Search
CPC ........ H01L 23/481; H01L 21/50; H01L 23/768
USPC ........................................................... 257/774
See application file for complete search history.

(56) References Cited

U.S. PATENT DOCUMENTS

| 7,795,115 | B2 | 9/2010 | Kameyama et al. |
| 7,928,534 | B2 * | 4/2011 | Hsu et al. ........................ 257/621 |
| 7,960,840 | B2 | 6/2011 | Bonifield et al. |
| 8,026,592 | B2 | 9/2011 | Yoon et al. |

(Continued)

FOREIGN PATENT DOCUMENTS

| JP | 2013074275 A | 4/2013 |
| JP | 2013130401 A | 7/2013 |

(Continued)

*Primary Examiner* — Alexander Ghyka
(74) *Attorney, Agent, or Firm* — Renaissance IP Law Group LLP

(57) ABSTRACT

A semiconductor device includes a substrate including a first surface and a second surface opposite to each other, a through-via electrode extending through the substrate. The through-via electrode has an interconnection metal layer and a barrier metal layer surrounding a side surface of the interconnection metal layer. One end of the through-via electrode protrudes above the second surface. A spacer insulating layer may be provided on an outer sidewall of the through-via electrode. A through-via electrode pad is connected to the through-via electrode and extends on the spacer insulating layer substantially parallel to the second surface. A first silicon oxide layer and a silicon nitride layer are stacked on the second surface. A thickness of the first silicon oxide layer is greater than a thickness of the silicon nitride layer.

20 Claims, 36 Drawing Sheets

(56) References Cited

U.S. PATENT DOCUMENTS

| | | | |
|---|---|---|---|
| 8,114,707 B2 | 2/2012 | Farooq et al. | |
| 8,243,487 B2 | 8/2012 | Kang et al. | |
| 8,258,007 B2 | 9/2012 | Shen et al. | |
| 8,267,143 B2 | 9/2012 | George et al. | |
| 8,293,580 B2 | 10/2012 | Kim et al. | |
| 8,324,105 B2 | 12/2012 | Cheng | |
| 8,367,471 B2 | 2/2013 | Pratt | |
| 8,395,267 B2 | 3/2013 | Roozeboom et al. | |
| 8,399,354 B2 | 3/2013 | Chen | |
| 8,450,151 B1 | 5/2013 | Poddar et al. | |
| 8,466,062 B2 | 6/2013 | Lu et al. | |
| 8,497,564 B2 | 7/2013 | Chen et al. | |
| 8,531,034 B2 | 9/2013 | Byun et al. | |
| 8,604,615 B2 | 12/2013 | Lee et al. | |
| 8,692,359 B2 * | 4/2014 | Lin et al. | 257/621 |
| 8,716,131 B2 * | 5/2014 | Chen et al. | 438/667 |
| 2007/0178694 A1 * | 8/2007 | Hiatt | 438/667 |
| 2009/0039491 A1 | 2/2009 | Kim et al. | |
| 2009/0126974 A1 | 5/2009 | Yuasa et al. | |
| 2010/0012364 A1 | 1/2010 | Kim et al. | |
| 2010/0047953 A1 * | 2/2010 | Kurita et al. | 438/58 |
| 2010/0126765 A1 | 5/2010 | Kim et al. | |
| 2010/0279463 A1 | 11/2010 | Hsiao et al. | |
| 2011/0010908 A1 | 1/2011 | George et al. | |
| 2011/0058348 A1 | 3/2011 | Sakai et al. | |
| 2011/0069467 A1 | 3/2011 | Flaim et al. | |
| 2011/0095373 A1 * | 4/2011 | Hwang et al. | 257/368 |
| 2011/0297329 A1 | 12/2011 | Canale et al. | |
| 2011/0304999 A1 | 12/2011 | Yu et al. | |
| 2011/0318923 A1 * | 12/2011 | Park et al. | 438/675 |
| 2012/0013013 A1 | 1/2012 | Sadaka et al. | |
| 2012/0018881 A1 | 1/2012 | Pagaila | |
| 2012/0034437 A1 | 2/2012 | Puligadda et al. | |
| 2012/0187568 A1 | 7/2012 | Lin et al. | |
| 2012/0286404 A1 | 11/2012 | Pagaila | |
| 2013/0140700 A1 | 6/2013 | Ohmi | |
| 2013/0187288 A1 | 7/2013 | Hong et al. | |
| 2013/0207242 A1 * | 8/2013 | Lee et al. | 257/621 |
| 2013/0264720 A1 * | 10/2013 | Chun et al. | 257/774 |
| 2013/0299961 A1 | 11/2013 | Chen | |
| 2013/0299976 A1 | 11/2013 | Chen et al. | |
| 2013/0323875 A1 * | 12/2013 | Park et al. | 438/70 |
| 2014/0001649 A1 | 1/2014 | Byun et al. | |
| 2014/0017823 A1 | 1/2014 | England et al. | |
| 2014/0035164 A1 * | 2/2014 | Moon et al. | 257/774 |
| 2014/0070426 A1 * | 3/2014 | Park et al. | 257/774 |
| 2014/0162449 A1 * | 6/2014 | An et al. | 438/613 |

FOREIGN PATENT DOCUMENTS

| | | |
|---|---|---|
| JP | 2013197470 A | 9/2013 |
| JP | 2014041951 A | 3/2014 |
| KR | 20090111380 A | 10/2009 |
| KR | 20100009849 A | 1/2010 |
| KR | 20100040196 A | 4/2010 |
| KR | 20100041980 A | 4/2010 |
| KR | 20100136866 A | 12/2010 |
| KR | 101101432 B | 3/2011 |

* cited by examiner

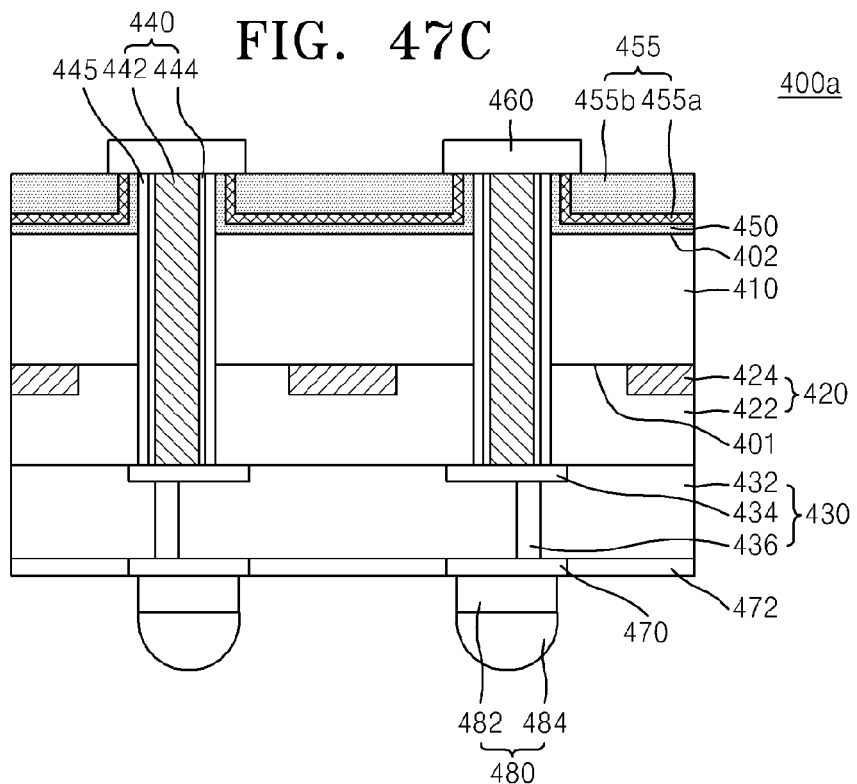
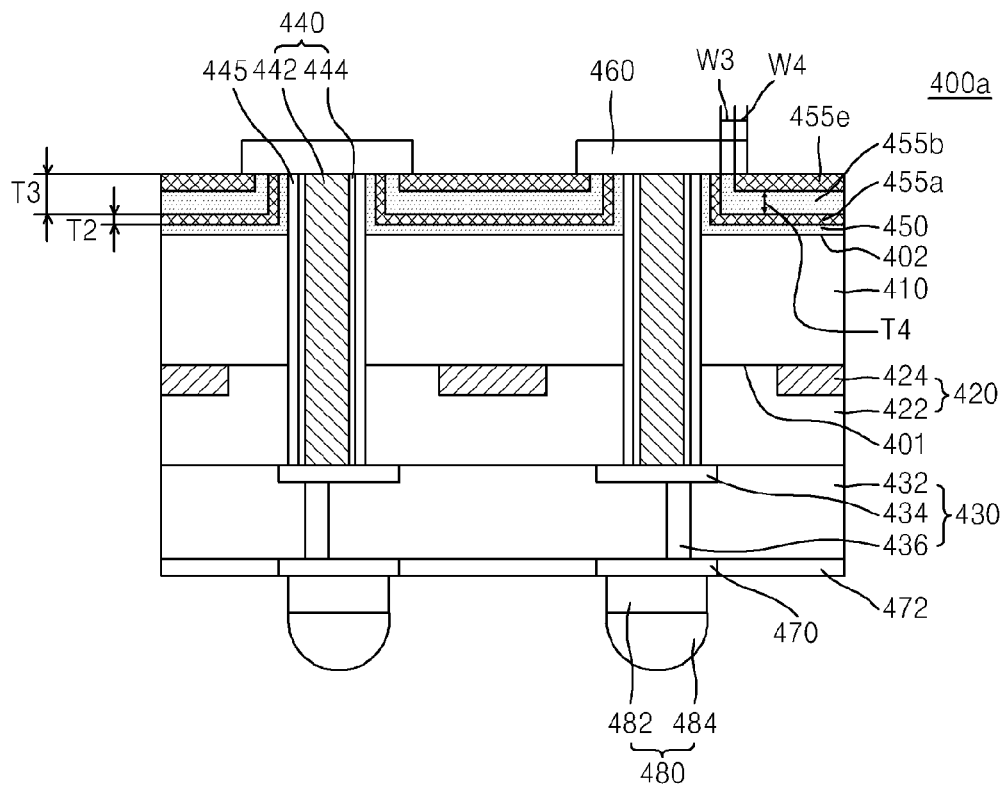

US 8,963,336 B2

SEMICONDUCTOR PACKAGES, METHODS OF MANUFACTURING THE SAME, AND SEMICONDUCTOR PACKAGE STRUCTURES INCLUDING THE SAME

CROSS-REFERENCE TO RELATED APPLICATIONS

This US non-provisional patent application is a continuation-in-part of U.S. patent application Ser. No. 13/955,259, filed Jul. 31, 2013 which claims the benefit of Korean Patent Application No. 10-2012-0085396, filed on Aug. 3, 2012, the entirety of which is incorporated by reference herein.

BACKGROUND

The inventive concepts relate to a semiconductor and, more particularly, to semiconductor devices, methods of manufacturing the same and semiconductor package structures including the same.

Semiconductor chips are widely used in the electronics industry because of their smaller size, multi-functional capability, and/or lower manufacture costs per unit. The semiconductor chips may be formed into semiconductor packages by various packaging techniques. The semiconductor packages including the semiconductor chips may be installed in various electronic products.

Sizes of the semiconductor chips and/or the semiconductor packages have been reduced. Thus, various problems may be caused. For example, it may be difficult to handle the semiconductor chips and/or semiconductor packages. As a result, manufacturing yield of the semiconductor packages may be reduced and a manufacturing time of the semiconductor packages may increase, thereby reducing productivity of the semiconductor packages and deteriorating reliability of the semiconductor packages.

SUMMARY

Example embodiments may provide semiconductor devices, semiconductor packages capable of improving productivity, methods of manufacturing the same, and semiconductor package structures including the same.

Example embodiments may also provide semiconductor packages capable of improving reliability, methods of manufacturing the same, and semiconductor package structures including the same.

According to an example embodiment, a semiconductor device includes a substrate including a first surface and a second surface opposite to each other, a through-via electrode having an interconnection metal layer and a barrier metal layer surrounding a side surface of the interconnection metal layer and protruding above the second surface, a spacer insulating layer provided on an outer sidewall of the through-via electrode, a through-via electrode pad connected to the through-via electrode and extending on the spacer insulating layer substantially parallel to the second surface, and a first silicon oxide layer and a silicon nitride layer stacked on the second surface. A thickness of the first silicon oxide layer is greater than a thickness of the silicon nitride layer.

The first silicon oxide layer may be in direct contact with the second surface.

The silicon nitride layer may be in direct contact with the first silicon oxide layer.

The first silicon oxide layer may extend along a circumference of the through-via electrode from the second surface to a bottom surface of the through-via electrode pad.

A top surface of the silicon nitride layer may be substantially coplanar with the bottom surface of the through-via electrode pad.

A thickness of a portion of the first silicon oxide layer, which extends along the second surface, may be substantially equal to a width of a portion of the first silicon oxide layer, which extends and is in contact with the bottom surface of the through-via electrode pad.

A spacer insulating layer may be further interposed between the first silicon oxide layer and the through-via electrode.

The thickness of the first silicon oxide layer may be about 2 to 8 times as great as the thickness of the silicon nitride layer.

The first silicon oxide layer may have a modulus of about 55 to 65 GPa.

The first silicon oxide layer may have a hardness of about 5.5 to 6.2 GPa.

The semiconductor device may further include a second silicon oxide layer provided directly on the second surface. The silicon nitride layer and the first silicon oxide layer may be sequentially provided on the second silicon oxide layer.

The second silicon oxide layer may extend along the circumference of the through-via electrode from the second surface to the bottom surface of the through-via electrode pad.

A top surface of the first silicon oxide layer may be substantially coplanar with a bottom surface of the through-via electrode pad.

A thickness of the second silicon oxide layer may be smaller than the thickness of the silicon nitride layer.

A bottom surface of the through-via electrode pad may be in direct contact with the first silicon oxide layer, the silicon nitride layer, and the second silicon oxide layer.

Areas of contact of the first silicon oxide layer, the silicon nitride layer, and the second silicon oxide layer with the through-via electrode pad may form a concentric circle.

A portion of a top surface of the first silicon oxide layer may be in contact with the bottom surface of the through-via electrode pad, and the remaining portion of the top surface of the first silicon oxide layer may extend on the same plane surface as the bottom surface of the through-via electrode pad in a direction parallel to the second surface.

The silicon nitride layer may be a first silicon nitride layer. The semiconductor device may further include a second silicon nitride layer provided on a top surface of the first silicon oxide layer.

At least a portion of the second silicon nitride layer may be in contact with a bottom surface of the through-via electrode pad.

An area of contact of the second silicon nitride layer with the through-via electrode pad may be provided to a substantially constant width along a sidewall of the through-via electrode pad.

The thickness of the first silicon oxide layer may be about 10 to 30 times as great as the thickness of the silicon nitride layer.

The substrate may be a semiconductor substrate or an interposer substrate.

According to an example embodiment, a semiconductor device includes a semiconductor substrate including a first surface, which is an active surface, and a second surface, which is opposite to the first surface, an interconnection layer formed on the first surface of the semiconductor substrate, a through-via electrode having one end electrically connected to the interconnection layer and the other end protruding above the second surface of the semiconductor substrate, the through-via electrode having an interconnection metal layer and a barrier metal layer surrounding a side surface of the interconnection metal layer, a spacer insulating layer provided on an outer sidewall of the through-via electrode, a through-via electrode pad connected to the through-via electrode on the second surface and extending on the spacer insulating layer substantially parallel to the second surface, a first insulating layer provided on the second surface of the second surface of the semiconductor substrate, and a passivation layer provided on the first insulating layer. The first insulating layer is selected such that adherence between the first insulating layer and the semiconductor substrate is higher than adherence between the passivation layer and the semiconductor substrate.

According to an example embodiment, a semiconductor package includes a package substrate, at least one semiconductor device of claim 1 mounted on the package substrate, an encapsulant configured to encapsulate the semiconductor device.

According to an example embodiment, an electronic system includes a controller, an input/output unit for inputting or outputting data, a memory unit for storing the data, an interface unit for transmitting or receiving data to or from an external device, and a bus for connecting the controller, the input/output unit, the memory unit, and the interface unit so as to communicate with each other. At least one of the controller and the memory unit includes the above-described semiconductor device.

According to an example embodiment, a method of manufacturing a semiconductor device includes forming a semiconductor device on a first surface of a semiconductor substrate, forming a through-via electrode to be electrically connected to the semiconductor device and extend toward a backside surface of the semiconductor substrate, which is opposite to the first surface of the semiconductor substrate, removing a portion of the semiconductor substrate from the backside surface to form a second surface opposite to the first surface such that the through-via electrode protrudes above the second surface, forming a silicon nitride layer and a first silicon oxide layer having a greater thickness than the silicon nitride layer on the second surface, exposing the through-via electrode from the first silicon oxide layer and the silicon nitride layer, and forming a through-via electrode pad to be electrically connected to the exposed through-via electrode.

The exposure of the through-via electrode from the first silicon oxide layer and the silicon nitride layer may be performed using a chemical mechanical polishing (CMP) process, and the CMP process may be performed using a timed polishing process.

The formation of the silicon nitride layer and the first silicon oxide layer having the greater thickness than the silicon nitride layer on the second surface may include forming a first silicon oxide layer on the second surface, and forming a silicon nitride layer on the first silicon oxide layer.

A thickness of the first silicon oxide layer may be about 2 to 8 times as great as a thickness of the silicon nitride layer.

The formation of the silicon nitride layer and the first silicon oxide layer having the greater thickness than the silicon nitride layer on the second surface may include forming a silicon nitride layer on the second surface, and forming a first silicon oxide layer on the silicon nitride layer.

A thickness of the first silicon oxide layer may be about 10 to 30 times as great as a thickness of the silicon nitride layer.

The formation of the silicon nitride layer on the second surface may include forming a second silicon oxide layer on the second surface, and forming the silicon nitride layer on the second silicon oxide layer.

During the forming of the silicon nitride layer and the first silicon oxide layer having the greater thickness than the silicon nitride layer on the second surface, the silicon nitride layer and the first silicon oxide layer may be substantially conformally formed, and a protrusion having a smaller aspect ratio than that of a portion of the through-via electrode protruding from the second surface may be formed.

The protrusion may have an aspect ratio of about 0.3 to about 0.7.

In some embodiments, a method of manufacturing a device, the method comprising: providing a semiconductor substrate having a first surface and a backside surface opposite to each other; forming a semiconductor device on the first surface; forming a through-via electrode structure through the substrate to be electrically connected to the semiconductor device, the through-via electrode structure having an interconnection metal layer and a barrier metal layer surrounding a side surface of the interconnection metal layer, removing a portion of the semiconductor substrate from the backside surface to form a second surface opposite to the first surface such that a portion of the through-via electrode structure protrudes above the second surface, wherein the protruded portion of the through-via electrode structure has an aspect ratio of greater than 1; reducing an aspect ratio of the protruded portion of the through-via electrode structure to about 0.3 to about 0.7; exposing a top portion of the interconnection metal layer; and forming a through-via electrode pad to be electrically connected to the interconnection metal layer. In some embodiments, an aspect ratio of the protruded portion of the through-via electrode structure may be significantly reduced by sequentially forming a first silicon oxide layer and a silicon nitride layer on the second surface in a controller manner, where the silicon oxide layer has a greater thickness than that of the silicon nitride layer.

BRIEF DESCRIPTION OF THE DRAWINGS

Example embodiments will become apparent and easily appreciated in view of the attached drawings and accompanying detailed description. FIGS. 1-48 represent non-limiting, example embodiments as described herein.

FIGS. 1 to 9 are cross-sectional views illustrating a method of manufacturing a semiconductor package according to an example embodiment;

FIG. 10 is a perspective view illustrating an example of a parent substrate in FIG. 1;

FIGS. 12 and 13 are cross-sectional views illustrating a modified method of manufacturing a semiconductor package according to an example embodiment;

FIGS. 14 and 15 are cross-sectional views illustrating a modified method of manufacturing a semiconductor package according to another example embodiment;

FIGS. 16 and 17 are cross-sectional views illustrating a modified method of manufacturing a semiconductor package according to still another example embodiment;

FIG. 18 is a cross-sectional view illustrating a semiconductor package according to an example embodiment;

FIG. 19 is a cross-sectional view illustrating a modified semiconductor package according to an example embodiment;

FIG. 20 is a cross-sectional view illustrating a modified semiconductor package according to another example embodiment;

FIG. 21 is a cross-sectional view illustrating a modified semiconductor package according to still another example embodiment;

FIGS. 22 to 26 are cross-sectional views illustrating a method of manufacturing a semiconductor package according to another example embodiment;

FIG. 27 is a perspective view illustrating a structure shown in FIG. 25;

FIGS. 28 and 29 are cross-sectional views illustrating a modified method of manufacturing a semiconductor package according to an example embodiment;

FIG. 30 is cross-sectional view illustrating a modified method of manufacturing a semiconductor package according to another example embodiment;

FIG. 31 is cross-sectional view illustrating a modified method of manufacturing a semiconductor package according to still another example embodiment;

FIGS. 32 and 33 are cross-sectional views illustrating a modified method of manufacturing a semiconductor package according to yet another example embodiment;

FIGS. 34, 35, 36, 37 and 38 are cross-sectional views illustrating a modified method of manufacturing a semiconductor package according to a further example embodiment;

FIG. 39 is a schematic block diagram illustrating an electronic systems including semiconductor packages according to example embodiments; and FIG. 40 is a schematic block diagram illustrating a memory card including semiconductor packages according to example embodiments.

FIG. 41 is a cross-sectional perspective view of a semiconductor device according to an example embodiment;

FIG. 43 is a cross-sectional side view of a semiconductor device according to still another example embodiment;

FIG. 45 is a flowchart illustrating a method of manufacturing a semiconductor device according to an example embodiment;

FIGS. 47A through 47C are cross-sectional side views illustrating sequential processes of manufacturing a semiconductor device according to another example embodiment; and FIG. 48 is a cross-sectional side view of a semiconductor device according to yet another example embodiment.

DETAILED DESCRIPTION OF THE EMBODIMENTS

Figure 1:
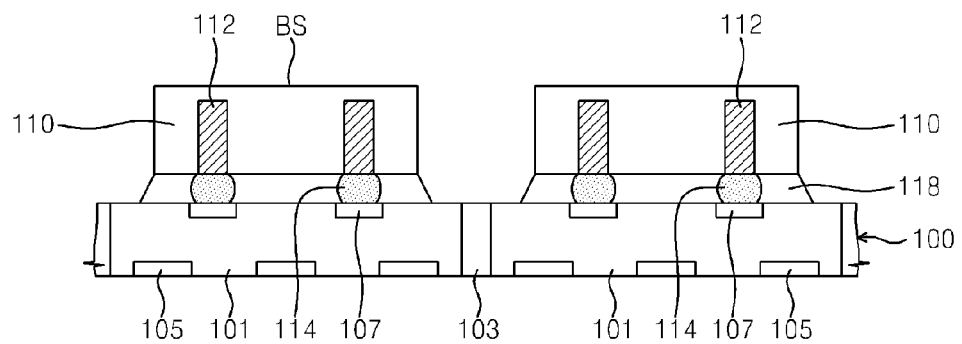

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts. Example embodiments explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

First Embodiment

FIGS. 1 to 9 are cross-sectional views illustrating a method of manufacturing a semiconductor package according to an example embodiment. FIG. 10 is a perspective view illustrating an example of a parent substrate in FIG. 1.

Referring to FIG. 1, a parent substrate 100 may be prepared. The parent substrate 100 includes a plurality of package board parts 101 laterally spaced apart from each other. Additionally, the parent substrate 100 may further include a scribe region 103 disposed between the package board parts 101. The package board parts 101 may be isolated from each other by the scribe region 103. For example, each of the package board parts 101 may be a printed circuit board. Thus, the parent substrate 100 may include a plurality of printed circuit boards connected to each other through the scribe region 103.

Each of the package board parts 101 may include at least one external connection pad 105 and at least one internal connection pad 107. The external connection pad 105 may be disposed on a bottom surface of the package board part 101, and the internal connection pad 107 may be disposed on a top surface of the package board part 101. Internal interconnections may be disposed within the package board part 101. The internal connection pad 107 may be electrically connected to the external connection pad 105 through the internal interconnections.

For example, the parent substrate 100 may have a circular plate as illustrated in FIG. 10. For example, the parent substrate 100 may have the same shape as a wafer on which chips are formed. However, the inventive concepts are not limited thereto. The parent substrate 100 may have various shapes.

Referring to FIG. 1, a first chip 110 may be mounted on each of the package board part 101. The first chip 110 may have a first surface adjacent to the package board part 101 and a second surface BS opposite to the first surface. The first chip 110 may include at least one through-via electrode 112. The through-via electrode 112 may extend from the first surface toward the second surface BS through the inside of the first chip 110. A thickness of the first chip 110 may be greater than a height of the through-via electrode 112. Thus, the through-via electrode 112 may partially penetrate the first chip 110, and the through-via electrode 112 may be covered by the second surface BS and may not be exposed. Because the first chip 110 may have the thickness greater than the height of the through-via electrode 11, the first chip 110 may be sufficiently thick. Thus, the first chip 110 may be easily handled.

The first chip 110 may further include a first chip bump 114. The first chip bump 114 may be disposed on the first surface of the first chip 110 and be electrically connected to an end of the through-via electrode 112. The first chip 110 may be a semiconductor chip, e.g., a semiconductor memory device, a logic device, or a system on chip performing various functions. Alternatively, the first chip 110 may be an interposer.

The first chip 110 may have various structures according to a shape of the through-via electrode 112. This will be described with reference to FIGS. 11A, 11B, and 11C.

Figure 11A:
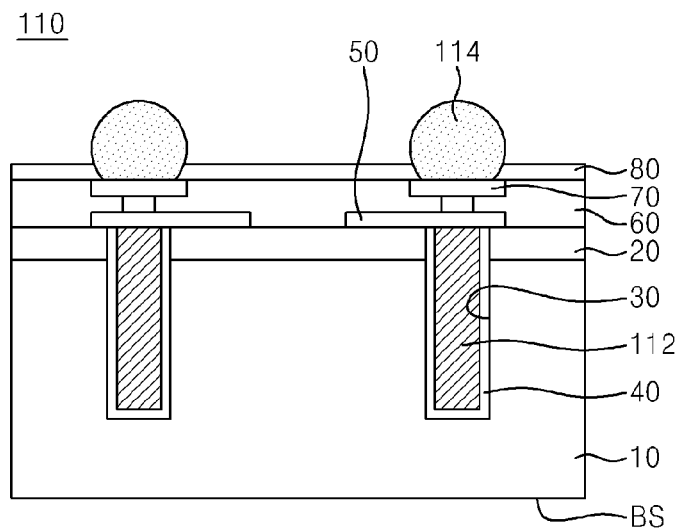
FIG. 11A is a cross-sectional view illustrating an example of a first chip in FIG. 1.

FIG. 11A is a cross-sectional view illustrating an example of a first chip in FIG. 1.

Referring to FIG. 11A, a first chip 110 according to an example embodiment may include a semiconductor substrate 10. The semiconductor substrate 10 may have a front side and a back side opposite to each other. The back side of the semiconductor substrate 10 may be the second surface BS of the first chip 110. An integrated circuit may be disposed on the front side of the semiconductor substrate 10. A first interlayer insulating layer 20 may be disposed on the front surface of the semiconductor substrate 10 to cover the integrated circuit. The integrated circuit may include memory cells and/or a logic circuit. The first interlayer insulating layer 20 may be single-layered or multi-layered.

A through-via electrode 112 according to an example embodiment may have a via-middle structure. The through-via electrode 112 is formed after the integrated circuit and the first interlayer 20 are formed and before a metal interconnection 50 is formed. For example, the through-via electrode 112 may be disposed in a via-hole 30 extending from a top surface of the first interlayer insulating layer 20 into the semiconductor substrate 10. A via-insulating layer 40 may be disposed between an inner surface of the via-hole 30 and the through-via electrode 112. In this case, a bottom surface of the via-hole 30 may be spaced apart from the second surface BS of the first chip 110. For example, the bottom surface of the via-hole 30 may be disposed at a level higher than the second surface BS of the first chip 110, as illustrated in FIG. 11A.

The metal interconnection 50 may be disposed on the first interlayer insulating layer 60 and electrically connect the through-via electrode 112 to the integrated circuit. The metal interconnection 50 may be a single layer or a multi-layer. A second interlayer insulating layer 60 may cover the metal interconnection 50. The second interlayer insulating layer 60 may be single-layered or multi-layered. A chip pad 70 may be disposed on the second interlayer insulating layer 60. The chip pad 70 may be electrically connected to the metal interconnection 50. A chip-protecting layer 80 may be disposed on the second interlayer insulating layer 60. The chip-protecting layer 80 may have an opening exposing the chip pad 70. The first chip bump 114 may be connected to the chip pad 70 through the opening of the chip-protecting layer 80. For example, the first chip bump 114 may be a solder ball. However, the inventive concepts are not limited thereto.

Figure 11B:
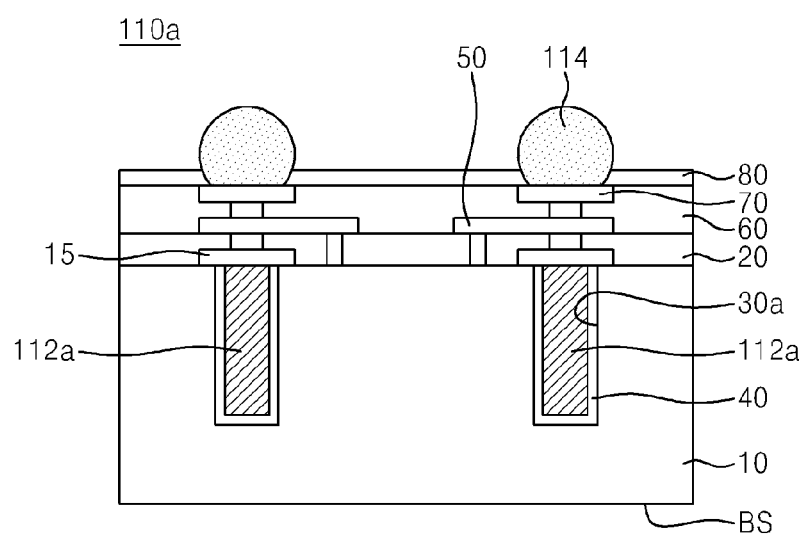
FIG. 11B is a cross-sectional view illustrating another example of a first chip in FIG. 1.

FIG. 11B is a cross-sectional view illustrating another example of a first chip in FIG. 1.

Referring to FIG. 11B, a first chip 110a according to an example embodiment may include a through-via electrode 112a having a via-first structure. The through-via electrode 112a may be disposed in a via-hole 30a formed in the semiconductor substrate 10. The via-insulating layer 40 may be disposed between an inner surface of the via-hole 30a and the through-via electrode 112a. The first interlayer insulating layer 20 may cover the through-via electrode 112a. A lower interconnection 15 may be disposed between the through-via electrode 112a and the first interlayer insulating layer 20. The metal interconnection 50 may electrically connect the through-via electrode 112a to the integrated circuit covered by the first interlayer insulating layer 20 through the lower interconnection 15.

Figure 11C:
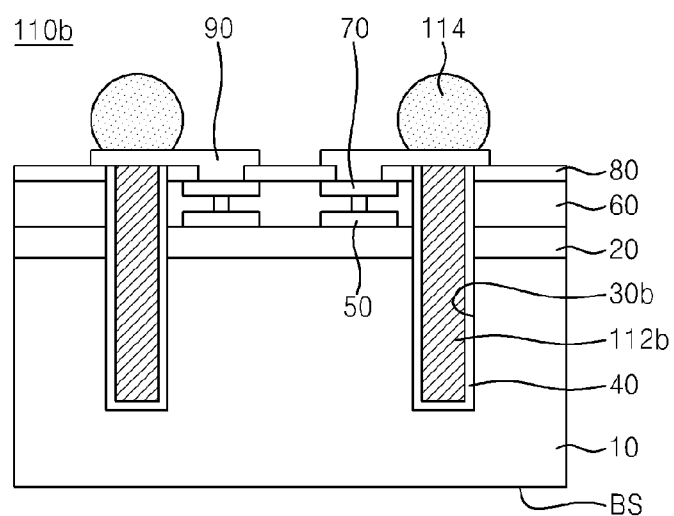
FIG. 11C is a cross-sectional view illustrating still another example of a first chip in FIG. 1.

FIG. 11C is a cross-sectional view illustrating still another example of a first chip in FIG. 1.

Referring to FIG. 11C, a first chip 110b according to an example embodiment may include a through-via electrode 112b having a via-last structure. The through-via electrode 112b may be disposed in a via-hole 30b, which is formed in at least the second and first interlayer insulating layers 60 and 20 and the semiconductor substrate 10. The via-insulating layer 40 may be disposed between an inner surface of the via-hole 30b and the through-via electrode 112b. As illustrated in FIG. 11C, the through-via electrode 112b and the via-hole 30b may extend upward to penetrate the chip-protecting layer 80. An interconnecting pad 90 may electrically connect the through-via electrode 112b to the chip pad 70. The first chip bump 114 may be formed on the interconnecting pad 90.

One of the first chips 110, 110a, and 110b of FIGS. 11A to 11C may be mounted on each of the package board parts 101 of FIG. 1. Hereinafter, the first chip 110 of FIG. 11A mounted on the package board part 101 will be used as an example for convenience of explanation.

Referring to FIG. 1 again, the first chip 110 may be mounted on the package board part 101 by a flip-chip bonding method. Thus, the first chip bump 114 of the first chip 110 may be connected to the internal connection pad 107 of the package board part 101. For example, the first chip 110 may be electrically connected to the package board part 101 through the first chip bump 114. For example, mounting the first chip 110 on the package board part 101 may include loading the first chip 110 on the package board part 101 such that the first chip bump 114 is connected to the internal connection pad 107, and filling a space between the first chip and the package board part 101 with a first underfiller 118. The first underfiller 118 may include at least one of epoxy molding compounds (EMCs).

Figure 2:
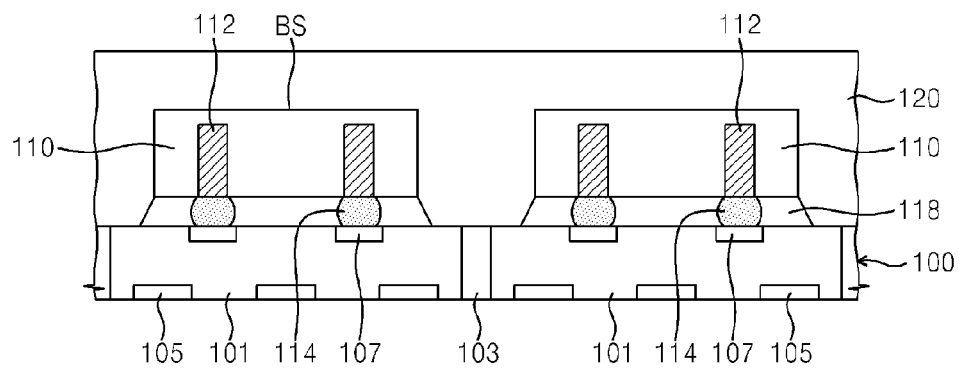

Referring to FIG. 2, a first mold layer 120 may be formed on the parent substrate 100 including the mounted first chips 110. The first mold layer 120 may cover sidewalls and the second surfaces BS of the first chips 110. The first mold layer 120 may include at least one of epoxy molding compounds. For example, the first mold layer 120 may include the same epoxy molding compound as the first underfiller 118. Alternatively, the first mold layer 120 may include an epoxy molding compound different from that of the first underfiller 118.

Figure 3:
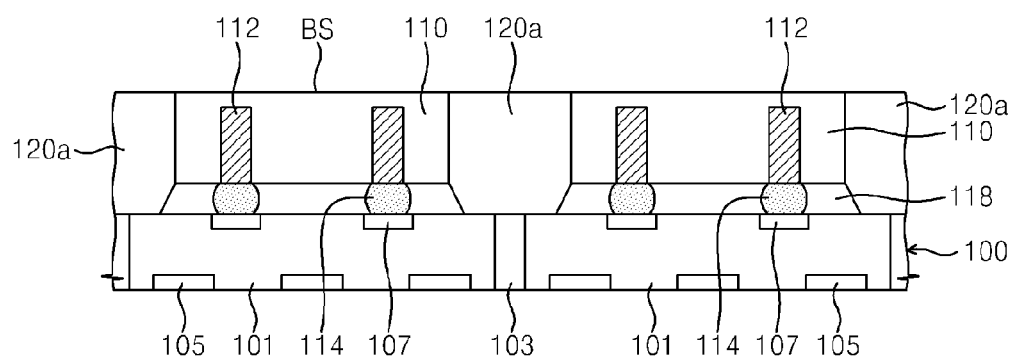

Referring to FIG. 3, the first mold layer 120 may be planarized to expose the first chips 110. At this time, the second surfaces BS of the first chips 110 may be exposed. The first mold layer 120 may be planarized by, e.g., a grinding process, an etch-back process, or a chemical mechanical polishing (CMP) process. The planarized first mold layer 120a may have a top surface substantially coplanar with the exposed second surfaces BS of the first chips 110.

Figure 4:
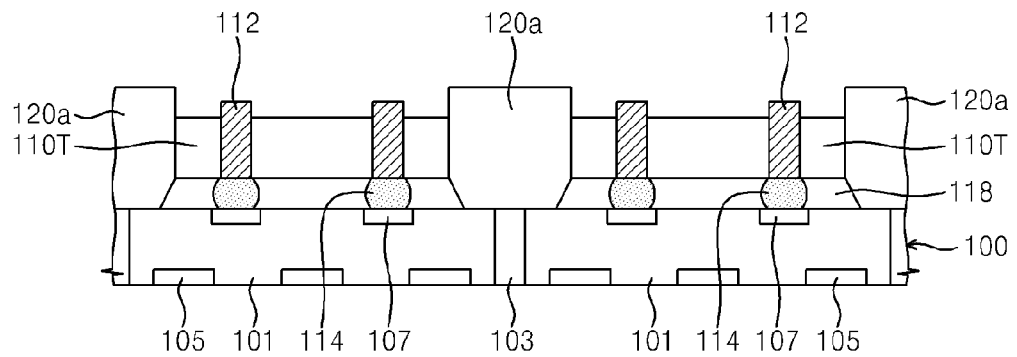

Referring to FIG. 4, the exposed second surfaces BS of the first chips 110 are etched to thin the first chips 110. At this time, the through-via electrodes 112 are exposed. The through-via electrode 112 may have a first surface electrically connected to the first chip bump 114 and a second surface opposite to the first surface. The first surface and the second surface of the through-via electrode 112 may correspond to a front surface and a back surface of the through-via electrode 112, respectively. After the first chips are thinned, the second surfaces of the through-via electrodes 112 may be exposed. For example, the etched surface of the thinned first chip 110T may be lower than the second surface of the through-via electrode 112. Thus, a portion of the through-via electrode 112 may protrude from the etched surface of the thinned first chip 110T. Because the planarized first mold layer 120 is formed of a different material from the first chip 110, the etched surface of the thinned first chip 110T may be lower than a top surface of the planarized first mold layer 120a.

The exposed second surfaces BS of the first chips 110 may be etched by a dry etching process. Alternatively, the exposed second surface BS of the first chips 110 may be etched by a wet etching process using an etchant. For example, if the exposed second surfaces BS of the first chips 110 are formed of silicon, the etchant of the wet etching process may include tetramethyl ammonium hydroxide (TMAH). However, the inventive concepts are not limited thereto.

Figure 5:
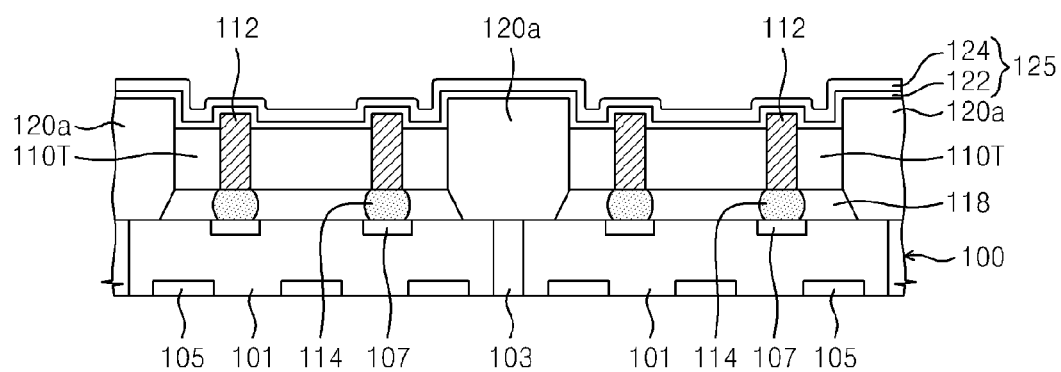

Referring to FIG. 5, a passivation layer 125 may be formed on the entire surface of the parent substrate 100. The passivation layer 125 may include a polymer insulating layer. For example, the passivation layer 125 may include a first sub-passivation layer 122 and a second sub-passivation layer 124, which are sequentially stacked. The first sub-passivation layer 122 may include a chemical vapor deposition (CVD) insulating layer formed by a CVD process. Particularly, the first sub-passivation layer 122 may include a plasma enhanced-CVD (PE-CVD) insulating layer. For example, the first sub-passivation layer 122 may include a PE-CVD oxide layer, a PE-CVD nitride layer, and/or a PE-CVD oxynitride layer. The second sub-passivation layer 124 may include the polymer insulating layer. For example, the second sub-passivation layer 124 may include a polyimide layer. The second sub-passivation layer 124 may be formed by a coating process or a tape lamination process.

Due to the coating process or the tape lamination process, the second sub-passivation layer 124 disposed on the etched surface of the thinned first chip 110T may be thicker than the second sub-passivation layer 124 disposed on the second surface of the through-via electrode 112. Additionally, because a planar area of the top surface of the planarized first mold layer 120a is wider than a planar area of the second surface of the through-via electrode 112, the second sub-passivation layer 124 disposed on the top surface of the planarized first mold layer 120a may be thicker than the second sub-passivation layer 124 disposed on the second surface of the through-via electrode 112.

The first sub-passivation layer 122 may protect the thinned first chip 110T from being contaminated by the second sub-passivation layer 124, which includes the polymer insulating layer. The first sub-passivation layer 122 may be omitted.

The thinned first chips 110T may be protected by the passivation layer 125. Thus, reliability of the semiconductor package may be improved.

Figure 6:
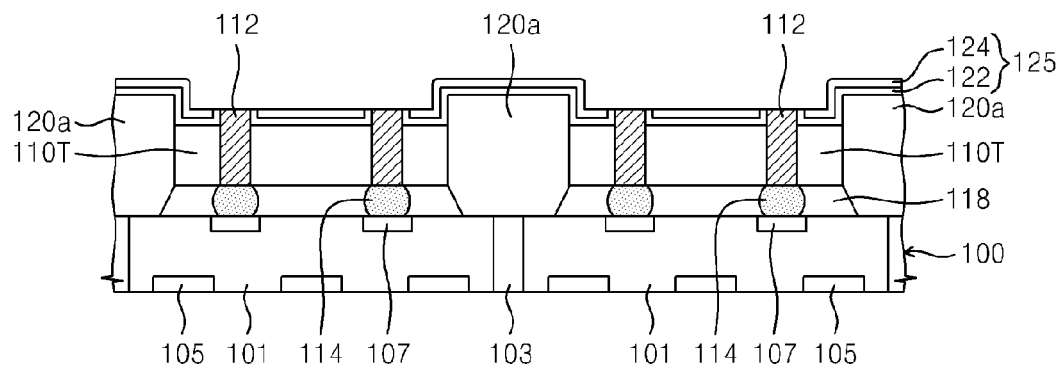

Referring to FIG. 6, the passivation layer 125 on the second surface of the through-via electrode 112 may be removed to expose the second surface of the through-via electrode 112. At this time, a portion of the passivation layer 125 may remain on the etched surface of the thinned first chip 110T. Further, a portion of the passivation layer 125 may also remain on the top surface of the planarized first mold layer 120a after the passivation layer 125 on the second surface of the through-via electrode 112 is removed, as illustrated in FIG. 6A.

For example, the passivation layer 125 on the through-via electrode 112 may be removed by an etch-back process. For example, the second sub-passivation layer 124 on the second surface of the through-via electrode 112 may be thinner than the second sub-passivation layer 124 disposed on the etched surface of the thinned first chip 110T and the top surface of the planarized first mold layer 120a. Thus, after a first etch-back process is performed on the second sub-passivation layer 124 to remove the second sub-passivation layer 124 on the second surface of the through-via electrode 112, a portion of the second sub-passivation layer 124 may remain on the thinned first chip 110T and the planarized first mold layer 120a. As a result, the first sub-passivation layer 122 on the through-via electrode 112 may be exposed, but the first sub-passivation layer 122 on the thinned first chip 110T and the planarized first mold layer 120a may be covered by the remaining second sub-passivation 124. Subsequently, a second etch-back process may be performed to remove the exposed first sub-passivation layer 122 on the through-via electrode 112. Thus, the second surface of the through-via electrode 112 may be exposed. At this time, the etched surface of the thinned first chip 110T and the top surface of the planarized first mold layer 120a may be covered by the first sub-passivation layer 122 and the remaining second sub-passivation layer 124.

Alternatively, the passivation layer 125 on the through-via electrode 112 may be removed by a selective etching process. For example, a mask layer may be formed on the parent substrate 100, and then the mask layer may be patterned to form openings exposing the passivation layer 125 on the through-via electrodes 112. Subsequently, the exposed passivation layer 125 may be etched using the mask layer having the openings as an etch mask, thereby exposing the second surfaces of the through-via electrodes 112. Thereafter, the mask layer may be removed.

Figure 7:
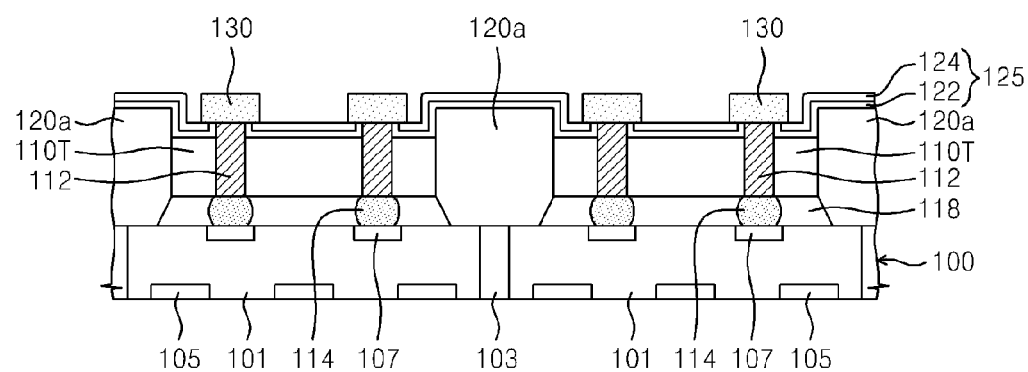

Referring to FIG. 7, an inter-chip pad 130 may be formed on each of the exposed through-via electrodes 112. The inter-chips pads 130 respectively connected to the through-via electrodes 112 may be spaced apart from each other. The inter-chip pad 130 may include a metal. For example, the inter-chip pad 130 may include copper or solder. The inter-chip pad 130 may be formed by various processes, e.g., a plating process, an inkjet process, and/or a patterning process.

Due to the passivation layer 125, electrical insulating properties between the inter-chip pad 130 and the etched surface of the thinned first chip 110T may be improved. As a result, the reliability of the semiconductor package may be improved.

Figure 8:
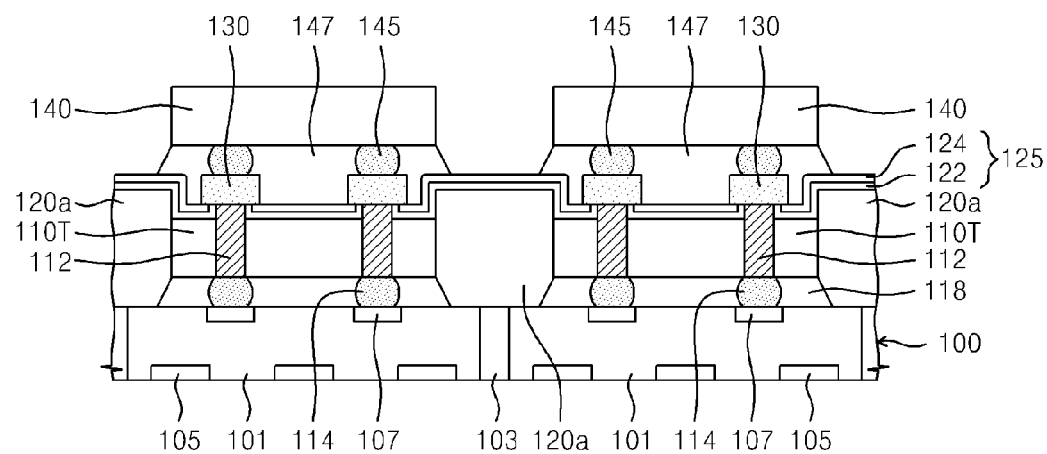

Referring to FIG. 8, a second chip 140 may be mounted on each of the thinned first chips 110T. The second chip 140 may include at least one second chip bump 145. For example, the second chip 140 may be loaded on the thinned first chip 110 to connect the second chip bump 145 to the inter-chip pad 130, and then a space between the thinned first chip 110T and the second chip 140 may be filled with a second underfiller 147. Thus, the second chip 140 may be mounted on the thinned first chip 110T. The second chip 140 may be mounted on the thinned first chip 110T by a flip chip bonding method.

The second chip 140 may be a semiconductor chip, e.g., a semiconductor memory device, a logic device, or a system on chip. Alternatively, the second chip 140 may be an interposer. A kind of the second chip 140 may be the same as or different from the kind of the thinned first chip 110T. The second chip bump 145 may be a solder ball. The second underfiller 147 may include at least one of epoxy molding compounds.

Figure 9:
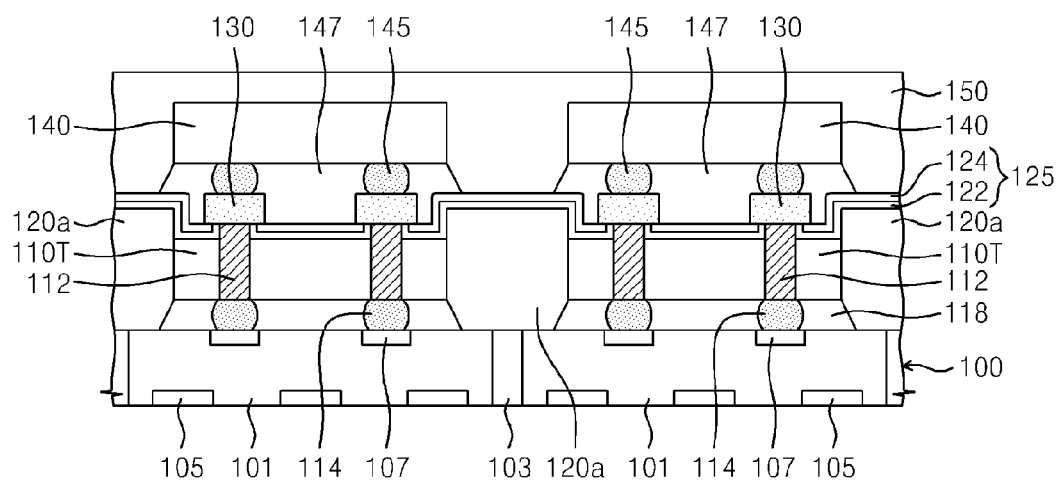
Figure 10:
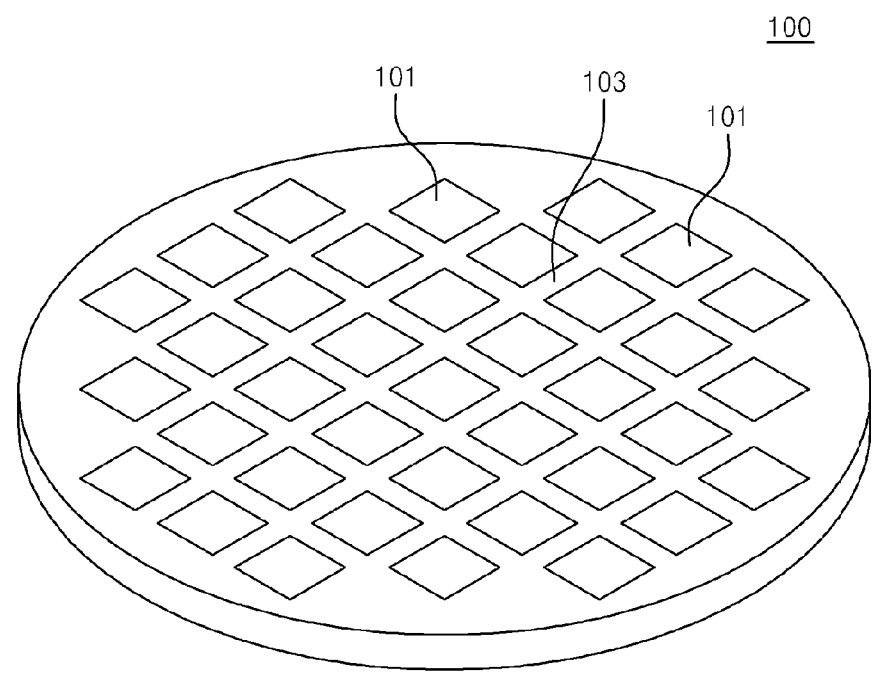

Referring to FIG. 9, a second mold layer 150 may be formed on an entire surface of the parent substrate 100 including the second chips 140. The second mold layer 150 may cover sidewalls and top surfaces of the second chips 140. For example, the passivation layer 125 may be disposed between the planarized first mold layer 120a and the second mold layer 150, as illustrated in FIG. 9.

Next, a singulation process may be performed on the parent substrate 100 including the thinned first chip 110T and the second chip 140. Thus, the parent substrate 100 may be divided into a plurality of semiconductor packages. The second mold layer 150, the passivation layer 125, the planarized first mold layer 120a, and the parent substrate 100 may be cut along the scribe region 103 of the parent substrate 100 by the singulation process. After the singulation process, an external bump EXT may be bonded to the external connection pad 105 of the package board 101 in each of the semiconductor packages. Thus, a semiconductor package 200 illustrated in FIG. 18 may be realized.

According to the method of manufacturing a semiconductor package described above, after the first chip 110 is mounted on the parent substrate 100, the first chip 110 is thinned by the etching process. In other words, a thick (e.g., unthinned) first chip 110 is mounted on the parent substrate 100. Thus, the first chip 110 mounted on the parent substrate 100 may be handled with relative ease even when the first chip 10 is subsequently thinned. Additionally, because the first and second chips 110 and 140 are stacked on the parent substrate 100 including the package board parts 101, the degree of freedom of chip design (or a chip size) of a system or a package including the first and second chips 110 and 140 may be increased. As a result, manufacturing yield of the semiconductor packages may increase and/or manufacturing time of the semiconductor packages may be reduced. Thus, productivity of the semiconductor packages may be improved and the reliability of the semiconductor packages may be improved.

Next, various modified examples of the above embodiment will be described herein below with reference to the accompanying drawings.

Figure 12:
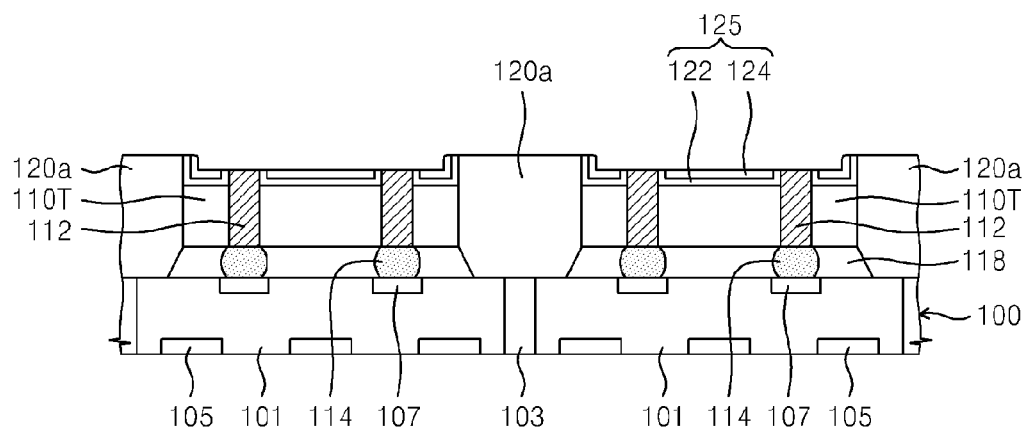
Figure 13:
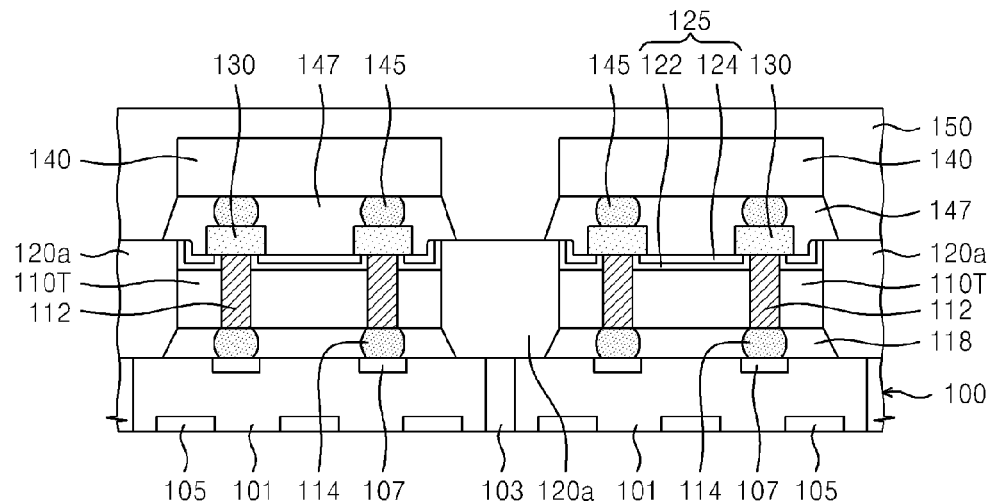

FIGS. 12 and 13 are cross-sectional views illustrating a modified method of manufacturing a semiconductor package according to an example embodiment. A manufacturing method according to this example may include the processes as described with reference to FIGS. 1 to 5.

Referring to FIGS. 5 and 12, the passivation layer 125 on the planarized first mold layer 120a may be removed. At this time, the passivation layer 125 may remain on the etched surface of the thinned first chip 110T. The passivation layer 125 on the planarized first mold layer 120a may be removed by a selective etching process. For example, a mask layer may be formed on the parent substrate 100 and then the mask layer may be patterned to foam an opening exposing the passivation layer 125 on the planarized first mold layer 120a. The exposed passivation layer 125 may be etched and removed using the mask layer the opening as an etch mask. The passivation layer 125 on the planarized first mold layer 120a may be removed after or before the removal of the passivation layer 125 on the through-via electrode 112. Alternatively, the passivation layer 125 on the through-via electrode 112 and the passivation layer 125 on the planarized first mold layer 120a may be removed simultaneously. For example, a mask layer may be formed on the passivation layer 125 and then the mask layer may be patterned to form a first opening and a second opening. The first opening may expose the passivation layer 125 on the through-via electrode 112, and the second opening may expose the passivation layer 125 on the planarized first mold layer 120a. The passivation layer may be etched and removed using the mask layer having the first and second openings as an etch mask. Thus, the through-via electrode 112 and the planarized first mold layer 120a may be exposed.

Referring to FIG. 13, as described with reference to FIGS. 7 and 8, the inter-chip pads 130 may be formed and then the second chip 140 may be mounted on the thinned first chip 110T. Next, the second mold layer 150 may be formed on the parent substrate 100. The second mold layer 150 may be in contact with the top surface of the planarized first mold layer 120a. At this time, an interface exists between the second mold layer 150 and the planarized first mold layer 120a. The top surface of the planarized first mold layer 120a may correspond to the interface, and/or a bottom surface of the second mold layer 150 contacting the planarized first mold layer 120a may correspond to the interface.

Subsequently, the singulation process described with reference to FIG. 9 may be performed on the parent substrate 100 to form a plurality of semiconductor packages separated from each other. After the singulation process, an external bump EXT may be bonded to the external connection pad 105 of the package board 101 of each of the semiconductor packages. Thus, a semiconductor package 201 illustrated in FIG. 19 may be realized.

Figure 14:
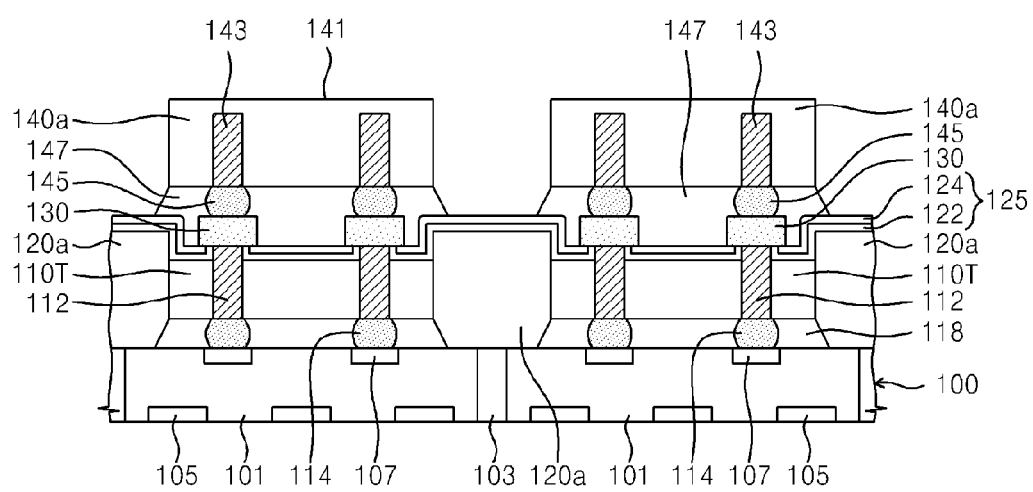
Figure 15:
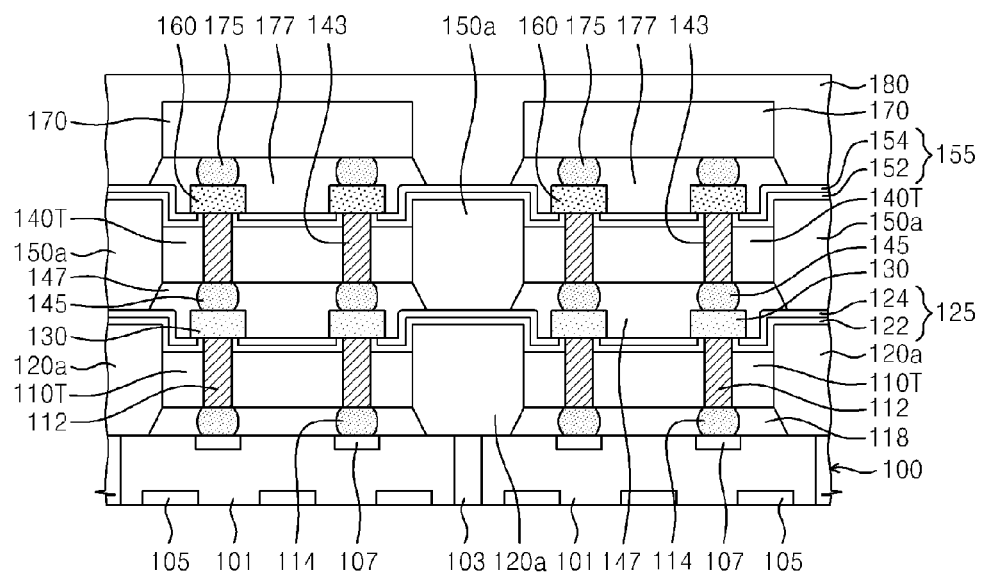

FIGS. 14 and 15 are cross-sectional views illustrating a modified method of manufacturing a semiconductor package according to another example embodiment. According to this modified method, three or more chips may be sequentially stacked on each of the package board parts 101. A manufacturing method according to this example may include the processes as described with reference to FIGS. 1 to 8.

Referring to FIG. 14, a second chip 140*a* may include at least one second through-via electrode 143. The second chip 140*a* may have a first surface and a second surface opposite to each other, and the first surface of the second chip 140*a* may be adjacent to the thinned first chip 110T. An end of the second through-via electrode 143 may be electrically connected to a second chip bump 145 of the second chip 140*a*. A thickness of the second chip 140*a* may be greater than a height of second through-via electrode 143. In other words, the second chip 140*a* may be sufficiently thick.

Referring to FIG. 15, the processes described with reference to FIGS. 2 to 7 may be repeatedly performed. For example, the second mold layer 150 may be planarized to expose the second chips 140*a*, the exposed second chips 140*a* may be thinned to expose the second through-via electrodes 143. Additionally, a second passivation layer 155 may be formed, and a second inter-chip pad 160 may be formed on one of the exposed second through-via electrodes 143. The planarized second mold layer 150*a* does not cover etched surfaces of the thinned second chips 140T. The second passivation layer 155 may include a first sub-passivation layer 152 and a second sub-passivation layer 154 which are sequentially stacked. The first and second sub-passivation layers 152 and 154 of the second passivation layer 155 may be formed of a same material or different materials. Alternatively, in one example embodiment, the first sub-passivation layer 152 of the second passivation layer 155 may be omitted.

A third chip 170 may be mounted on each of the thinned second chip 140T. The third chip 170 may be a semiconductor chip such as a semiconductor memory device, a logic device, or a system on chip. Alternatively, the third chip 170 may be an interposer. A third chip bump 175 of the third chip 170 may be connected to the second inter-chip pad 160, and a third underfiller 177 may fill a space between the thinned second chip 140T and the third chip 170. The third underfiller 177 may include at least one epoxy molding compound. Thereafter, a third mold layer 180 may be formed on the parent substrate 100. The third mold layer 180 may include at least one epoxy molding compound.

As illustrated in FIG. 15, the second passivation layer 155 may be disposed between the third mold layer 180 and the planarized second mold layer 150*a*. Alternatively, the second passivation layer 155 on the planarized second mold layer 150*a* may be removed as described with reference to FIGS. 12 and 13. In this case, the third mold layer 180 may be in contact with the planarized second mold layer 150*a*. At this time, an interface may exist between the third mold layer 180 and the planarized second mold layer 150*a*.

Subsequently, the singulation process described with reference to FIG. 9 may be performed to divide the parent substrate 100 including the first to third chips 110T, 140T, and 170 into a plurality of semiconductor packages. Next, the external bump EXT may be bonded to the external connection pad 105 of the package board part 101 of each of the semiconductor packages. Thus, a semiconductor package 202 illustrated in FIG. 20 may be realized.

Figure 16:
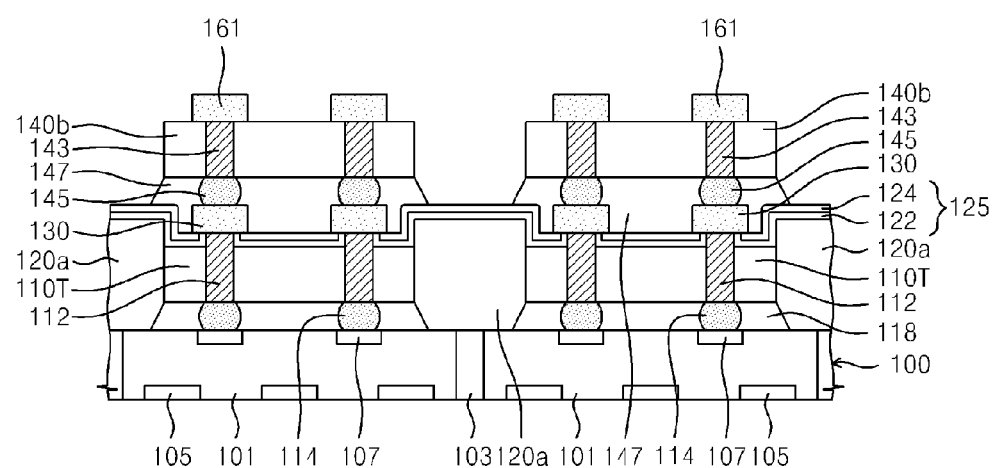
Figure 17:
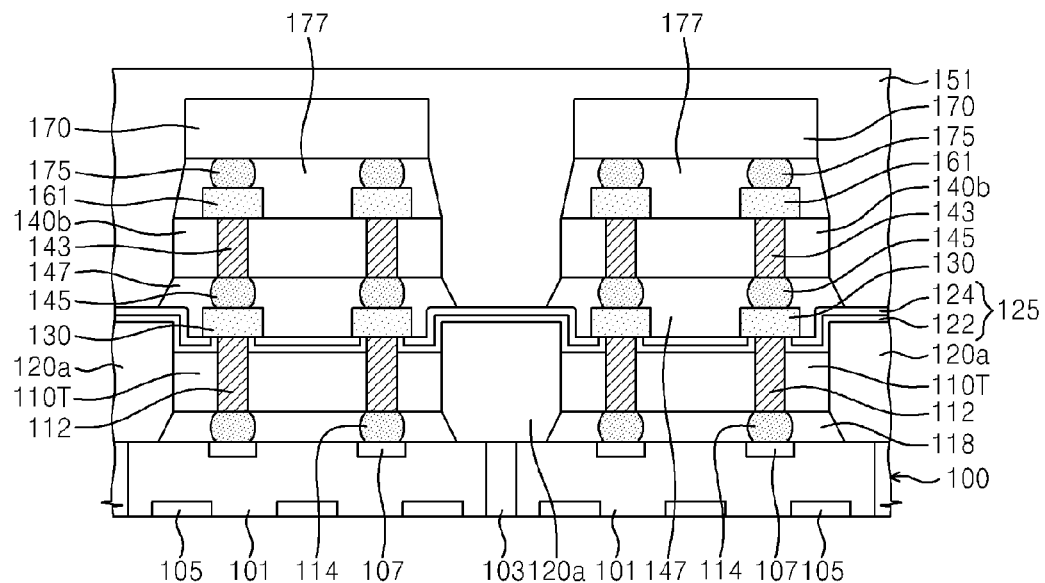

FIGS. 16 and 17 are cross-sectional views illustrating a modified method of manufacturing a semiconductor package according to still another example embodiment. A manufacturing method according to this example may include the processes described with reference to FIGS. 1 and 7.

Referring to FIG. 16, a second chip 140*b* may be mounted on the thinned first chip 110T. The second chip 140*b* may include at least one second through-via electrode 143. Additionally, the second chip 140*b* may further include a second chip bump 145 electrically connected to a bottom end of the second through-via electrode 143, and a second inter-chip pad 161 electrically connected to a top end of the second through-via electrode 143. For example, before the second chip 140*b* is mounted on the thinned first chip 110T, the second chip bump 145 and the second inter-chip pad 161 may be formed on a first surface and a second surface of the second chip 140*b*, respectively.

Referring to FIG. 17, a third chip 170 may be mounted on each of the second chips 140*b*. A third underfiller 177 may fill a space between the second and third chips 140*b* and 170.

Next, a second mold layer 151 may be formed on the parent substrate 100. The second mold layer 151 covers the stacked second and third chips 140*b* and 170. The second mold layer 151 may cover the passivation layer 125 on the planarized first mold layer 120*a*. Alternatively, in one embodiment, the passivation layer 125 on the planarized first mold layer 120*a* may be removed as described with reference to FIGS. 12 and 13. Accordingly, the second mold layer 151 may be in contact with the planarized first mold layer 120*a*. As such, an interface exists between the second mold layer 151 and the planarized first mold layer 120*a*, and the top surface of the planarized first mold layer 120*a* may correspond to the interface.

Figure 21:
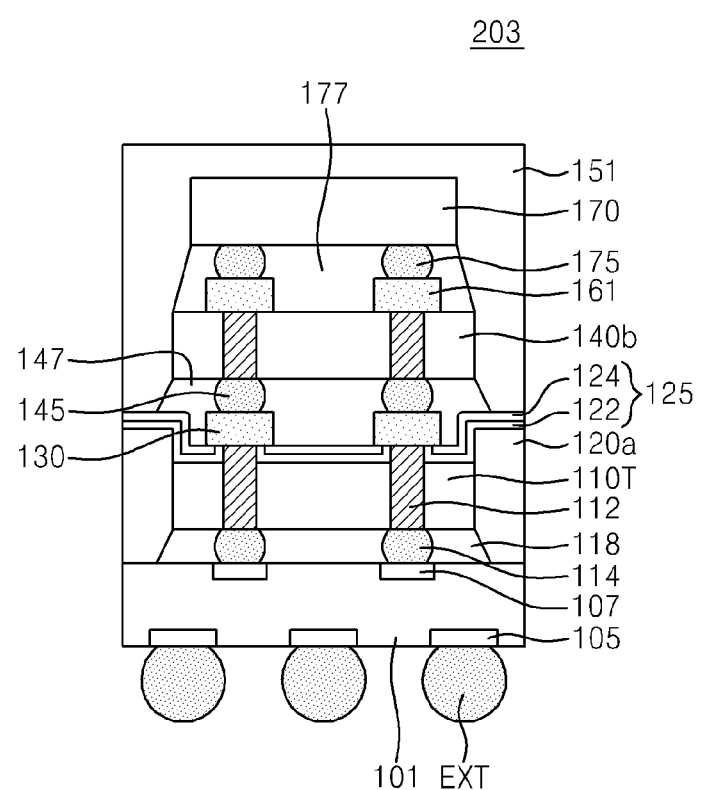

Subsequently, the singulation process and the boning process of the external bump EXT described with reference to FIG. 9 may be performed to realize a semiconductor package 203 as illustrated in FIG. 21.

Next, the semiconductor packages according to example embodiments will be described with reference to the drawings.

Figure 18:
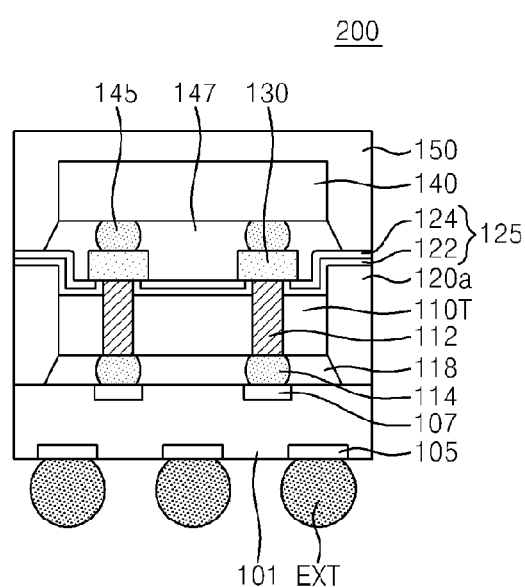

FIG. 18 is a cross-sectional view illustrating a semiconductor package according to an example embodiment.

Referring to FIG. 18, a semiconductor package 200 according to an example embodiment may include a thinned first chip 110T mounted on a package board 101 and a second chip 140 mounted on the thinned first chip 110T. The package hoard 101 may include external connection pads 105 disposed on a bottom surface of the package board 101 and internal connection pads 107 disposed on a top surface of the package board 101. The thinned first chip 110T may have a first surface and a second surface opposite to each other. The first surface of the thinned first chip 110T may be adjacent to the package board 101. The thinned first chip 110T may include through-via electrodes 112 penetrating the thinned first chip 110T. The thinned first chip 110T may have first chip bumps 114 disposed on the first surface thereof. The first chip bumps 114 may be electrically connected to bottom ends of the through-via electrodes 112, respectively. The first chip bumps 114 of the thinned first chip 110T may be connected to the internal connection pads 107 of the package board 101, respectively. A first underfiller 118 may fill a space between the thinned first chip 110T and the package board 101. The first chip bumps 114 may be surrounded by the first underfiller 118.

A first mold layer may be disposed on the package board 101 and surround a sidewall of the thinned first chip 110T. The first mold layer may be planarized to have a planarized top surface, thereby forming a planarized first mold layer 120a. The planarized first mold layer 120a may be disposed on an edge region of the top surface of the package board 101. The top surface of the planarized first mold layer 120a may be disposed around the thinned first chip 110T. The top surface of the planarized first mold layer 120a may not cover the second surface of the thinned first chip 110T. In other words, the first mold layer may be formed such that the planarized top surface of the thinned first chip 110T is exposed. The planarized top surface of the first mold layer 120a may be disposed at a level higher than the second surface of the thinned first chip 110T.

A passivation layer 125 may be disposed on the second surface of the thinned first chip 110T. For example, the passivation layer 125 may extend to cover the planarized top surface of the first mold layer 120a. The passivation layer 125 may include a first sub-passivation layer 122 and a second sub-passivation layer 124 which are sequentially stacked. The second sub-passivation layer 124 may include a polymer insulating layer. For example, the second sub-passivation layer 124 may include a polyimide layer. The first sub-passivation layer 122 may include a CVD insulating layer. For example, the first sub-passivation layer 122 may include a CVD oxide layer, a CVD nitride layer, and/or a CVD oxynitride layer.

Inter-chip pads 130 may be disposed between the thinned first chip 110T and the second chip 140. The inter-chip pads 130 may be connected to top ends of the through-via electrodes 112, respectively. The inter-chip pad 130 may be disposed on the passivation layer 125.

Second chip bumps 145 of the second chip 140 may be connected to the inter-chip pads 130, respectively. A second underfiller 147 may fill a space between the thinned first chip 110T and the second chip 140.

A second mold layer 150 may be disposed on the first mold layer 120a. The second mold layer 150 may surround at least a sidewall of the second chip 140. For example, the second mold layer 150 may cover a top surface of the second chip 140 as illustrated in FIG. 18.

For example, the passivation layer 125 may be disposed between the second mold layer 150 and the planarized top surface of the first mold layer 120a. Thus, the first mold layer 120a may be distinguished from the second mold layer 150.

External bumps EXT may be bonded to the external connection pads 105 of the package board 101, respectively.

Figure 19:
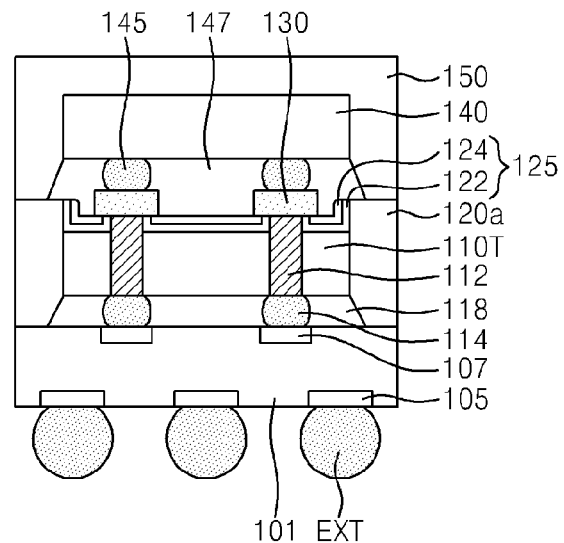

FIG. 19 is a cross-sectional view illustrating a modified semiconductor package according to an example embodiment.

Referring to FIG. 19, in a semiconductor package 201 according to this example, the second mold layer 150 may be in contact with the planarized top surface of the first mold layer 120a. Accordingly, an interface exists between the first mold layer 120a and the second mold layer 150. The planarized top surface of the first mold layer 120a may correspond to the interface, and/or a bottom surface of the second mold layer 150 in contact with the first mold layer 120a may correspond to the interface.

For example, the passivation layer 125 may be confinedly disposed on the second surface of the thinned first chip 110T.

Figure 20:
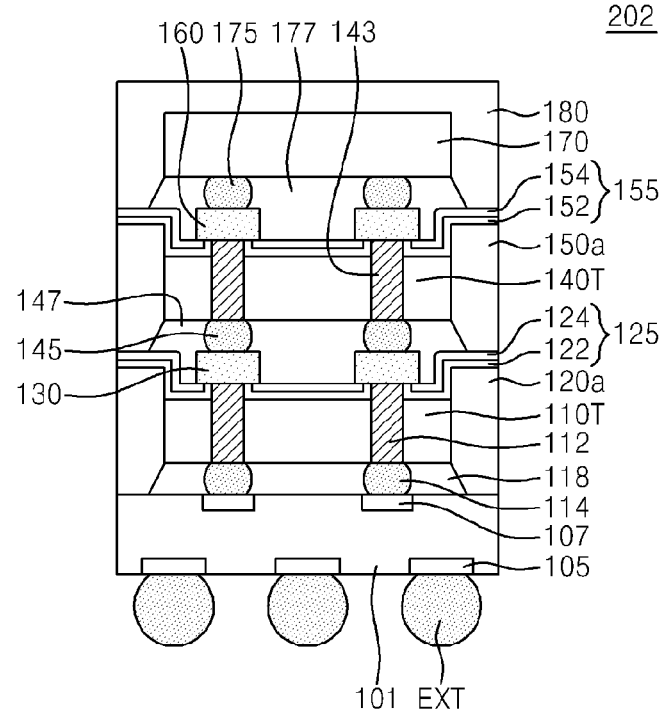

FIG. 20 is a cross-sectional view illustrating a modified semiconductor package according to another example embodiment.

Referring to FIG. 20, a semiconductor package 202 according to this example may include a thinned first chip 110T, a thinned second chip 140T, and a third chip 170 which are sequentially stacked on the package board 101. The thinned first chip 110T may include first through-via electrodes 112 and first chip bumps 114 electrically connected to bottom ends of the first through-via electrodes 112, respectively. The thinned second chip 140T may include second through-via electrodes 143 and second chip bumps 145 electrically connected to bottom ends of the second through-via electrodes 143, respectively. The third chip 170 may include third chip bumps 175. A first inter-chip pad 130 may be disposed between each of the first through-via electrodes 112 and each of the second chip bumps 145, and a second inter-chip pad 160 may be disposed between each of the second through-via electrodes 143 and each of the third chip bumps 175.

A first underfiller 118 may fill a space between the thinned first chip 110T and the package board 101, a second underfiller 147 may fill a space between the thinned first chip 110T and the thinned second chip 140T, and a third underfiller 177 may fill a space between the thinned second chip 140T and the third chip 170.

A planarized first mold layer 120a may be disposed on the edge region of the top surface of the package board 101 to surround the sidewall of the thinned first chip 110T. The planarized first mold layer 120a has a planarized top surface and may not cover the second surface (i.e., the top surface) of the thinned first chip 110T. A planarized second mold layer 150a may be disposed on the first mold layer 120a to surround the sidewall of the thinned second chip 140T. The planarized second mold layer 150a may also include a planarized top surface. The thinned second chip 140T has a first surface adjacent to the thinned first chip 110T and a second surface opposite to the first surface. The second mold layer 150a may not cover the second surface of the thinned second chip 140T. In other words, the planarized second mold layer 150a may be provided such that the second surface of the thinned second chip 140T is exposed A third mold layer 180 may be disposed on the second mold layer 150a and surround at least a sidewall of the third chip 170. For example, the third mold layer 180 may extend to cover a top surface of the third chip 170.

A first passivation layer 125 may be disposed between the planarized top surface of the first mold layer 120a and the second mold layer 150a. A second passivation layer 155 may be disposed between the planarized top surface of the second mold layer 150a and the third mold layer 180. The second passivation layer 155 may extend to be disposed on the second surface of the thinned second chip 140T. The second passivation layer 155 may include sequentially stacked first and second sub-passivation layers 152 and 154. The first and second sub-passivation layers 152 and 154 of the second passivation layer 155 may be formed of a same material or different materials.

For example, the first passivation layer 125 between the planarized first and second mold layers 120a and 150a and/or the second passivation layer 155 between the planarized second mold layer 150a and the third mold layer 180 may be removed. Accordingly, the planarized first and second mold layers 120a and 150a may be in contact with each other, and/or the planarized second mold layer 150a and the third mold layer 180 may be in contact with each other. As such, an interface may exist between the planarized first and second mold layers 120a and 150a, and/or an interface may exist between the planarized second mold layer 150a and the third mold layer 180.

According to this example embodiment, the semiconductor package 202 includes stacked three chips 110T, 140T, and 170. However, the inventive concepts are not limited thereto. The semiconductor package 202 may include stacked four or more chips.

FIG. 21 is a cross-sectional view illustrating a modified semiconductor package according to still another example embodiment. 101421 Referring to FIG. 21, a semiconductor package 203 according to this example may include first, second, and third chips 110T, 140b, and 170, which are sequentially stacked on the package board 101. The planarized first mold layer 120a may be disposed on the edge region of the top surface of the package board 101 and may surround the sidewall of the thinned first chip 110T. A second mold layer 151 may be disposed on the planarized first mold layer 120a and may surround sidewalls of the second and third chips 140b and 170. The second mold layer 151 may extend to cover the top surface of the third chip 170. As illustrated in FIG. 21, the passivation layer 125 may be disposed between the top surface of the planarized first mold layer 120a and the second mold layer 151. Alternatively, the passivation layer 125 between the planarized first mold layer 120a and the second mold layer 151 may be removed. Accordingly, the second mold layer 151 may be in contact with the planarized top surface of the first mold layer 120a. As such, an interface may exist between the first and second mold layers 120a and 151.

According to this example embodiment, the semiconductor package 203 includes stacked three chips 110T, 140b, and 170. However, the inventive concepts are not limited thereto. The semiconductor package 203 may include stacked four or more chips.

Second Embodiment

In this example embodiment, the same elements as described in the first embodiment will be indicated by the same reference numerals or the same reference designators. For convenience of explanation, the descriptions to the same elements as in the first embodiment will be omitted or mentioned briefly. Thus, differences between the present embodiment and the first embodiment will be mainly described hereinafter.

FIGS. 22 to 26 are cross-sectional views illustrating a method of manufacturing a semiconductor package according to another example embodiment. FIG. 27 is a perspective view illustrating a structure shown in FIG. 25.

Figure 22:
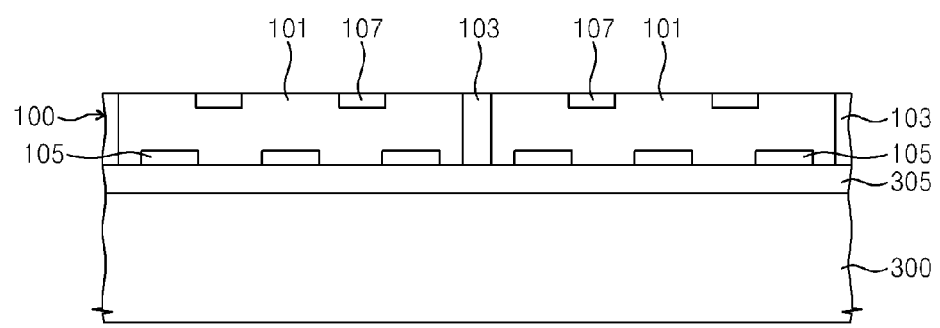

Referring to FIG. 22, a parent substrate 100 including a plurality of package board parts 101 and a scribe region 103 therebetween may be prepared. The parent substrate 100 may be bonded to a top surface of a carrier substrate 300. For example, an adhesive layer 305 may be formed on the top surface of the carrier substrate 300, and then the parent substrate 100 may be bonded to the top surface of the carrier substrate 300 by using the adhesive layer 305.

The carrier substrate 300 may be formed of a glass or a semiconductor material. For example, the carrier substrate 300 may be a glass substrate or a silicon substrate. The adhesive layer 305 may include an adhesive material, an adhesive force of which is decreased or lost by heat or light.

A bottom surface of the parent substrate 100 may be bonded to the carrier substrate 300. External connection pads 105 of the package board parts 101 may be formed on the bottom surface of the parent substrate 100.

Figure 23:
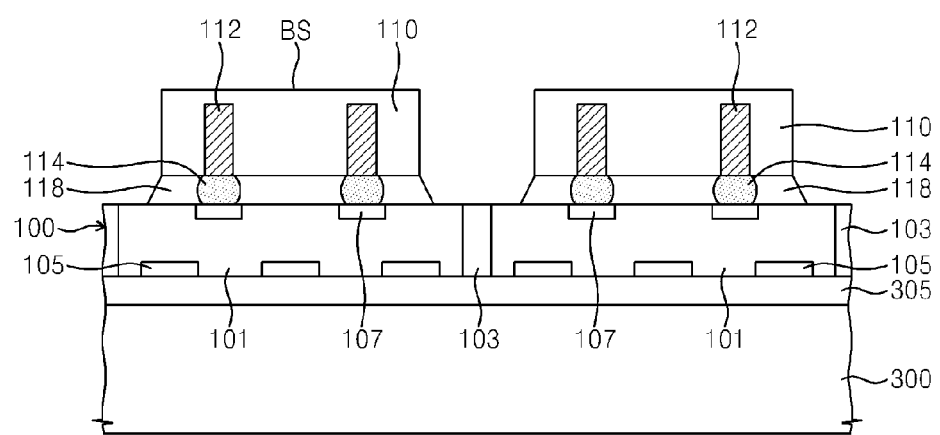

Referring to FIG. 23, the first chip 110 may be mounted on each of the package board parts 101 as described with reference to FIG. 1. For example, the thickness of the first chip 110 may be greater than the height of the through-via electrode 112 in the first chip 110.

Figure 24:
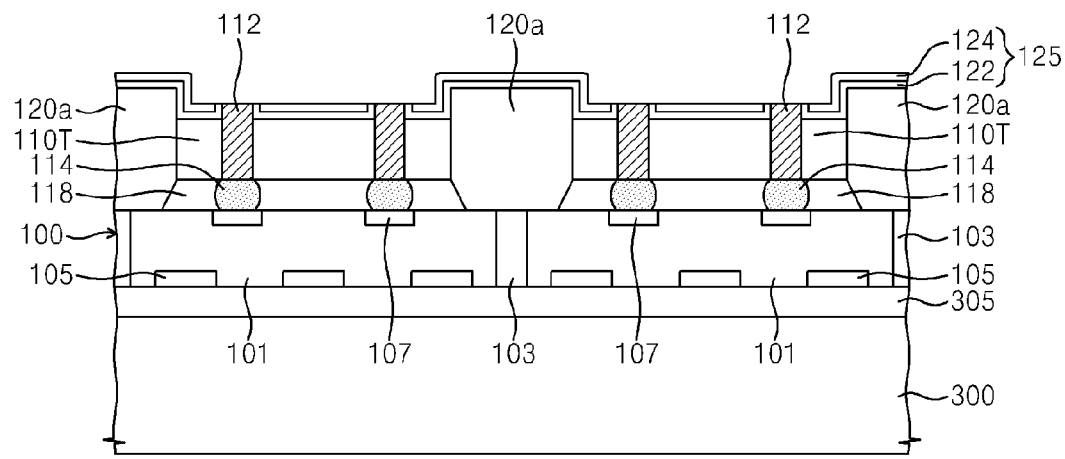

Referring to FIG. 24, the processes described with reference to FIGS. 2 to 6 may be performed on the parent substrate 100 bonded to the carrier substrate 300. For example, after the planarized first mold layer 120a is formed to surround the first chip 110, a thinning process may be performed on the first chip 110. The first chip 110 may be thinned to expose the through-via electrode 112. In the event that the passivation layer 125 is formed to cover the through-hole electrode 112, the through-via electrode 112 may be processed to be re-exposed.

Figure 25:
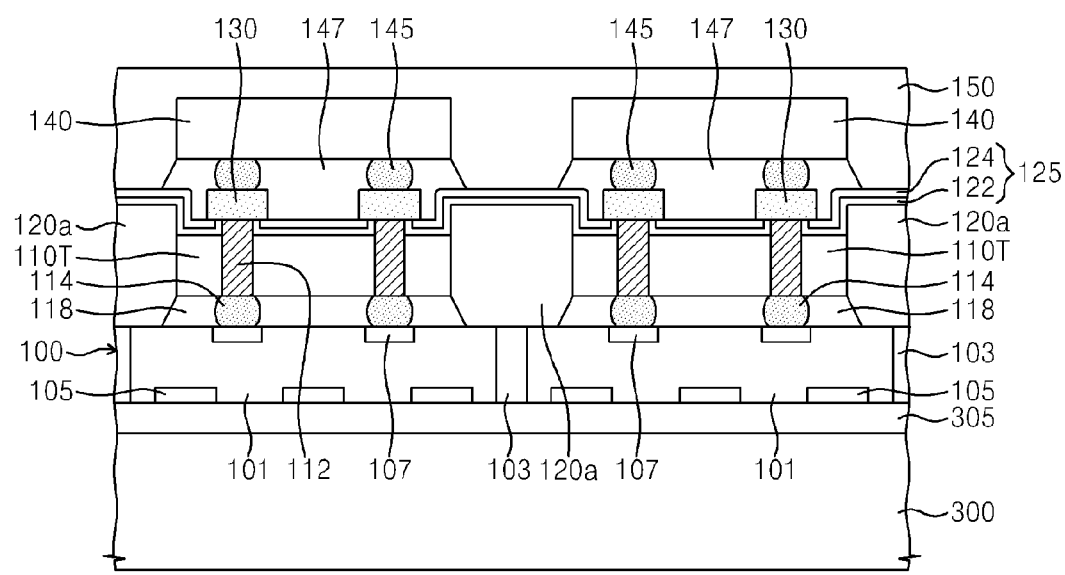

Referring to FIG. 25, as described with reference to FIGS. 7 to 9, an inter-chip pad 130 may be formed on each of the through-via electrodes 112, the second chip 140 may be mounted on the thinned first chip 110T, and then the second mold layer 150 may be formed on the parent substrate 100 bonded to the carrier substrate 300. Thus, a semiconductor package structure including a plurality of semiconductor packages may be formed. FIG. 25 shows an example of the semiconductor package structure formed thereby. The semiconductor package structure may include the carrier substrate 300, the parent substrate 100, a plurality of the chips 110T and 140 stacked on each of the package board parts 101, the first mold layer 120a, and the second mold layer 150. According to the inventive concepts, the semiconductor package structure may have other shapes. For example, the semiconductor package structure may be realized as one of semiconductor package structures illustrated below in FIGS. 29, 30, 31, 33, and 37. Further, the semiconductor package structure may have a circular plate as illustrated in FIG. 27.

Figure 26:
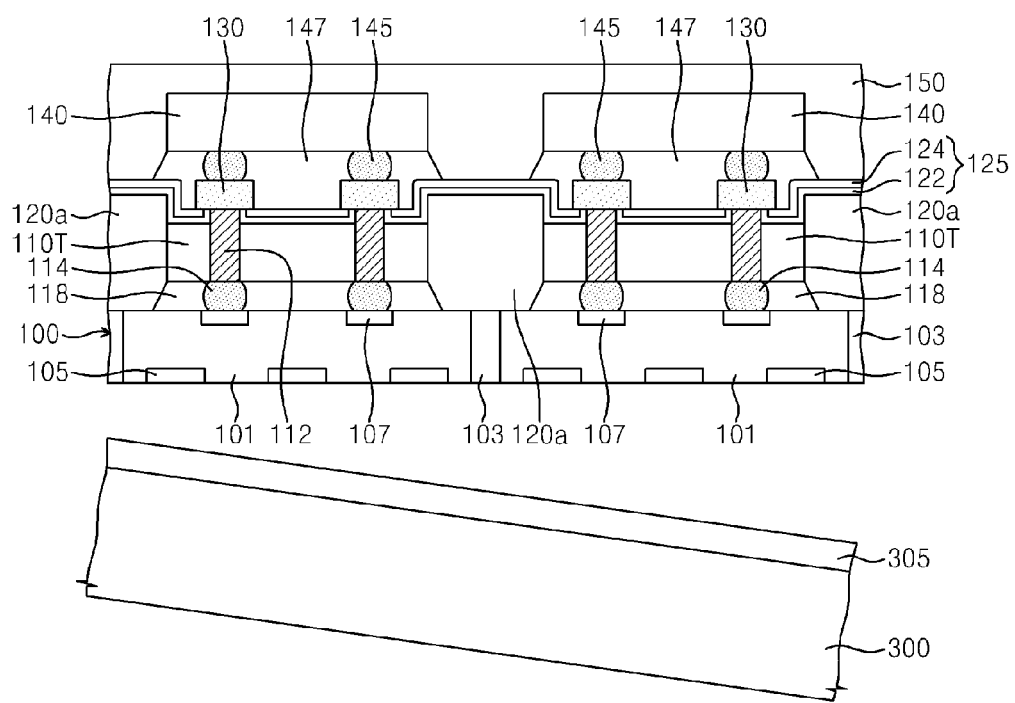
Figure 27:
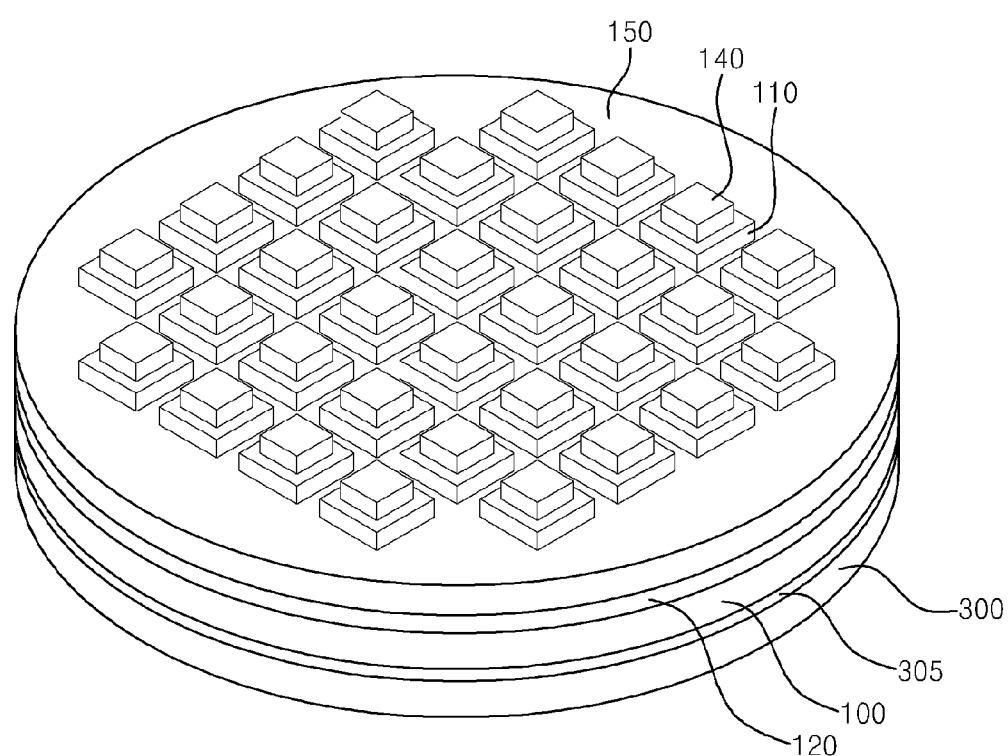

Referring to FIG. 26, after the packaging process is performed, the carrier substrate 300 may be separated from the parent substrate 100. For example, heat may be supplied to the adhesive layer 305 so that the adhesive force of the adhesive layer 305 may be decreased or lost. Thus, the carrier substrate 300 may be separated from the parent substrate 100. For example, if the carrier substrate 300 is the glass substrate, ultraviolet rays may be irradiated to the adhesive layer 305 through a back side of the carrier substrate 300. Accordingly, the adhesive force of the adhesive layer 305 may be decreased or lost such that the carrier substrate 300 may be easily separated from the parent substrate 100. However, the inventive concepts are not limited thereto. The carrier substrate 300 may be separated from the parent substrate 100 by a physical separating method and/or a chemical separating method.

Subsequently, the singulation process described with reference to FIG. 9 may be performed, and then the external bump EXT may be bonded to the external connection pad 105 of the package board 101 to realize the semiconductor package 200 illustrated in FIG. 18.

For example, after the parent substrate 100 is bonded to the carrier substrate 300, the packaging process may be performed on the parent substrate 100 bonded to the carrier substrate 300. Thus, even though the parent substrate 100 is thin, the carrier substrate 300 may support the parent substrate 100 to prevent or minimize a warpage phenomenon of the parent substrate 100. Additionally, the carrier substrate 330 may support the parent substrate 100, so that it is possible to improve a process margin of the thinning process performed on the first chips 110, which are disposed on the parent substrate 100.

Next, various modified examples of the above embodiment will be described herein below with reference to the accompanying drawings.

Figure 28:
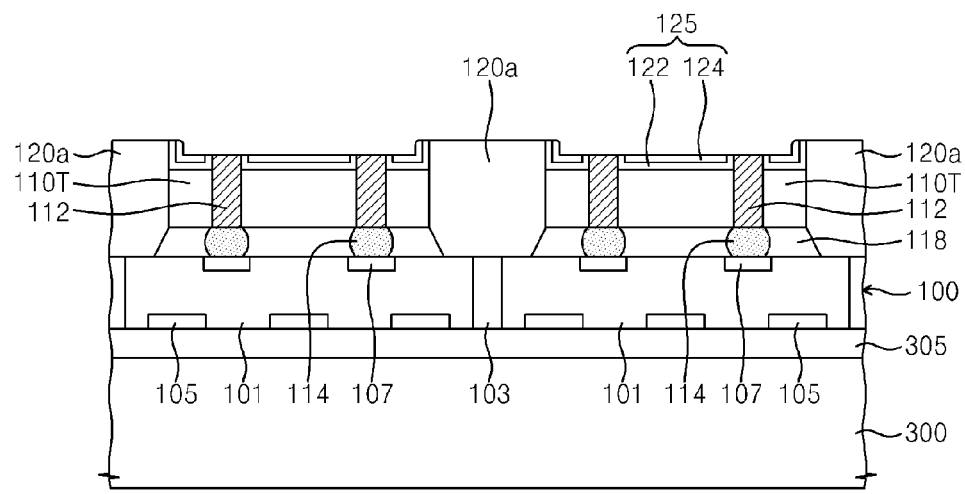
Figure 29:
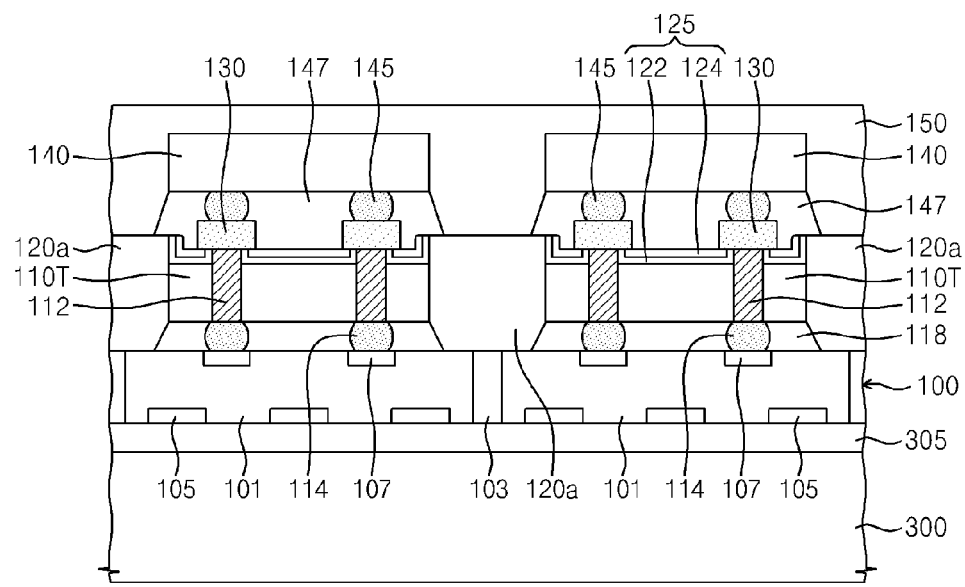

FIGS. 28 and 29 are cross-sectional views illustrating a method of manufacturing a semiconductor package according to an example embodiment.

Referring to FIG. 28, the passivation layer 125 on the planarized first mold layer 120a may be removed from the parent substrate 100 bonded to the carrier substrate 300, as described with reference to FIGS. 12 and 13.

Referring to FIG. 29, the second chip 140 may be mounted on each of the thinned first chip 110T and then the second mold layer 150 may be formed, as described with reference to FIG. 13. Thus, a semiconductor package structure of FIG. 29 may be realized.

Thereafter, as described with reference to FIG. 26, the carrier substrate 300 may be separated from the parent substrate 300. Subsequently, the singulation process described with reference to FIG. 9 may be performed and then the external bump EXT may be bonded to the external connection pad 105 of the package board 101. As a result, the semiconductor package 201 of FIG. 19 may be realized.

Figure 30:
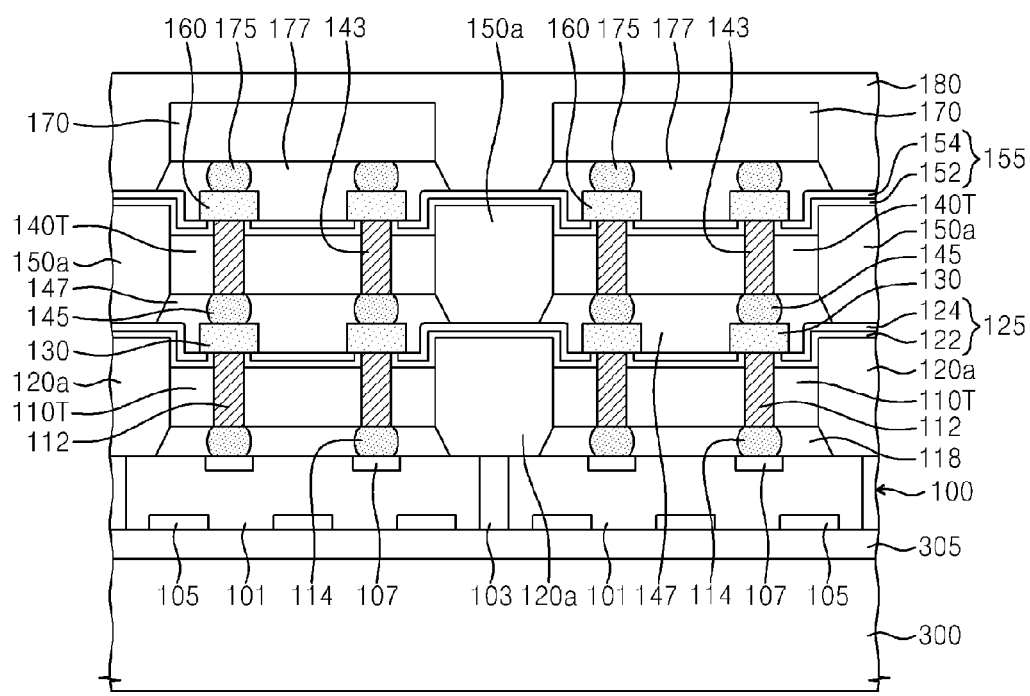

FIG. 30 is cross-sectional view illustrating a method of manufacturing a semiconductor package according to another embodiment. A manufacturing method according to this example may include the processes described with reference to FIGS. 22 to 24.

Referring to FIG. 30, the processes described with reference to FIGS. 14 and 15 may be performed on the structure illustrated in FIG. 24 such that the first, second, and third chips 110T, 140T, and 170 may be sequentially stacked on each of the package board parts 101 of the parent substrate 100 bonded to the carrier substrate 300. Additionally, the first, second and third mold layers 120a, 150a, and 180 may be formed. Thus, a semiconductor package structure illustrated in FIG. 30 may be realized.

Subsequently, the carrier substrate 300 may be separated from the parent substrate 100 as described with reference to FIG. 26. The singulation process described with reference to FIG. 9 may be performed and then the external bump EXT may be bonded to the external connection pad 105 of the package board 101. As a result, the semiconductor package 202 of FIG. 20 may be realized.

Figure 31:
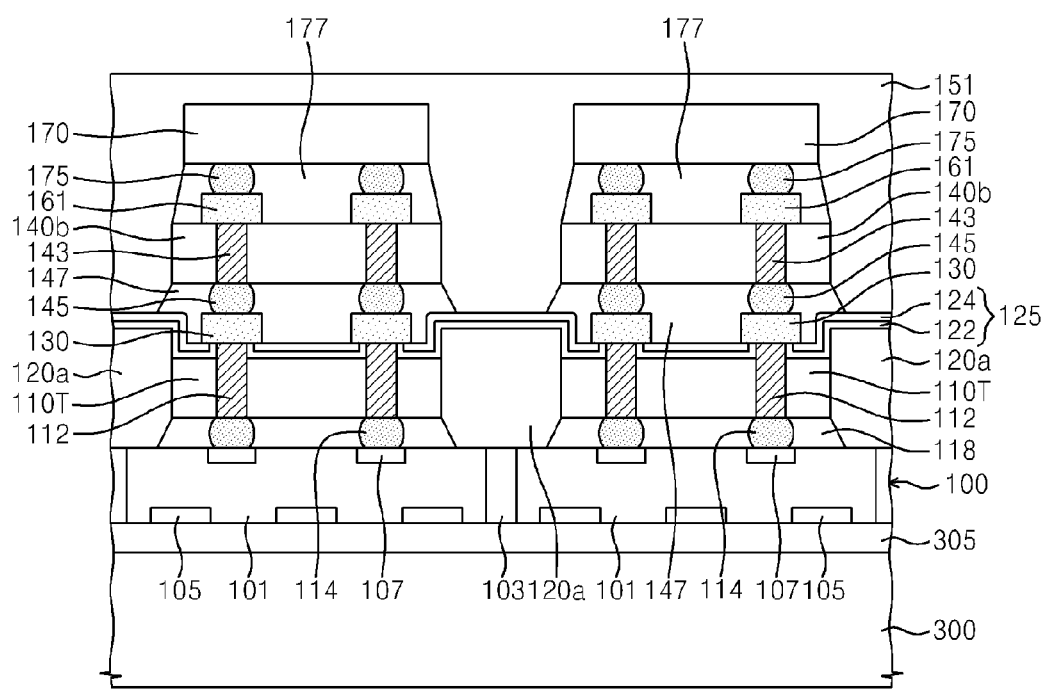

FIG. 31 is cross-sectional view illustrating a method of manufacturing a semiconductor package according to still another embodiment. A manufacturing method according to this example may include the processes described with reference to FIGS. 22 to 24.

Referring to FIG. 31, the processes described with reference to FIGS. 16 and 17 may be performed on the structure illustrated in FIG. 24 such that the first, second, and third chips 110T, 140b, and 170 may be sequentially stacked on each of the package board parts 101 of the parent substrate 100 bonded to the carrier substrate 300. Additionally, the first and second mold layers 120a and 151 may be formed. Thus, a semiconductor package structure of FIG. 31 may be realized.

Subsequently, the carrier substrate 300 may be separated from the parent substrate 100 as described with reference to FIG. 26. Next, the singulation process described with reference to FIG. 9 may be performed and then the external bump EXT may be bonded to the external connection pad 105 of the package board 101. As a result, the semiconductor package 203 of FIG. 21 may be realized.

Figure 32:
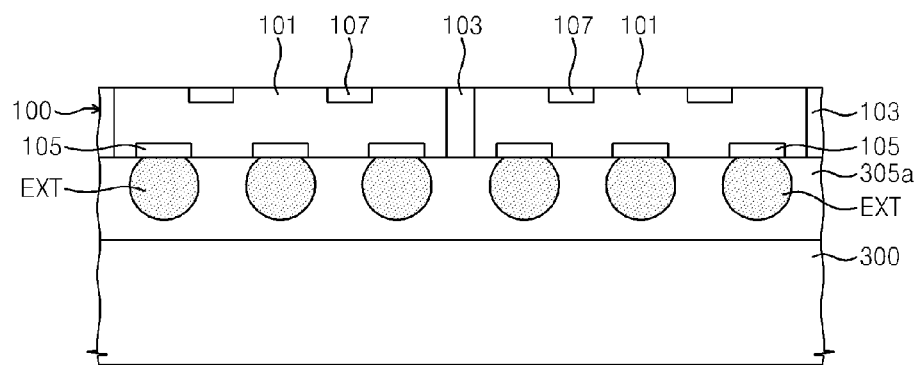
Figure 33:
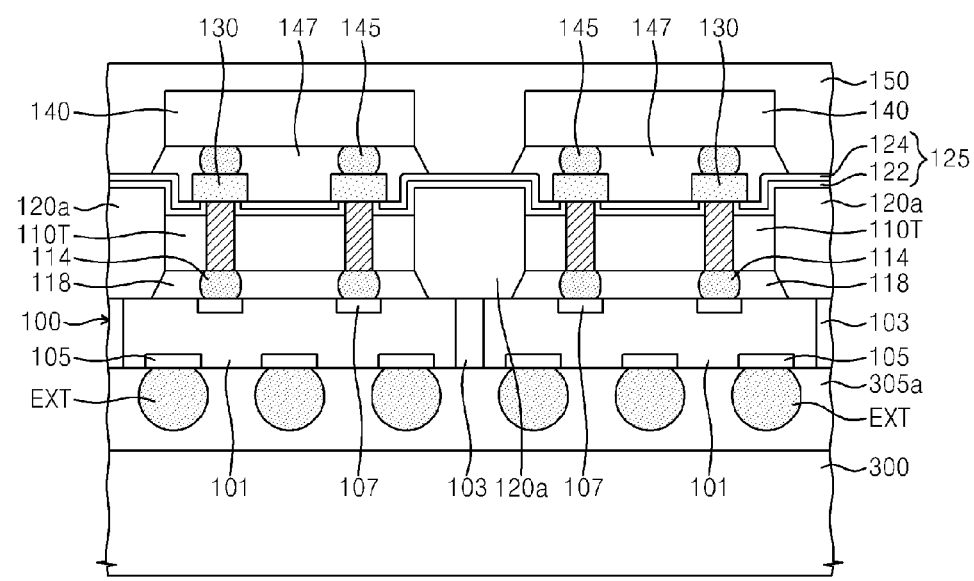

FIGS. 32 and 33 are cross-sectional views illustrating a method of manufacturing a semiconductor package according to yet another embodiment. According to this example, before the parent substrate 100 is bonded to the carrier substrate 300, the external bump EXT may be bonded to the external connection pad 105 of the parent substrate 100.

Referring to FIG. 32, the external bumps EXT may be bonded to the external connection pads 105 of the parent substrate 100. Subsequently, the parent substrate 100 having the external bumps EXT may be bonded to the carrier substrate 300. For example, the external bumps EXT may be disposed in an adhesive layer 305a disposed between the parent substrate 100 and the carrier substrate 300.

Referring to FIG. 33, subsequently, the processes described with reference to FIGS. 23 to 25 may be performed to realize a semiconductor package structure illustrated in FIG. 33.

Next, the carrier substrate 300 may be separated from the parent substrate 100 and the external bumps EXT by the method described with reference to FIG. 26. Thereafter, the singulation process described with reference to FIG. 9 may be performed.

The formation method of the external bump EXT according to this example may be applied to the modified examples described with reference to FIGS. 28 to 31.

Figure 34:
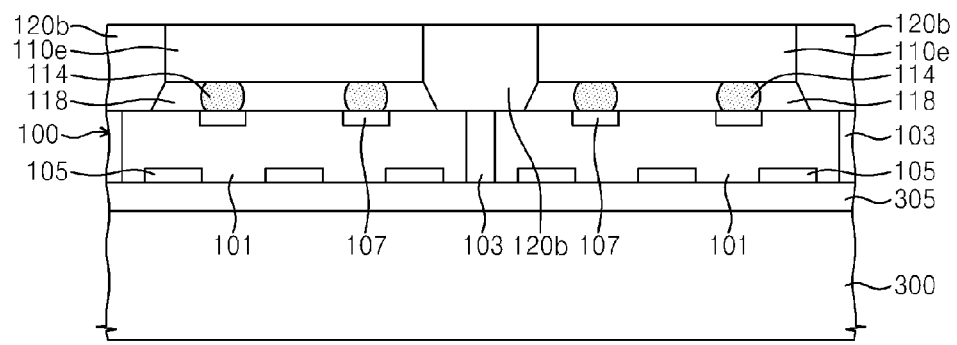
Figure 38:
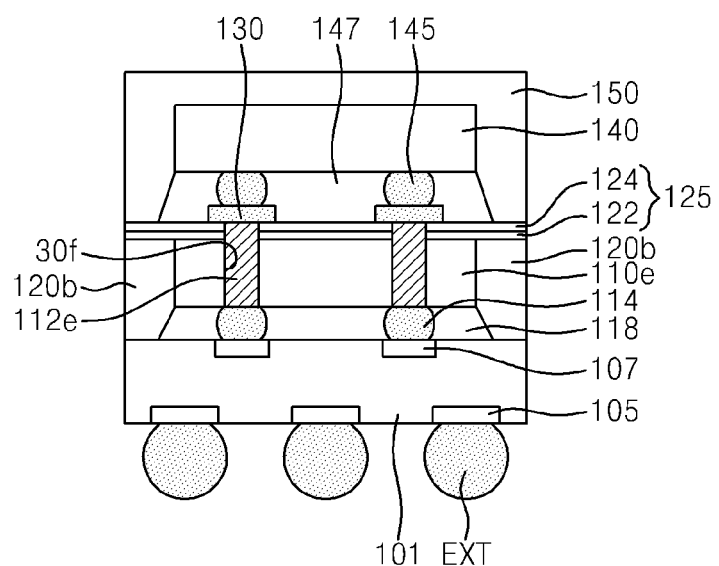

FIGS. 34 and 38 are cross-sectional views illustrating a method of manufacturing a semiconductor package according to other a further example embodiment. According to this example, a through-via electrode may be formed in a first chip after the first chip is mounted on the parent substrate 100.

Referring to FIG. 34, after the parent substrate 100 is bonded to the carrier substrate 300, a first chip 110e may be mounted on each of the package board parts 101 of the parent substrate 100. At this time, the first chip 110e may not include a through-via electrode. The first chip 110e may include a first chip bump 114, and the first chip bump 114 of the first chip 110e may be connected to the internal connection pad 107 of the package board part 101. The first underfiller 118 may fill a space between the first chip 110e and the package board part 101.

Subsequently, a first mold layer may be formed on the parent substrate 100, and then the first mold layer may be planarized until the first chips 110e are exposed. The planarized first mold layer 120b may have a top surface substantially coplanar with the exposed surfaces of the first chips 110e.

Figure 35:
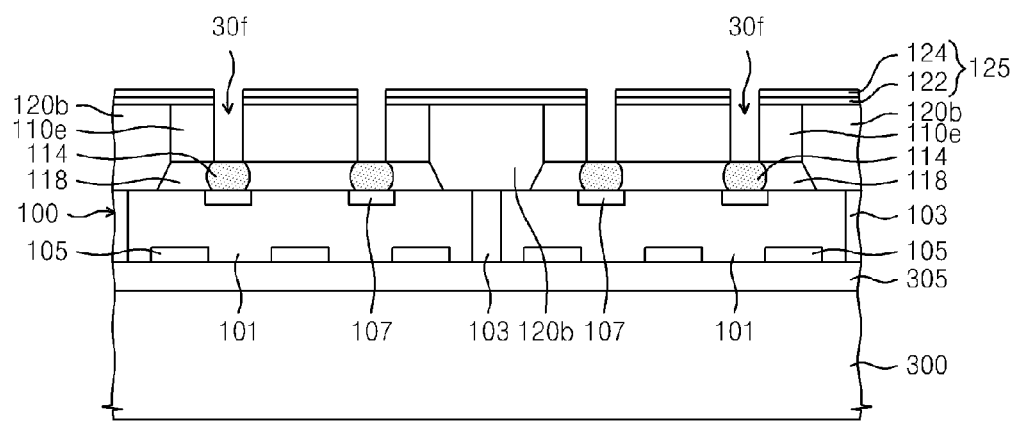

Referring to FIG. 35, the passivation layer 125 may be formed on the top surface of the planarized first mold layer 120b and the exposed surfaces of the first chips 110e.

Next, a via-hole 30f nay be formed to penetrate the passivation layer 125 and the first chip 110e. A plurality of the via-holes 30f may be formed on the parent substrate 100. The via-hole 30f may expose the first chip bump 114. Alternatively, the via-hole 30f may expose the metal interconnection 50 of FIG. 11A, the lower interconnection 15 of FIG. 11B, or the interconnecting pad 90 of FIG. 11C.

Figure 36:
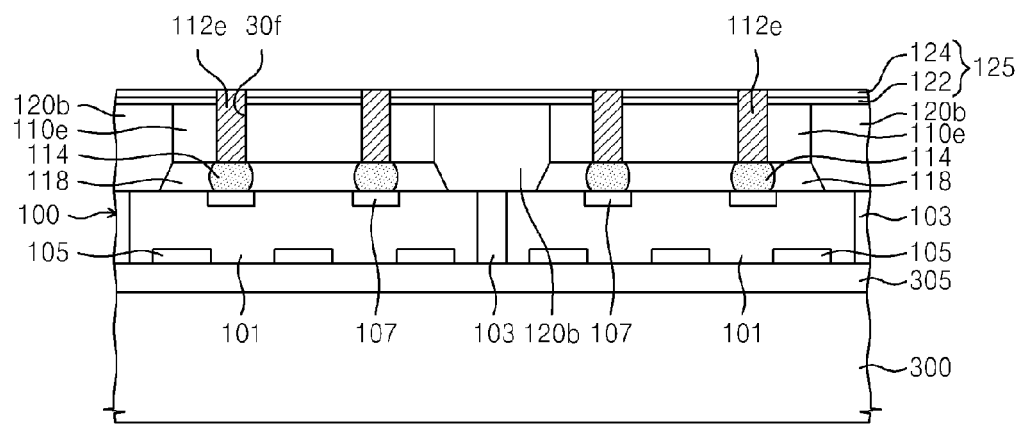

Referring to FIG. 36, through-via electrodes 112e may be formed in the via-holes 30f, respectively. The through-via electrode 112e may be electrically connected to the first chip bump 114. Before the through-via electrode 12e is formed, a via-insulating layer may be conformally formed in the via-hole 30f and then the via-insulating layer may be anisotropically etched until the conductor (e.g., the chip bump 114) under the via-hole 30f is exposed. Thus, the via-insulating layer may be confinedly disposed between an inner sidewall of the via-hole 30f and the through-via electrode 112e. As a result, the through-via electrode 112e may be insulated from the first chip 110e and be connected to the conductor under the via-hole 30f.

Figure 37:
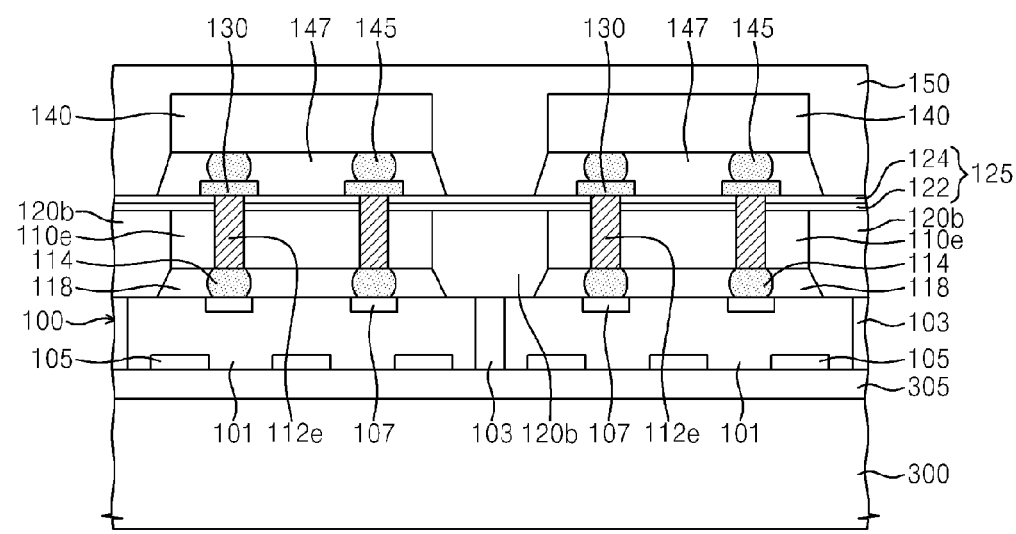

Next, referring to FIG. 37, the inter-chip 130 may be formed on each of the through-via electrode 112e, and then the second chip 140 may be mounted on each of the first chips 110c. Thereafter, the second mold layer 150 may be formed to realize a semiconductor package structure illustrated in FIG. 37.

Subsequently, the scanner substrate 300 may be separated from the parent substrate 100 as described with reference to FIG. 26. The singulation process of FIG. 9 may be performed and then the external hump EXT may be bonded to the external connection pad 105 of the package board 101. As a result, a semiconductor package illustrated in FIG. 38 may be realized.

Referring to FIG. 38, the top surface of the planarized first mold layer 120*b* may be substantially coplanar with the top surface of the first chip 110*e*. Thus, the passivation layer 125 may be substantially flat.

Figure 39:
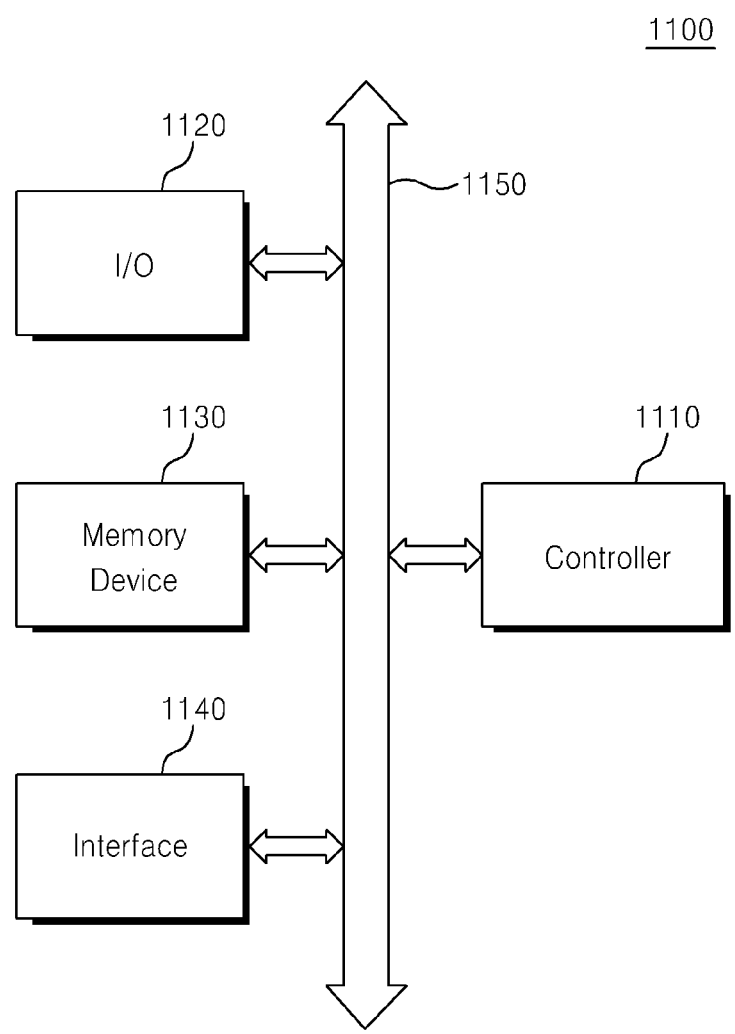

FIG. 39 is a schematic block diagram illustrating an electronic system including semiconductor packages according to example embodiments.

Referring to FIG. 39, an electronic system 1100 according to this embodiment may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller and other logic devices. The other logic devices may have a similar function to any one of the microprocessor, the digital signal processor and the microcontroller. The I/O unit 1120 may include a keypad, a keyboard and/or a display unit. The memory device 1130 may store data and/or commands. If the semiconductor packages according to the aforementioned embodiments include logic devices, the controller 1110 may include at least one of the semiconductor packages described above.

If the semiconductor packages according to the aforementioned embodiments include semiconductor memory devices, the memory device 1130 may include at least one of the semiconductor packages according to the aforementioned embodiments. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 40:
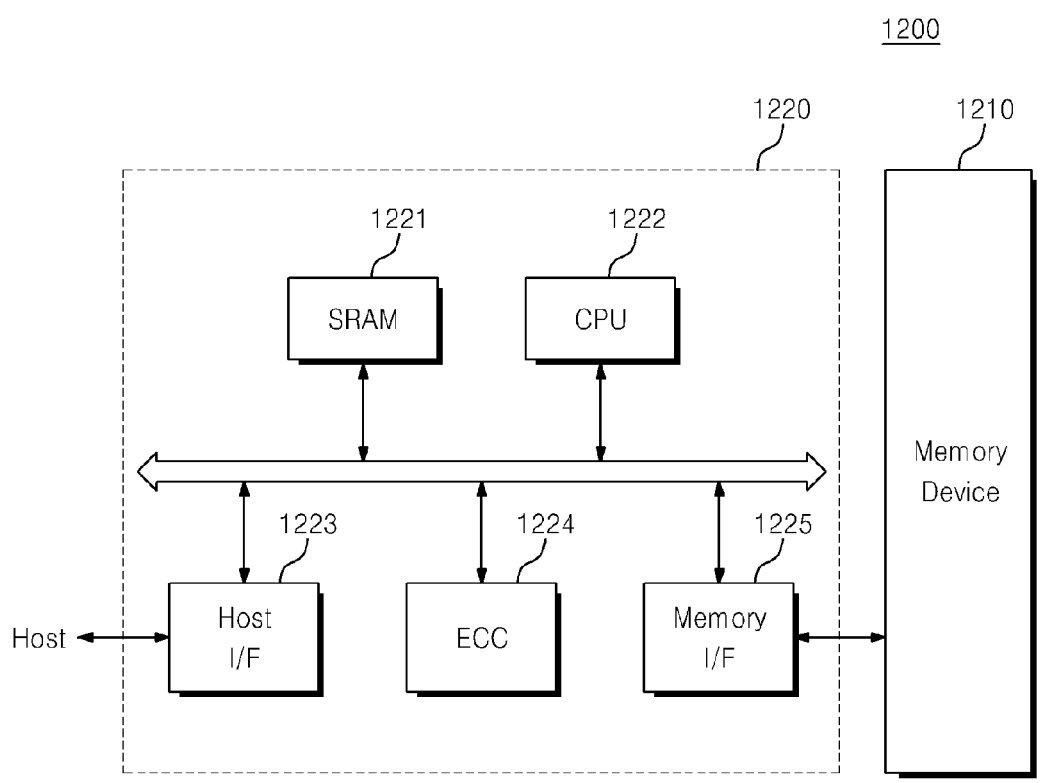

FIG. 40 is a schematic block diagram illustrating a memory card including semiconductor packages according to example embodiments.

Referring to FIG. 40, a memory card 1200 according to this embodiment may include a memory device 1210. If the semiconductor packages according to the aforementioned embodiments include semiconductor memory devices, the memory device 1210 may include at least one of the semiconductor packages according to the embodiments mentioned above. The memory card 1200 may further include a memory controller 1220 that controls data communication between a host and the memory device 1210.

The memory controller 1220 may include a central processing unit (CPU) 1222 that controls overall operations of the memory card 1200. If the semiconductor packages according to the aforementioned embodiments include logic devices, the CPU 1222 may include at least one of the semiconductor packages according to the embodiments mentioned above. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

Figure 41:
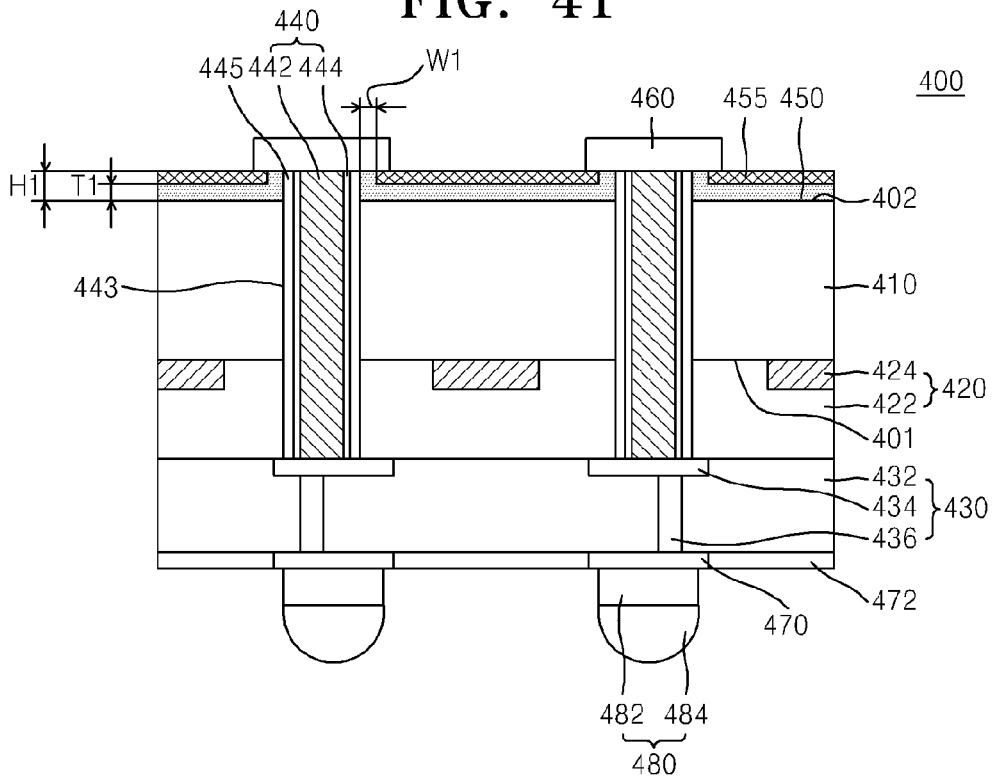

An embodiment of the present inventive concept provides a semiconductor device including a through-via electrode. FIG. 41 is a cross-sectional perspective view of a semiconductor device 400 according to an example embodiment.

Referring to FIG. 41, the semiconductor device 400 of the present embodiment may include a semiconductor substrate 410, a circuit layer 420, an interconnection layer 430, a through-via electrode 440, a first insulating layer 450, a passivation layer 455, and a through-via electrode pad 460.

The semiconductor substrate 410 may be formed from a semiconductor wafer. For example, the semiconductor substrate 410 may include a Group IV material or a Group III-V compound. More specifically, the semiconductor substrate 410 may include silicon (Si), silicon carbide (SiC), silicon germanium (SiGe), silicon germanium carbide (SiGeC), germanium (Ge) alloys, gallium arsenide (GaAs), indium arsenide (InAs), thoron phosphide (TnP), or other Group III-V or Group II-VI compound semiconductors, or be an organic semiconductor substrate. Also, the semiconductor substrate 410 may be formed using a single-crystalline wafer, such as a silicon single-crystalline wafer. However, the semiconductor substrate 410 is not limited to a single-crystalline wafer, but may be provided using other various types of wafers, such as an epitaxial wafer, a polished wafer, an annealed wafer, or a silicon-on-insulator (SOI) wafer. Here, the epitaxial wafer means a wafer obtained by growing a crystalline material on a single crystalline substrate.

The semiconductor substrate 410 may have a first surface 401 and a second surface 402 arranged on opposite sides of the substrate 410. Also, the first surface 401 of the semiconductor substrate 410 may be an active surface on which the circuit layer 420 may be formed. Doping regions doped with p-type impurities, such as phosphorus (P), arsenic (As), or antimony (Sb), and/or n-type impurities, such as boron (B), indium (In), or gallium (Ga), may be formed in the first surface 401 of the substrate 410 on which the circuit layer 420 is formed. On the other hand, the second surface 402, which is the reverse side of (or opposite to) the first surface 401, may not be doped with impurities. Hereinafter, the first surface 401 may be referred to as an active surface, and the second surface 402 may be referred to as a non-active surface.

The circuit layer 420 may include an interlayer insulating layer 422 and a semiconductor device unit 424.

The interlayer insulating layer 422 may be formed on the first surface 401 to cover the semiconductor device unit 424. The interlayer insulating layer 422 may physically and/or electrically insulate circuit devices of the semiconductor device unit 424 from one another. Also, the interlayer insulating layer 422 may serve to space monolayered or multilayered interconnections of the interconnection layer 430 and the circuit devices of the semiconductor device unit 424 apart from one another. In other words, monolayered or multilayered interconnections of the interconnection layer 430 are insulated from the circuit devices of the semiconductor device unit 424 by the interlayer insulating layer 422. The interlayer insulating layer 422 may have a stack structure in which various layers formed of a material such as an oxide, a nitride, a low-k dielectric material, a high-k dielectric material or combinations thereof are stacked.

The semiconductor device unit 424 may be formed in the interlayer insulating layer 422 on the first surface 401 of the semiconductor substrate 410, and include a plurality of circuit devices. The semiconductor device unit 424 may include various circuit devices, for example, an active device such as a transistor, a diode, and/or passive devices such as a capacitor or a resistor. The semiconductor device unit 424 may include at least one selected from a system large-scale integration (LSI), a logic circuit, an image sensor such as a CMOS imaging sensor (CIS), a memory device such as a flash memory, a dynamic random access memory (DRAM), a static RAM (SRAM), an erasable programmable read-only memory (EPROM), a phase-change RAM (PRAM), a magnetic RAM (MRAM) including spin-transfer torque random access memory (STT-RAM), a resistive RAM (ReRAM), a high-bandwidth memory (HBM), and a hybrid memory cubic (HMC), or a micro-electro-mechanical system (MEMS) device.

The circuit devices of the semiconductor device unit 424 may be electrically connected to the interconnections of the interconnection layer 430 through a conductive connection structure, such as a via contact.

The interconnection layer 430 may include an inter-metal dielectric (IMD) 432, interconnections 434, and a vertical plug 436.

The IMD 432 may be formed on the circuit layer 420, i.e., on the interlayer insulating layer 422, to cover the interconnections 434. The IMD 432 may serve to space at least two interconnections 434 from one another. Although the IMD 432 is illustrated as a single layer in FIG. 41, the IMD 432 may have a multilayered structure. For example, the IMD 432 may include at least two layers. The number of layers in the IMD 432 can correspond to the number of layers in which the interconnections 434 are formed.

The interconnections 434 may include at least one layer. The interconnections 434 may be electrically connected to the circuit devices of the semiconductor device unit 424 to constitute a predetermined circuit, or be used to electrically connect the circuit devices with external devices. Although only one interconnection layer, for example, only a first interconnection 434, is illustrated in the present embodiment, additional interconnections may be formed other than the first interconnection 434 and electrically connected to the first interconnection 434 through a vertical plug. Also, the first interconnection 434 may be electrically connected to an electrode pad 470 through the vertical plug 436. The first interconnection 434 may be formed of a metal, such as copper (Cu), aluminum (Al), or tungsten (W).

Although interconnections and materials for the interconnections are described above, the present inventive concept is not limited thereto. Also, structures or connection relationships of the interconnections 434 and the vertical plug 436 as shown in FIG. 41 are only exemplary, and it will be understood by one of ordinary skill in the art that structures and connection relationships of interconnections and a vertical plug according to the present inventive concept are not limited to those shown in FIG. 41.

On the other hand, the interconnection 434 and the vertical plug 436 may be formed of the same material or different materials. The interconnection 434 and the vertical plug 436 may include not only a core metal but also at least one barrier metal layer configured to surround the core metal and prevent diffusion of the core metal.

The through-via electrode 440 may be formed extending through the circuit layer 420, the semiconductor substrate 410, and the passivation layer 455. For example, the through-via electrode 440 may be a through-silicon via (TSV). One end of the through-via electrode 440 may be electrically connected to the interconnection 434. Also, the other end of the through-via electrode 440 may protrude from the second surface 402. In this case, the other end of the through-via electrode 440 may protrude above the second surface 402 to a height H1 of several to several tens of μm. For instance, the protruding height H1 may range from about 3 μm to about 10 μm.

The through-via electrode 440 may include at least one metal. Specifically, the through-via electrode 440 may include an interconnection metal layer 442 disposed in an opening 443 extending through the semiconductor substrate 410 and the circuit layer 420 and a barrier metal layer 444 surrounding the interconnection metal layer 442. The interconnection metal layer 442 may include at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), taltanlum (Ta), tellurium (Te), titanium (Ti), tungsten (W), zinc (Zn), and zirconium (Zr). For example, the interconnection metal layer 442 may include one metal chosen from tungsten (W), aluminum (Al), and copper (Cu) or may be a stack structure in which multiple layers including at least one of tungsten (W), aluminum (Al), and copper (Cu) are stacked.

Also, the barrier metal layer 444 may include one chosen from titanium (Ti), tantalum (Ta), titanium nitride (TiN), and tantalum nitride (TaN) or a stack structure in which multiple layers including at least one of titanium (Ti), tantalum (Ta), titanium nitride (TiN), and tantalum nitride (TaN) are stacked. However, materials for the interconnection metal layer 442 and the barrier metal layer 444 are not limited to the above-described materials. Furthermore, the barrier metal layer 444 may be omitted depending on the selection of a metal forming the interconnection metal layer 442.

Also, a spacer insulating layer 445 may be provided on an outer surface of the barrier metal layer 444. The spacer insulating layer 445 may substantially prevent the semiconductor substrate 410 or the circuit devices of the circuit layer 420 from being in direct contact with the through-via electrode 440. The spacer insulating layer 445 may extend along a surface of the barrier metal layer 444, for example, to a bottom surface of the through-via electrode pad 460. The spacer insulating layer 445 may be formed using an oxide layer or a nitride layer. For instance, the spacer insulating layer 445 may be formed of silicon oxide ($SiO_2$).

The embodiment shown in FIG. 41 illustrates an example in which the through-via electrode 440 has a via-middle structure. That is, after the semiconductor device unit 424 and the interlayer insulating layer 422 are formed and before the interconnection layer 430 is formed, the through-via electrode 440 may be formed. However, the present inventive concept is not limited thereto and may be applied to a via-first structure or a via-last structure. The via-first structure and the via-last structure are known to one of ordinary skill in the art and thus, detailed descriptions thereof are omitted. Such examples may be disclosed in U.S. Pat. Nos. 8,653,676 and 8,648,429, the disclosures of which are incorporated herein by reference.

The second surface 402 of the semiconductor substrate 410 may be covered with the passivation layer 455. The passivation layer 455 may protect the second surface 402 of the semiconductor device 400 from external impact or moisture. The passivation layer 455 may also substantially prevent a polymer from penetrating the semiconductor substrate 410 or the through-via electrode 440 during a subsequent photolithography process for forming the through-via electrode pad 460. Also, the passivation layer 455 may support the through-via electrode 440 in a lateral direction and substantially prevent the through-via electrode 440 from being broken during a chemical mechanical polishing (CMP) process. The passivation layer 455 may be formed of, for example, silicon nitride, a polymer, or a combination thereof.

When a polymer is used as the passivation layer 455 or a portion thereof, the polymer may be polyimide, polystyrene, or poly-2-methoxyethylacrylate (PMEA). For example, the passivation layer 455 may be formed by an exposure process using a phase-shift mask (PSM).

A first insulating layer 450 may be interposed between the second surface 402 and the passivation layer 455. The first insulating layer 450 may be, for example, a silicon oxide layer. When the first insulating layer 450 is a silicon oxide layer, since the first insulating layer 450 has good adhesion to the semiconductor substrate 410, delamination between the semiconductor substrate 410 and the passivation layer 455 may be substantially prevented. For example, the material used for forming the first insulating layer 450 may be selected such that adherence between the first insulating layer 450 and the second surface 402 is higher than adherence between the passivation layer 455 and the second surface 402.

The silicon oxide layer forming the first insulating layer 450 may have a modulus of about 55 GPa to about 65 GPa. Also, a hardness of the silicon oxide layer forming the first insulating layer 450 may range from about 5.5 GPa to about 6.2 GPa when measured using a nanoindentation test (ISO-14577).

The first insulating layer 450 having the above-described physical properties may be obtained, for example, by performing a CVD process under a pressure of about 3 Torr to 10 Torr at a temperature of about 130° C. to about 200° C.

A vertical portion of the first insulating layer 450 may extend along the second surface 402 in a horizontal direction toward the through-via electrode 440 in cross-sectional view. Since the spacer insulating layer 445 may be provided on a surface of the through-via electrode pad 460 as described above, the first insulating layer 450 may extend to the spacer insulating layer 445 in the horizontal direction. Also, the first insulating layer 450 may extend along the circumference of the through-via electrode 440 to the bottom surface of the through-via electrode pad 460 in a vertical direction.

Also, the first insulating layer 450 may be in direct contact with the second surface 402. Furthermore, a portion of the first insulating layer 450 may extend from the second surface 402 to the bottom surface of the through-via electrode pad 460. Optionally, a portion of the first insulating layer 450 may extend from the second surface 402 to the bottom surface of the through-via electrode pad 460. For example, a portion of the first insulating layer 450 may conformally extend from the second surface 402 to the bottom surface of the through-via electrode pad 460. A thickness T1 of a portion of the first insulating layer 450 that extends along the second surface 402 may be substantially equal to a width W1 of a portion of the first insulating layer 450 that extends to be in contact with the bottom surface of the through-via electrode pad 460.

In particular, the thickness T1 of the first insulating layer 450 may be about 2 to 8 times as great as a thickness H1-T1 of the passivation layer 455. If the thickness T1 of the first insulating layer 450 is excessively small, a reduction in aspect ratio related to the through-via electrode 440 protruding above the second surface 402 during a manufacturing process may be insufficient so that defects may occur in an exposed section of the through-via electrode 440. If the thickness T1 of the first insulating layer 450 is excessively great, the passivation layer 455 may not be present when the through-via electrode 440 is exposed during a manufacturing process.

The passivation layer 455 may be in direct contact with the first insulating layer 450 and extend in a direction substantially parallel to the second surface 402. Also, the passivation layer 455 may extend under the through-via electrode pad 460. In particular, the passivation layer 455 may be in contact with at least a portion of the bottom surface of the through-via electrode 460. In this case, a top surface of the passivation layer 455 may be substantially coplanar with the bottom surface of the through-via electrode pad 460.

The through-via electrode pad 460 may be formed of for example, any one of copper (Cu), gold (Au), nickel/gold (Ni/Au), and nickel/palladium/gold (Ni/Pd/Au). The through-via electrode pad 460 may be formed by an electroplating process using the through-via electrode 440 or a seed metal provided on the through-via electrode 440. The through-via electrode pad 460 may have a thickness of several to several tens of μm.

A top surface of the through-via electrode 440 may be processed using an organic solderable preservatives (OSP) process. Also, the surface of the through-via electrode pad may be processed using a surface processing process, such as a direct immersion gold (DIG) process, an electroless nickel immersion gold (ENIG) process, or an electroless nickel electroless palladium immersion gold (ENEPIG) process, so that the through-via electrode pad 460 can be adhered more tightly to a bump or a solder ball.

The electrode pad 470 may be formed on the IMD 432 and electrically connected to the interconnection 434 of the interconnection layer 430 through the vertical plug 436. In some cases, an additional interlayer insulating layer may be interposed between the IMD 432 and the electrode pad 470, and the electrode pad 470 and the interconnection 434 may be electrically connected through a vertical contact penetrating the additional interlayer insulating layer.

On the other hand, a passivation layer 472 may be formed on a bottom surface of the IMD 432 and a side surface of the electrode pad 470. The passivation layer 472 may protect an active surface of a semiconductor chip and be formed of an oxide, a nitride, or a combination thereof.

A connection member 480 may be formed on the electrode pad 470. The connection member 480 may include a conductive pillar 482 and a micro-bump 484. The conductive pillar 482 may be formed using an electroplating process and have a cylindrical shape. In the present embodiment, the conductive pillar 482 may be a copper (Cu) pillar. However, a material for the metal pillar 482 is not limited to copper. For example, the metal pillar 482 may be formed of aluminum (Al), nickel (Ni), gold (Au), or an alloy thereof. On the other hand, the conductive pillar 482 may be formed not only in a cylindrical shape but also in various shapes, such as a rectangular pillar and an elliptical pillar.

The micro-bump 484 may be formed on the conductive pillar 482 using, for example, tin (Sn). In some cases, the micro-bump 484 may be formed of tin (Sn), palladium (Pd), nickel (Ni), silver (Ag), or an alloy thereof. The micro-bump 484 may have a hemispheric shape. The micro-bump 484 may be formed as a hemispheric type using a reflow process or formed as a slightly different type from a hemispheric type depending on a reflow process. For example, the micro-bump 484 may be slightly reflowed and expand to side surfaces of the metal pillar 482.

Figure 42A:
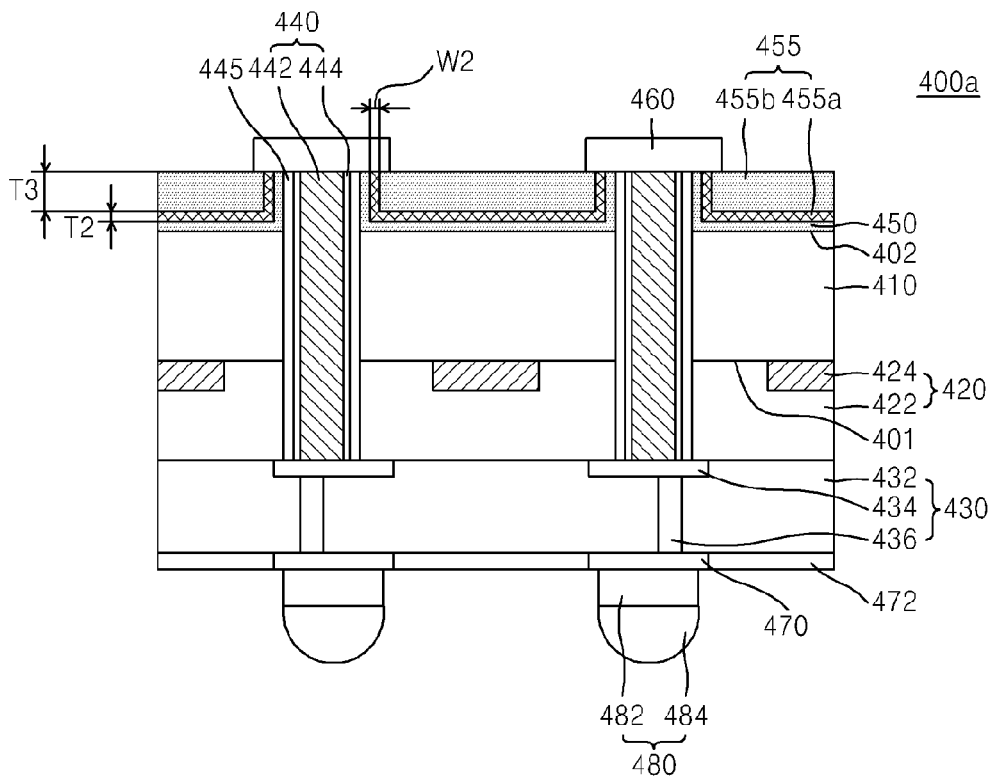
FIG. 42A is a cross-sectional side view of a semiconductor device according to another example embodiment.

FIG. 42A is a cross-sectional side view of a semiconductor device 400a according to another example embodiment.

Referring to FIG. 42A, the semiconductor device 400a may include a second insulating layer 455a and a third insulating layer 455b on the second surface 402. That is, the third insulating layer 455b may be provided on the second insulating layer 455a. The present embodiment is about the same as the embodiment described previously with reference to FIG. 41 except that the third insulating layer 455b is formed on the second insulating layer 455a and thus, redundant description is omitted.

The third insulating layer 455b may include, for example, silicon oxide. The third insulating layer 455b may be in direct contact with the second insulating layer 455a and extend in a direction parallel to the second surface 402. The third insulating layer 455b may include silicon oxide having the same physical properties as the first insulating layer 450 described with reference to FIG. 41.

The second insulating layer 455a may include, for example, silicon nitride. The second insulating layer 455a may be in direct contact with the first insulating layer 450 and extend in a direction parallel to the second surface 402.

As described above with reference to FIG. 41, the first insulating layer 450 may extend along the second surface 402 to the through-via electrode 440 or the spacer insulating layer 445 surrounding the through-via electrode 440, and subsequently extend along the circumference of the through-via electrode 440 or the spacer insulating layer 445 surrounding the through-via electrode 440 in a vertical direction, perpendicular to the second surface 402.

The second insulating layer 455a may extend in a direction substantially parallel to the second surface 402 to a portion of the first insulating layer 450, which extends in the vertical direction. Also, the second insulating layer 455a may extend in the vertical direction along the vertically extending portion of the first insulating layer 450. In this case, as shown in FIG. 42A, the second insulating layer 455a may extend to a bottom surface of the through-via electrode pad 440.

Also, the second insulating layer 455a may be formed along the surface of the first insulating layer 450. Optionally, the second insulating layer 455a may be conformally formed along the surface of the first insulating layer 450. A thickness T2 of a portion of the second insulating layer 455a, which extends substantially parallel to the second surface 402, may be substantially equal to a width W2 of a portion of the second insulating layer 455a, which is in contact with a bottom surface of the through-via electrode pad 460.

As described above, the third insulating layer 455b may be provided in a direction substantially parallel to the second surface 402 and be in contact with at least a portion of the bottom surface of the through-via electrode pad 460. As a result, the bottom surface of the through-via electrode pad 460 may be in direct contact with the first insulating layer 450, the second insulating layer 455a, and the third insulating layer 455b. A top surface of the third insulating layer 455b may be substantially coplanar with the bottom surface of the through-via electrode pad 460.

Figure 42B:
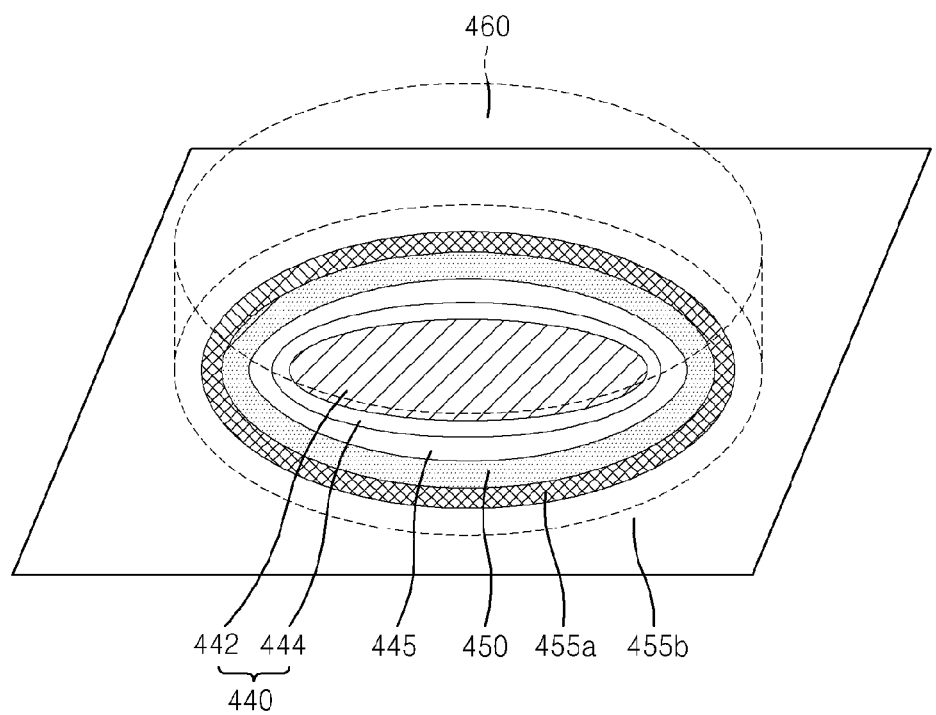
FIG. 42B is a perspective view of top surfaces of a through-via electrode of FIG. 42A and a circumferential region thereof.

FIG. 42B is a perspective view of top surfaces of the through-via electrode 440 of FIG. 42A and a circumferential region thereof. Referring to FIG. 42B, the bottom surface of the through-via electrode pad 460 may be not only in contact with the top surface of the through-via electrode 440 but also in direct contact with the first insulating layer 450, the second insulating layer 455a, and the third insulating layer 455b. Also, top surfaces of the first insulating layer 450, the second insulating layer 455a, and the third insulating layer 455b, which may be in contact with the bottom surface of the through-via electrode pad 460, may have a circular shape, particularly, a concentric circular shape.

Referring back to FIG. 42A, the third insulating layer 455b may have a sufficiently greater thickness than the thickness of the first insulating layer 450 and/or the thickness of the second insulating layer 455a. For example, a thickness T3 of the third insulating layer 455b may be about 10 to 30 times as great as the thickness T2 of the second insulating layer 455a. Also, a thickness of the first insulating layer 450 may be smaller than the thickness T2 of the second insulating layer 455a. If the thickness T3 of the third insulating layer 455b is too small, a reduction in aspect ratio related to the through-via electrode 440 protruding above the second surface 402 during a manufacturing process may be insufficient so that defects may occur in an exposed section of the through-via electrode 440. If the thickness T3 of the third insulating layer 455b is too great, increased manufacturing time may be required.

Also, a portion of a top surface of the third insulating layer 455b is in contact with the bottom surface of the through-via electrode pad 460, while the remaining portion of the top surface of the third insulating layer 455b may extend on the same plane surface as the bottom surface of the through-via electrode pad 460 in a direction parallel to the second surface 402.

Figure 43:
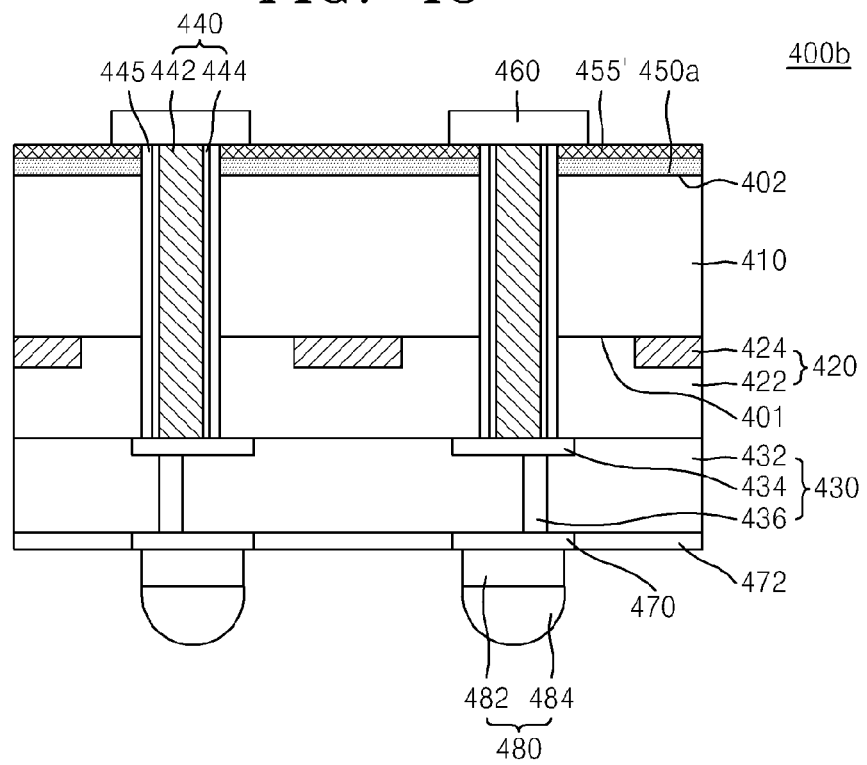

FIG. 43 is a cross-sectional side view of a semiconductor device 400b according to still another example embodiment.

Referring to FIG. 43, a first insulating layer 450a may be provided on the second surface 402 and consistently extend along the second surface 402 in a horizontal direction. In other words, unlike in the embodiment shown in FIG. 41, the first insulating layer 450a may extend to the through-via electrode 440 or the spacer insulating layer 445 surrounding the through-via electrode 440 but may not extend in a direction perpendicular to the second surface 402.

The first insulating layer 450a may correspond to the first insulating layer 450 described with reference to FIG. 41, and detailed descriptions thereof are omitted here.

Also, a passivation layer 455' provided on the first insulating layer 450a may extend substantially parallel to the second surface 402 along the first insulating layer 450a in a horizontal direction. The passivation layer 455' may extend to the through-via electrode 440 or the spacer insulating layer 445 surrounding the through-via electrode 440 in plan view. In addition, the passivation layer 455' may be in contact with at least a portion of the bottom surface of the through-via electrode pad 460.

Furthermore, as shown in FIG. 43, the bottom surface of the through-via electrode pad 460 may be configured not to be in contact with the first insulating layer 450a.

The first insulating layer 450a may be formed of, for example, silicon oxide. In some embodiments, the first insulating layer 450a may be formed by spin-coating and curing spin-on glass (SOG). However, the present inventive concept is not limited thereto. The passivation layer 455' may be formed of, for example, silicon nitride, a polymer, or a combination thereof.

In particular, a thickness of the first insulating layer 450a may be about 2 to 8 times as great as a thickness of the passivation layer 455'. If the thickness of the first insulating layer 450a is too small, a reduction in aspect ratio related to the through-via electrode 440 protruding above the second surface 402 during a manufacturing process may be insufficient. As a result, defects may occur in an exposed section of the through-via electrode 440. If the thickness of the first insulating layer 450*a* is too thick, economical efficiency may be degraded.

Figure 44A:
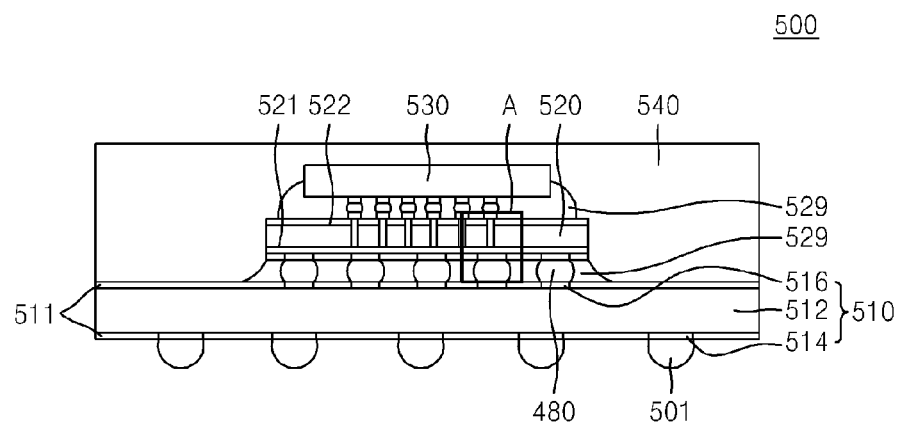
FIG. 44A is a cross-sectional side view of a semiconductor package according to an example embodiment.

FIG. 44A is a cross-sectional side view of a semiconductor package 500 according to an example embodiment.

Referring to FIG. 44A, semiconductor devices (or semiconductor chips) 520 and 530, which are sequentially stacked and mounted on a substrate 510, are provided. In this case, both of the first semiconductor device 520 and the second semiconductor device 530 may be disposed such that an active surface thereof faces downward.

The substrate 510 may be a printed circuit board (PCB) or a flexible PCB (FPCB). A base material 512 of the substrate 510 may have a stacked structure in which various material layers are stacked. The various material layers may include one or more metal wiring layers and one or more prepreg (PPG) layers. A metal that forms the metal wiring layers may be, for example, copper (Cu), gold (Au), platinum (Pt), silver (Ag), nickel (Ni), aluminum (Al), invar, or the like; however, the present inventive concept is not limited thereto.

A solder resist (SR) layer 511 may be formed on an outermost part of the base material 512. The SR layer 511 may be formed on only one of two main surfaces of the base material 512, or on both of the main surfaces of the base material 512.

The SR layer 511 may be formed of an acryl-based resin, an epoxy-based resin, a urethane-based resin, a silicon-based resin, a paraxylene-based resin, or a parylene-based resin, using a dipping method, a spraying method, a flow coating method, a vacuum coating method, or the like. In addition, the SR layer 511 physically protects the substrate 510, prevents corrosion, and improves electrical characteristics.

A connection pad 516 for electrical connection with a semiconductor chip mounted on an upper surface of the substrate 510 may be disposed on the upper surface of the substrate 510.

The connection pad 516 may be a conductive pad, for example, a metal pad. In particular, the connection pad 516 may be, for example, a Cu pad, a Ni pad, or an Al pad plated with Ni. However, the present inventive concept is not limited thereto.

Also, a connection pad 514 for electrically connecting the semiconductor chip with an external device may be disposed on a lower surface of the substrate 510. The connection pad 514 disposed on the lower surface of the substrate 510 may be a conductive pad, like the connection pad 516 disposed on the upper surface of the substrate 510, for example, a metal pad. In particular, the connection pad 514 may be, for example, a Cu pad, a Ni pad, or an Al pad plated with Ni. However, the present inventive concept is not limited thereto.

A conductive bump, e.g., a solder bump 501 for connecting the semiconductor chip with an external device may be disposed on the connection pad 514. The solder bump 501 may be a tin (Sn)-based solder bump. In more detail, the solder bump 501 may include Sn as a main component, and include Ag and/or Cu. However, the present inventive concept is not limited thereto.

The second semiconductor device 530 mounted on the package substrate 510 may include various semiconductor devices, for example, a memory device, a core circuit device, a peripheral circuit device, a logic circuit device, or a control circuit device. Examples of the memory device may include, for example, volatile memory devices such as DRAMs or SRAMs, and non-volatile memory devices such as EPROMs, electrically EPROM (EEPROM), and flash EEPROM. Selectively, a system large scale integration (LSI) chip, an image sensor such as a CIS, a MEMS device, an active device, or a passive device may be provided on the active surface of the semiconductor substrate 522.

The first semiconductor device 520 may have a first surface 521 and a second surface 522 disposed opposite to the first surface 521 and may be a semiconductor device described with reference to FIG. 41. A portion denoted as "A" in FIG. 44A may correspond to a portion illustrated in FIG. 41. However, it will be understood by one of ordinary skill in the art that the portion denoted as A may selectively correspond to a portion illustrated in FIG. 42A or FIG. 43.

Since the first semiconductor device 520 is as described above in detail with reference to FIG. 41, detailed descriptions thereof are omitted.

As shown in FIG. 44A, an underfill 529 may be injected under the first semiconductor device 520 and the second semiconductor device 530.

A top surface of the package substrate 510 and the first and second semiconductor devices 520 and 530 may be encapsulated by an encapsulant 540. The encapsulant 540 may be formed of, for example, a polymer material such as an epoxy molding compound (EMC), but is not limited thereto.

Figure 44B:
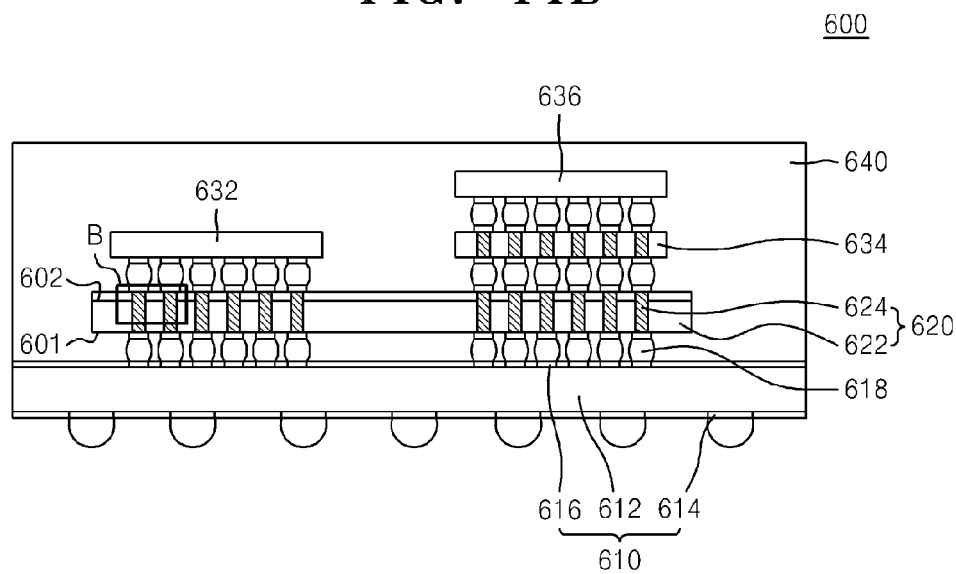
FIG. 44B is a cross-sectional side view of a semiconductor package according to another example embodiment.
Figure 44C:
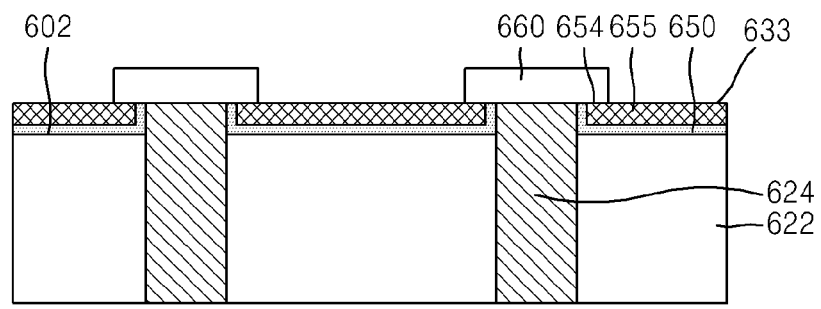
FIG. 44C is a partially enlarged cross-sectional view of a portion denoted as B in FIG. 44B.

FIG. 44B is a cross-sectional side view of a semiconductor package 600 according to another example embodiment. FIG. 44C is a partial enlarged cross-sectional view of a portion denoted as B in FIG. 44B.

Referring to FIGS. 44B and 44C, semiconductor substrates 632, 634, and 636 disposed on a package substrate 610 may be provided. Semiconductor devices may be formed on active surfaces of the semiconductor substrates 632, 634, and 636. Also, an interposer 620 may be disposed between the package substrate 610 and the semiconductor substrates 632, 634, and 636.

The package substrate 610 may include a base material 612 and connection pads 614 and 616, as also described above in detail with reference to FIG. 44A and thus, additional descriptions thereof are omitted here.

Various semiconductor devices may be provided on the active surface of each of the semiconductor substrates 632, 634, and 636. For example, the semiconductor devices may include a memory device, a core circuit device, a peripheral circuit device, a logic circuit device, or a control circuit device, as described in detail with reference to FIG. 44A and thus, additional descriptions are omitted here.

The interposer 620 may be interposed between the package substrate 610 and the semiconductor substrates 632 and 634.

The interposer 620 may include an interposer substrate 622 having a first surface 601 and a second surface 602 and a through-via electrode 624 extending from the first surface 601 to the second surface 602. Although not illustrated in detail in FIG. 44B, a portion of the through-via electrode 624 may protrude above the second surface 602. The interposer 620 may not only serve as a medium for electrically connecting the semiconductor substrates 632, 634, and 636 with the package substrate 610, but also serve as a medium for electrically connecting the semiconductor substrate 632 and the semiconductor substrate 634, which are arranged horizontally on the interposer 620. That is, at least two semiconductor substrates may be stacked directly on the interposer 620, and electrical connection between the at least two semiconductor substrates may be enabled by the interposer 620. More specifically, such electrical connection may be achieved by conductive interconnections formed in the interposer 620.

Referring to FIG. 44C, which is a detailed view of the portion of the interposer 620, which is denoted as B in FIG. 44B, the through-via electrode 624 extending through the interposer substrate 622 may be provided. Although not specifically shown in FIG. 44C, a spacer insulating layer may be further provided along the circumference of the through-via electrode 624 to provide electrical insulation. Also, the through-via electrode 624 may include a barrier metal layer depending on the properties of a conductive metal.

A through-via electrode pad 660 may be provided on the second surface 602 and electrically connected to the through-via electrode 624. The through-via electrode pad 660 has been described in detail with reference to FIG. 41, and a method of forming the through-via electrode pad 660 will be described in detail later.

An oxide layer such as a silicon oxide layer 650 may be provided on the second surface 602 and extend along the second surface 602. A silicon nitride layer 655 may be disposed on the silicon oxide layer 650. The silicon nitride layer 655 may be in contact with at least a portion of a bottom surface 654 of the through-via electrode pad 660. The interposer 622 may be, for example, a silicon substrate, but it is not limited thereto.

The silicon oxide layer 650 may extend along the second surface 602 in a horizontal direction, and extend to the through-via electrode 624. The silicon oxide layer 650 may be in direct contact with the second surface 602. In some embodiments, a vertical portion of the silicon oxide layer 650 may be conformally formed on sidewalls 621 of the through-via electrode 624 and may extend from the second surface 602 to the bottom surface 654 of the through-via electrode pad 660.

The silicon nitride layer 655 may be in direct contact with the silicon oxide layer 650 and extend in a direction substantially parallel to the second surface 602. Also, the silicon nitride layer 655 may extend under the through-via electrode pad 660. In particular, the silicon nitride layer 655 may be in contact with at least a portion of the bottom surface 654 of the through-via electrode pad 660. In this case, a top surface 633 of the silicon nitride layer 655 may be substantially coplanar with the bottom surface 654 of the through-via electrode pad 660.

It will be understood by one of ordinary skill in the art that the silicon oxide layer 650 and the silicon nitride layer 655 shown in FIG. 44C are configured similar to those of FIG. 41. Also, it will be understood by one of ordinary skill in the art that the structure shown in FIG. 42 or FIG. 43 may be applied on the second surface 602 of the interposer 620.

A top surface of the package substrate 610 and the semiconductor substrates 632, 634, and 636 may be covered by an encapsulant 640. The encapsulant 640 may be, for example, a polymer material such as an EMC, but is not limited thereto.

Figure 44D:
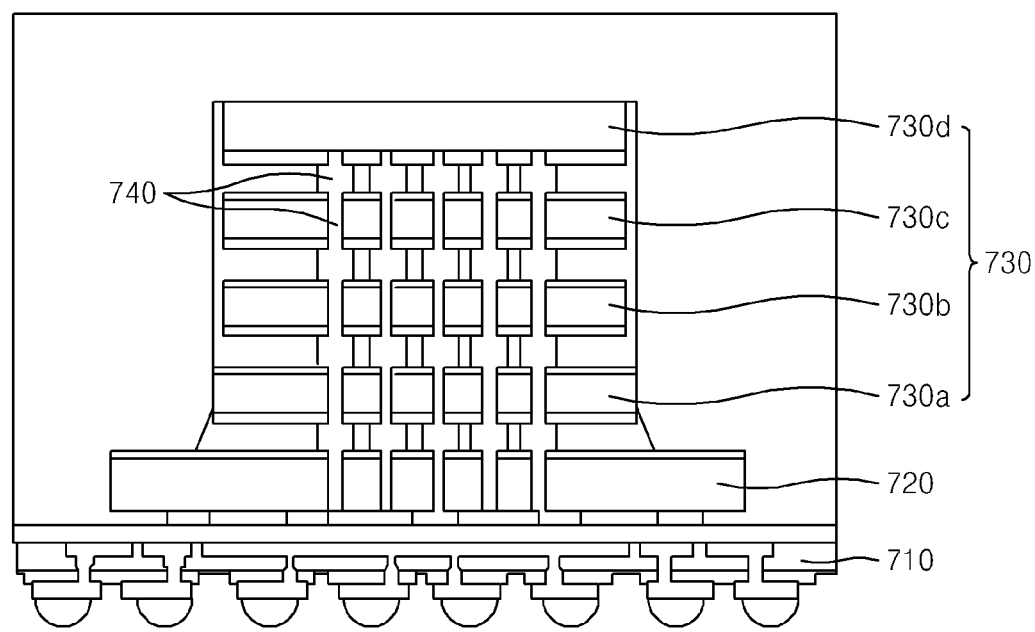
FIG. 44D is a cross-sectional side view of an example of a system-in-package (SIP)-type semiconductor package according to another example embodiment.

FIG. 44D is a cross-sectional side view of an example of a system-in-package (SIP)-type semiconductor package 701 according to another example embodiment.

Referring to FIG. 44D, a plurality of semiconductor chips 720 and 730 may be stacked on a substrate 610. In particular, the semiconductor package 701 may be configured such that a logic device 720, such as a memory controller, is mounted directly on the substrate 710 and a plurality of memory devices 730 are vertically stacked thereon.

In particular, the logic device 720 and the plurality of memory devices 730 may be connected to one another through a through-via electrode 740 and configured to transmit or receive signals through the through-via electrode 740.

Furthermore, the plurality of memory devices 730 may include a master memory device 730a and slave memory devices 730b, 730c, and 730d. The master memory device 730a may directly interface with the logic device 720 and mediate an electrical connection between the logic device 720 and the slave memory devices 730b, 730c, and 730d.

It will be understood by one of ordinary skill in the art that surfaces of the logic device 720 and/or the plurality of memory devices 730 and the through-via electrode 740 may be arranged as shown in FIG. 44C. Furthermore, it will also be understood by one of ordinary skill that configuration of FIG. 42A or FIG. 43 may be applied to the surfaces of the logic device 720 and/or the plurality of memory devices 730 and the through-via electrode 740 instead of the configuration of FIG. 44C.

Figure 44E:
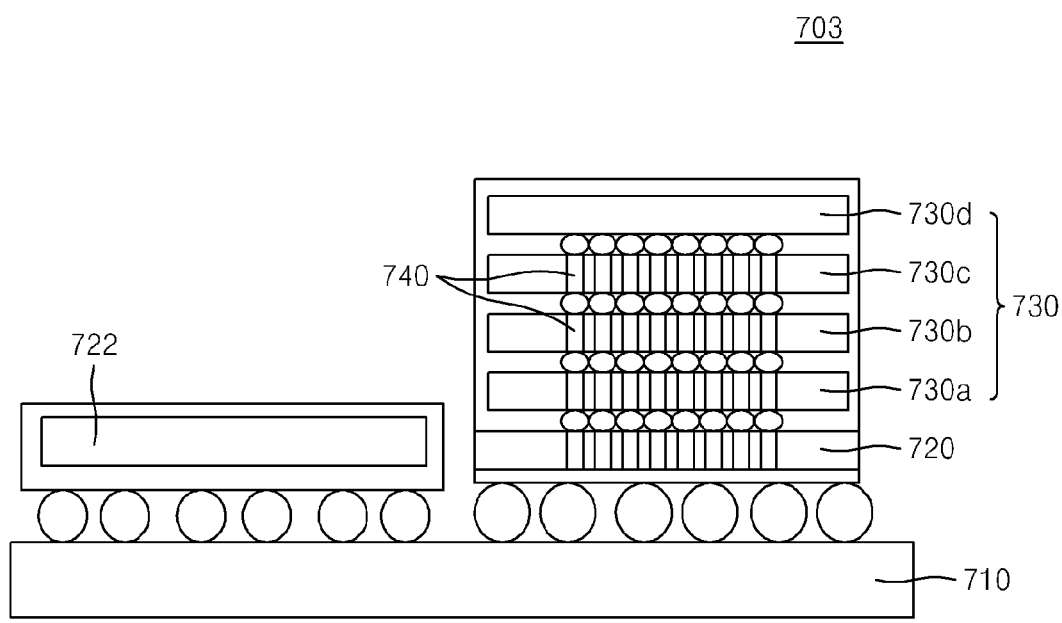
FIG. 44E is a cross-sectional side view of an example of a hybrid memory cubic (HMC)-type semiconductor package according to still another example embodiment.

FIG. 44E is a cross-sectional side view of an example of a hybrid memory cube (HMC)-type semiconductor package 703 according to still another example embodiment.

Referring to FIG. 44E, a central processing unit (CPU) 722 and a logic device 720, such as a memory controller, may be disposed on a substrate 710. Also, a plurality of memory devices 730 may be vertically stacked directly on the logic device 720.

In particular, the logic device 720 and the plurality of memory devices 730 may be connected to one another through a through-via electrode 740 and configured to transmit and receive signals through the through-via electrode 740. Also, since configurations of the plurality of memory devices 730 are described above with reference to FIG. 44D, detailed descriptions thereof are omitted here.

It will be understood by one of ordinary skill in the art that surfaces of the logic device 720 and/or the plurality of memory devices 730 and the through-via electrode 740 may be arranged as shown in FIG. 44C. Furthermore, it will also be understood by one of ordinary skill that configuration of FIG. 42A or FIG. 43 may be applied to the surfaces of the logic device 720 and/or the plurality of memory devices 730 and the through-via electrode 740 instead of the configuration of FIG. 44C.

Figure 45:
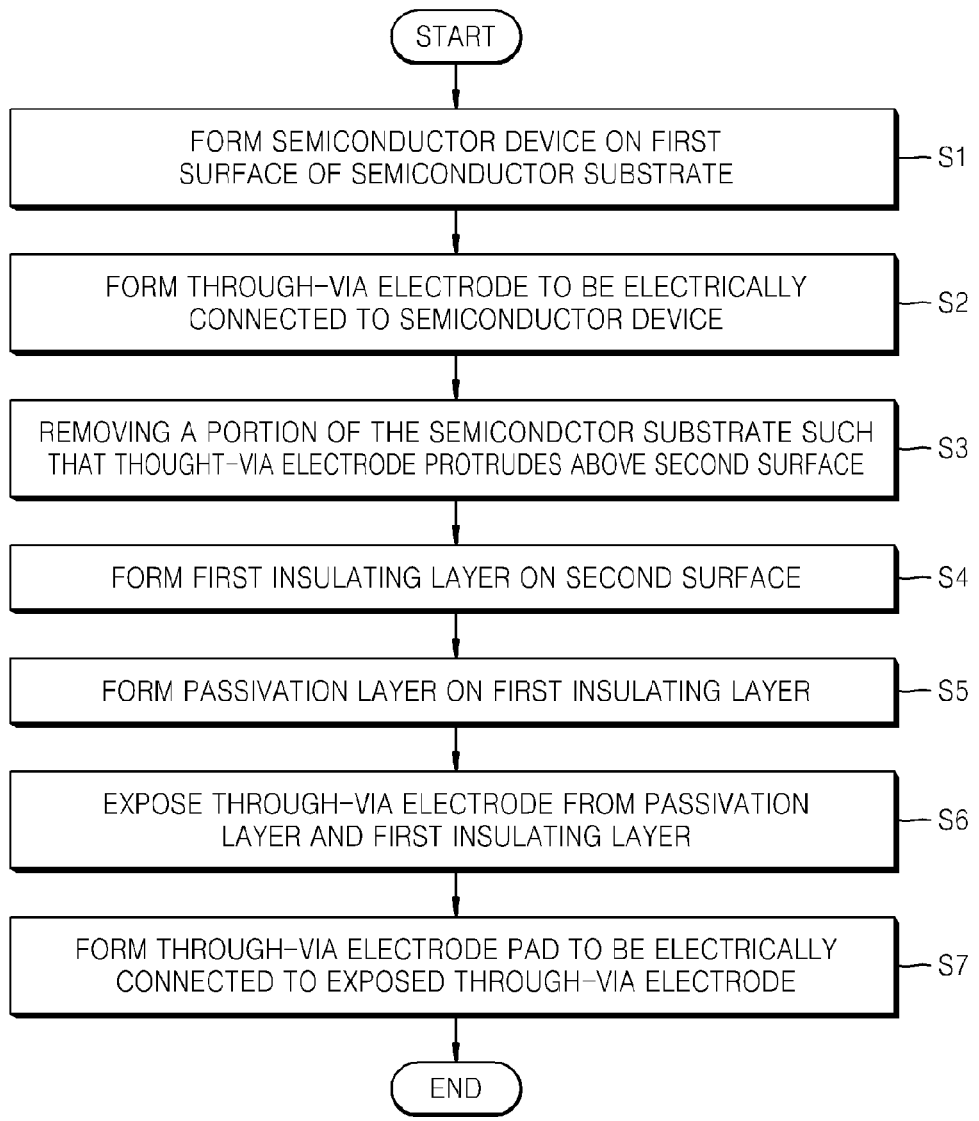

FIG. 45 is a flowchart illustrating a method of fabricating a semiconductor device according to an example embodiment. FIGS. 46A through 46F are side-sectional views illustrating sequential processes of fabricating a semiconductor device according to an example embodiment.

Figure 46A:
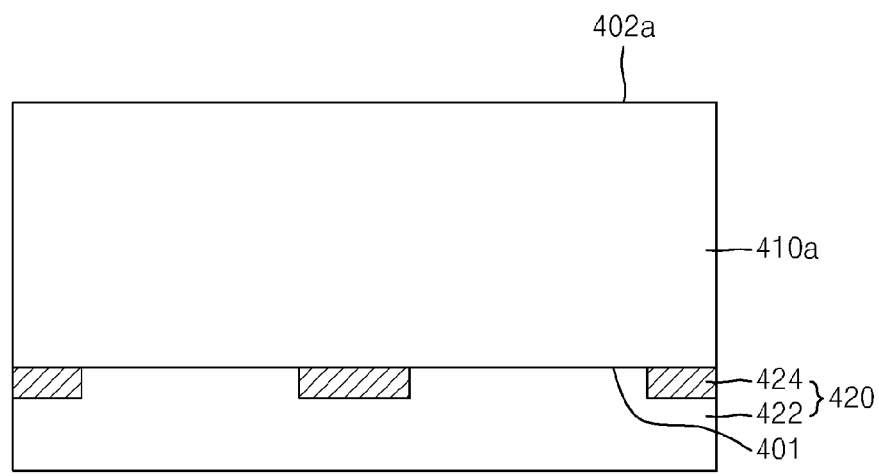
FIGS. 46A through 46F are cross-sectional side views illustrating sequential processes of manufacturing a semiconductor device according to an example embodiment.

Referring to FIGS. 45 and 46A, a semiconductor device unit 424 may be formed on a first surface (or active surface) 401 of a semiconductor substrate 410, and an interlayer insulating layer 422 may be formed over the semiconductor device unit 424 to form a circuit layer 420 (operation S1)

Since the semiconductor substrate 410 and the semiconductor device unit 424 are substantially the same as described in detail with reference to FIG. 41, detailed descriptions thereof are omitted here. Also, since the formation of the semiconductor device unit 424 on the semiconductor substrate 410 is known to one of ordinary skill in the art, detailed descriptions thereof are not presented here.

The interlayer insulating layer 422 may be an electrical insulator, for example, silicon oxide.

Figure 46B:
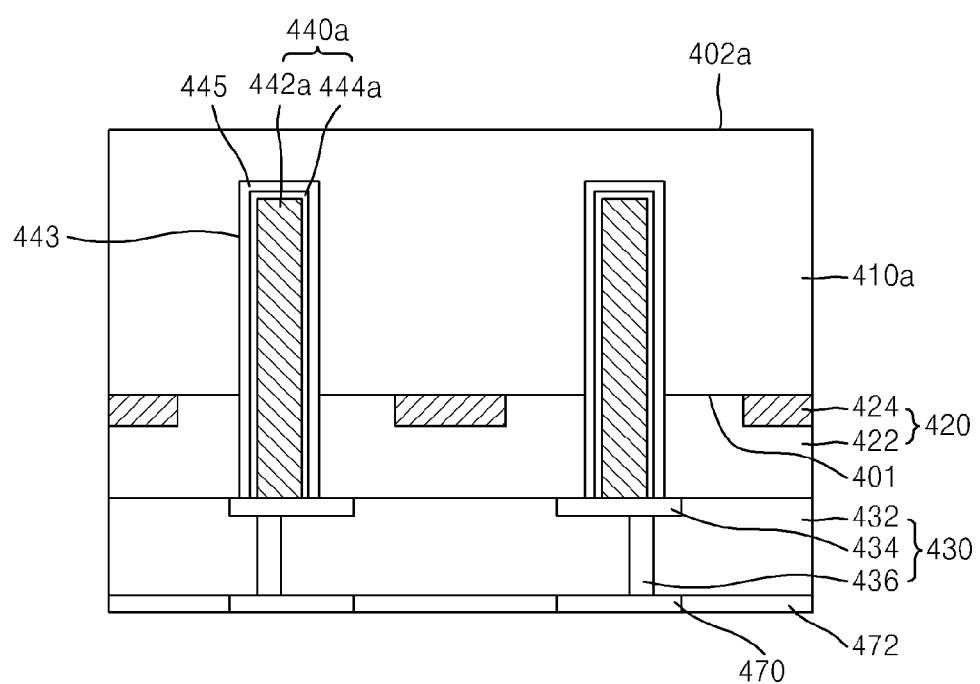

Referring to FIGS. 45 and 46B, a through-via electrode 440a to be electrically connected to the semiconductor device unit 424 may be formed (operation S2). The through-via electrode 440a may extend toward a backside surface 402a. The through-via electrode 440a may extend to a top surface of the circuit layer 420 when formed using a via-first process. It will be understood by one of ordinary skill in the art that the through-via electrode 440a may extend to a top surface of the semiconductor substrate 410 when formed using a via-first process. Also, the through-via electrode 440a may extend to the inside of an interconnection layer 430 or to a top surface thereof when formed using a via-last process.

To form the through-via electrode 440a, after a via hole 443 is formed, a spacer insulating layer 445 may be formed within the via hole. Then, a barrier metal layer 444a may be formed thereon. Thereafter, an interconnection metal layer 442a may be formed to fill the remaining portion of the via hole 443. Since the barrier metal layer 444a serves to prevent metals of the interconnection metal layer 442a from diffusing into the vicinity thereof, the barrier metal layer 444a may be omitted depending on the properties of metals forming the interconnection metal layer 442a.

After the through-via electrode 440a is formed, the interconnection layer 430 may be formed on the circuit layer 420. The interconnection layer 430 may include at least two interconnection layers as described above with reference to FIG. 41, and detailed descriptions thereof are omitted here.

Figure 46C:
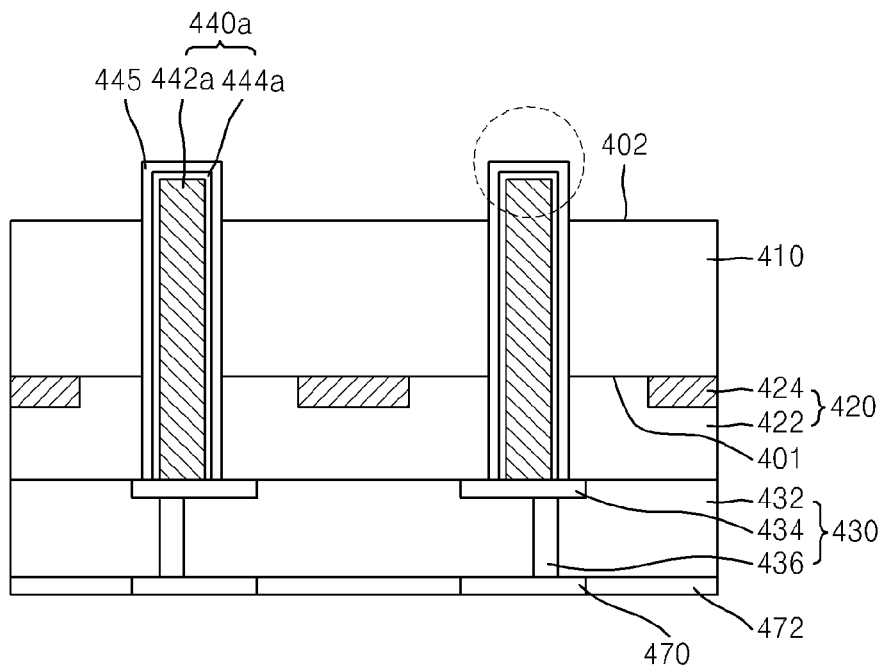

Referring to FIGS. 45 and 46C, a portion of the semiconductor substrate 410a shown in FIG. 46B (operation S3) is removed to form a second surface (non-active surface) 402 opposite to the first surface 401. Also, the through-via electrode 440a may protrude outward from the second surface 402. The illustrated structure may be obtained by removing a portion of the semiconductor substrate 410a from the backside surface 402a of FIG. 46B.

For example, a grinding process, a CMP process, and/or an etch-back process may be performed on the backside surface 402a of the semiconductor substrate to form the second surface 402 so that the through-via electrode 440a can protrude above the second surface 402. The CMP process and/or the etch-back process may be performed under conditions in which the semiconductor substrate 410a may be selectively etched with respect to the spacer insulating layer 445.

As a result, a portion of the through-via electrode 440a may protrude outward from the second surface 402 to a height of about 3 µm to about 20 µm, but the protruding height is not limited thereto.

Figure 46D:
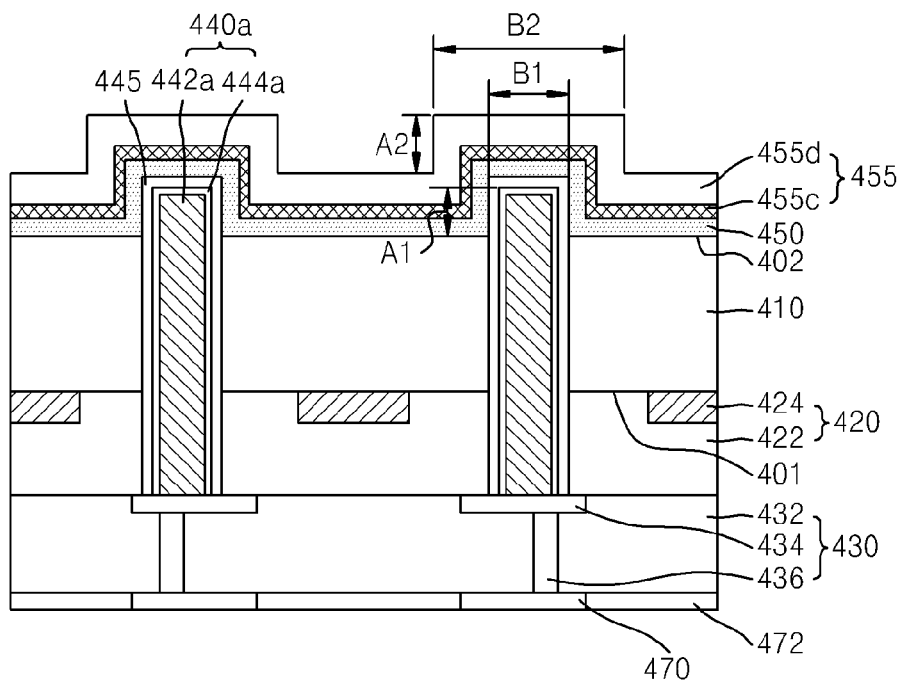

Referring to FIGS. 45 and 46D, a first insulating layer 450 and a passivation layer 455 may be formed on the second surface 402 (operations S4 and S5). The first insulating layer 450 and the passivation layer 455 may be independently formed using, for example, a chemical vapor deposition (CVD) process, a physical vapor deposition (PVD), or an atomic layer deposition (ALD) process. However, the present inventive concept is not limited thereto, and the formation of each of the first insulating layer 450 and the passivation layer 455 may be performed using other methods.

The passivation layer 455 may include a silicon nitride layer 455c and a silicon oxide layer 455d. In this case, the silicon nitride layer 455c may be formed on the first insulating layer 450, and the silicon oxide layer 455d may be formed on the silicon nitride layer 455c.

A thickness of the first insulating layer 450 may range from, for example, about 0.5 µm to about 5 µm, but is not limited thereto. The silicon nitride layer 455c of the passivation layer 455 may be formed directly on the first insulating layer 450 and have a thickness of, for example, about 0.1 µm to about 3 µm. However, the present inventive concept is not limited thereto, and the silicon nitride layer 455c may be about 0.1 to 0.7 times as thick as the first insulating layer 450.

As shown in FIG. 46D, an aspect ratio of a protrusion, which may be formed by the through-via electrode 440a and the spacer insulating layer 445 and protrude upward from the second surface 402, may be defined as A1/B1. If the aspect ratio of A1/B1 is not sufficiently small, the protrusion may be partially cut during a planarization process (e.g., a CMP process) such that the interconnection metal layer 442a of the through-via electrode 440a may be undesirably exposed. In this case, an exposed surface of the interconnection metal layer 442a may be damaged.

Accordingly, to prevent the cutting of the protrusion, the first insulating layer 450 and the passivation layer 455 may be formed on side and top surfaces of the protrusion, thereby reducing the aspect ratio. Each of the first insulating layer 450 and the passivation layer 455 may be conformally formed. In this case, a height A2 of the protrusion on which the first insulating layer 450 and the passivation layer 455 have been formed may be substantially equal to a height A1 of the protrusion of the through-via electrode 440a and the spacer insulating layer 445 that protrudes upward from the second surface 402. In contrast, a horizontal length B2 of the protrusion on which the first insulating layer 450 and the passivation layer 455 have been formed may markedly increase as compared with a horizontal length B1 of the protrusion of the through-via electrode 440a and the spacer insulating layer 445 that protrudes upward from the second surface 402. More specifically, the horizontal length B2 may increase by twice as much as a deposited thickness of the first insulating layer 450 and the passivation layer 455. Accordingly, an aspect ratio of A2/B2 obtained after the first insulating layer 450 and the passivation layer 455 are deposited may be greatly reduced as compared with the aspect ratio of A1/B1 obtained before the first insulating layer 450 and the passivation layer 455 are deposited. Even if a planarization process, such as a CMP process, the interconnection metal layer 442a may be exposed by polishing the protrusion without breaking the protrusion.

The aspect ratio of A2/B2 obtained after the first insulating layer 450 and the passivation layer 455 are deposited may range from, for example, about 0.3 to about 0.7. As described above, if the aspect ratio is excessively high, the protrusion may be broken during a CMP process. If the aspect ratio is excessively low, a large amount of time may be taken to perform a CMP process because the deposited first insulating layer 450 and/or passivation layer 455 are too thick.

Figure 46E:
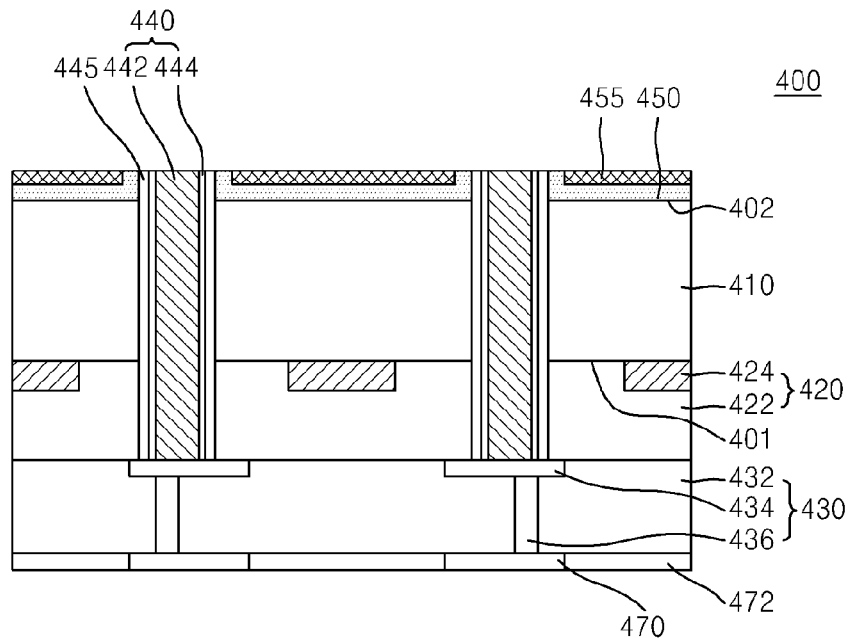

Referring to FIGS. 45 and 46E, a through-via electrode 440 may be exposed from the passivation layer 455 and the first insulating layer 450 (operation S6).

To expose the through-via electrode 440 from the passivation layer 455 and the first insulating layer 450, a CMP process may be performed using the silicon nitride layer 455c as a polishing stop layer. As a result, as shown in FIG. 46E, a top surface of the silicon nitride layer 455c may be exposed. However, a thickness of the passivation layer 455, on which the CMP process has been performed, may be slightly smaller than a thickness of the silicon nitride layer 455c due to slight over-polishing.

Due to the CMP process, the spacer insulating layer 445 and the barrier metal layer 444a overlying the interconnection metal layer 442a, which may extend in a direction parallel to the second surface 402, may be removed from the through-via electrode 440a shown in FIG. 46D. Also, due to the CMP process, the interconnection metal layer 442 of the through-via electrode 440 may be exposed. Further, due to the CMP process, the silicon oxide layer 455d shown in FIG. 46D may be substantially entirely removed.

Figure 46F:
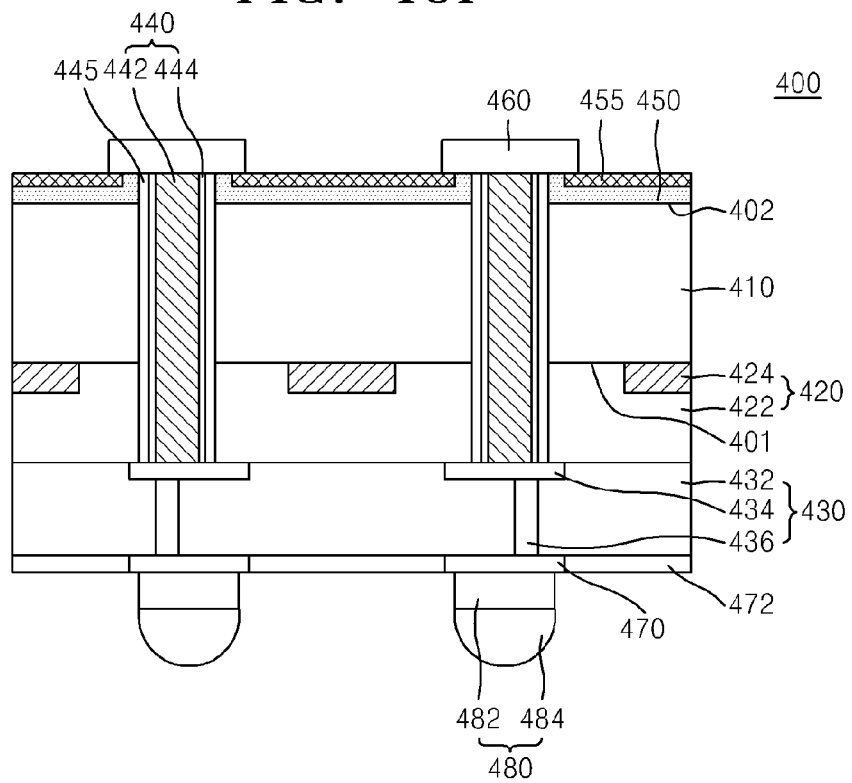

Referring to FIGS. 45 and 46F, a through-via electrode pad 460 may be formed on the interconnection metal layer 442 to be electrically connected to the exposed through-via electrode 440 (operation S7). The through-via electrode pad 460 may be formed using various methods and a method of forming the through-via electrode pad 460 is not limited to a specific method.

For example, the through-via electrode pad 460 may be formed using an electroplating process. Specifically, a seed layer may be formed on surfaces of the exposed through-via electrode 440, the first insulating layer 450, and the passivation layer 455, and a molding layer may be formed to open a desired position in which the through-via electrode pad 460 will be formed. Thereafter, an electroplating process may be then performed, thereby forming the through-via electrode pad 460 within an open portion.

Next, the molding layer and the seed layer disposed thereunder may be removed so that a plurality of through-via electrode pads 460, which are electrically isolated from one another, may be obtained.

Although the seed layer may be a Cu layer, a Ti/Cu layer, Ta/Cu layer, or a TaN layer, the present inventive concept is not limited thereto. Also, the molding layer may be formed using, for example, photoresist, and the open portion may be formed using a photolithography process.

In addition, a connection member 480 may be formed to be electrically connected to the electrode pad 470. The connection member 480 may be obtained by forming a metal pillar 482 and adhering a micro-bump 484 onto the metal pillar 482. Since methods of forming the metal pillar 482 and the micro-bump 484 are known to one of ordinary skill in the art, detailed descriptions thereof are not presented here.

Figure 47A:
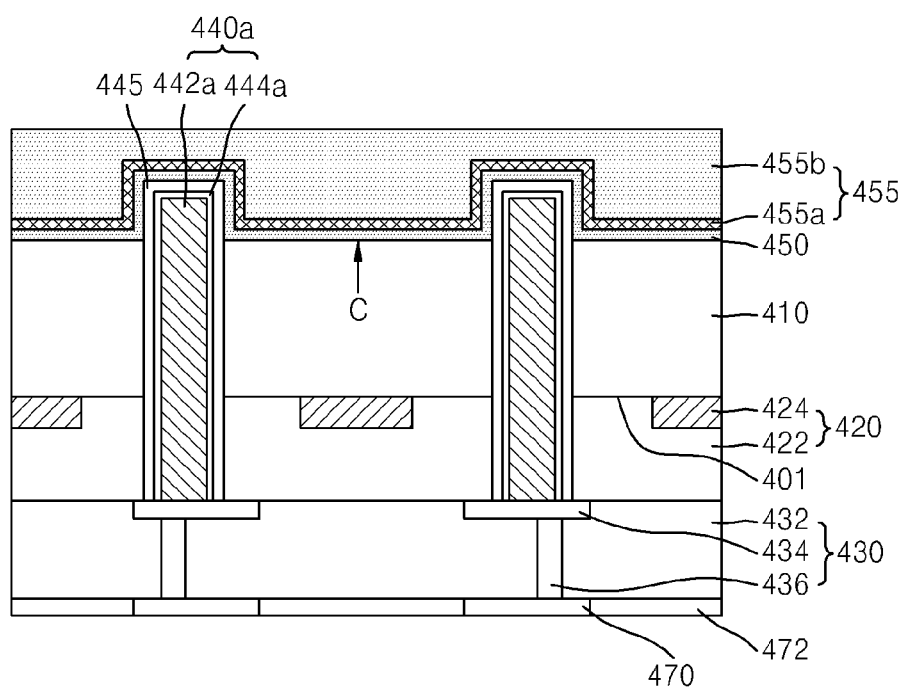
Figure 47B:
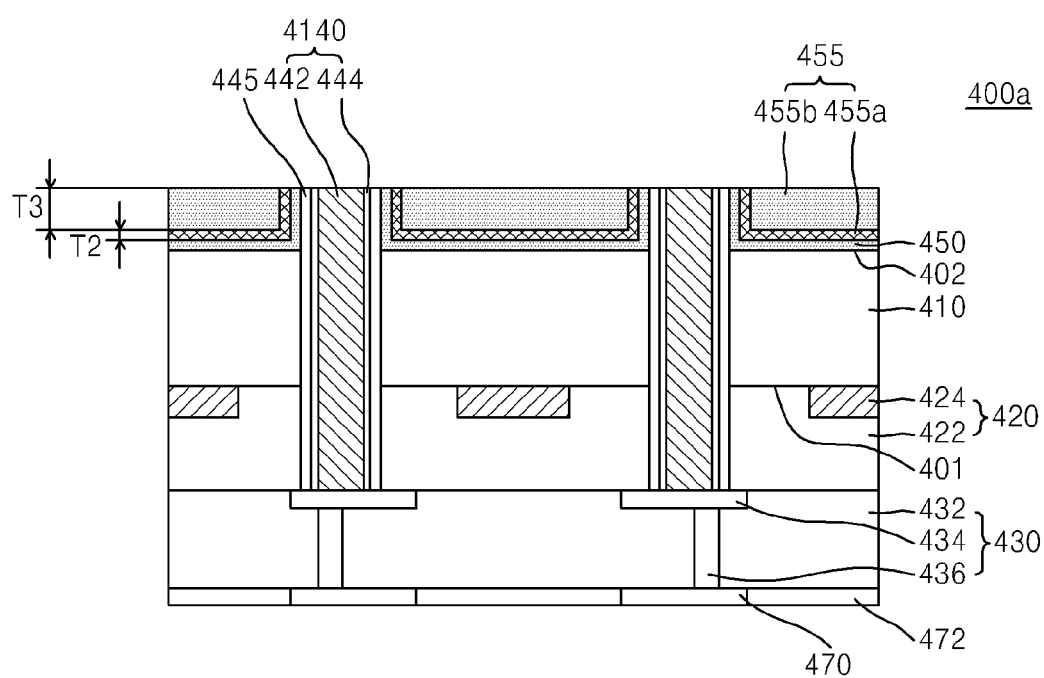

FIGS. 47A through 47C are sectional side views illustrating sequential processes of fabricating a semiconductor device according to another example embodiment.

In the present embodiment, processes performed up to a process in which one end of a through-via electrode 440a is exposed are the same as described above with reference to FIGS. 46A through 46C. Accordingly, additional descriptions of an operation S1 of forming a semiconductor device on a first surface 401 of a semiconductor substrate, an operation S2 of forming the through-via electrode 440a to be electrically connected to the semiconductor device, and an operation S3 of protruding the through-via electrode 440a from a second surface 402 are omitted.

Subsequently, referring to FIGS. 45 and 47A, a first insulating layer 450 and a passivation layer 455 may be formed on the second surface 402 (operations S4 and S5). The formation of each of the first insulating layer 450 and the passivation layer 455 may be independently performed using, for example, a CVD process, a PVD process, or an ALD process. However, the present inventive concept is not limited thereto, and the formation of each of the first insulating layer 450 and the passivation layer 455 may be formed using other methods.

Also, the passivation layer 455 may include a silicon nitride layer 455a and a silicon oxide layer 455b. In this case, the silicon nitride layer 455a may be formed on the first insulating layer 450, and the silicon oxide layer 455b may be formed on the silicon nitride layer 455a.

Here, a thickness of the first insulating layer 450 may range from, for example, about 0.01 μm to about 0.5 μm, but is not limited thereto. Also, the silicon nitride layer 455a of the passivation layer 455 may be formed directly one the first insulating layer 450, and have a thickness of, for example, about 0.02 μm to about 1 μm. The first insulating layer 450 and the silicon nitride layer 455a may be conformally formed on the second surface 402 and the through-via electrode 440a.

Furthermore, the silicon oxide layer 455b of the passivation layer 455 may be formed directly on the silicon nitride layer 455a. The silicon oxide layer 455b of the passivation layer 455 may have a thickness of, for example, about 0.5 μm to about 15 μm, but is not limited thereto. The silicon oxide layer 455b may be non-conformally formed. In this case, a thickness of the silicon oxide layer 455b may be defined as a level difference between the highest level of the silicon oxide layer 455b and the lowest level thereof.

The passivation layer 455 may be about 30 to 80 times as thick as the first insulating layer 450. Here, a thickness of the passivation layer 455 may be defined as a difference between the highest level of the passivation layer 455 and the lowest level thereof.

In particular, the thicknesses of the first insulating layer 450 and the silicon nitride layer 455a may be controlled such that the silicon nitride layer 455a is at a lower level than a top surface of an interconnection metal layer 442a at a middle point C between through-via electrodes 440a.

Also, the thickness of the silicon oxide layer 455b may be determined such that a lowest portion of a top surface of the silicon oxide layer 455b is at a higher level than a top surface of the interconnection metal layer 442a of the through-via electrode 440a. IS THIS CORRECT? Although FIG. 47A illustrates a case in which the top surface of the silicon oxide layer 455b is flat, relative level differences may occur in the top surface of the silicon oxide layer 455b depending on underlying topological features of the silicon oxide layer 455b.

Referring to FIGS. 45 and 47B, the through-via electrode 440 may be exposed from the passivation layer 455 and the first insulating layer 450 (operation S6).

In particular, to expose the through-via electrode 440 from the passivation layer 455 and the first insulating layer 450, a timed polishing process may be performed on the passivation layer 455, the first insulating layer 450, the spacer insulating layer 445, and the through-via electrode 440a. In other words, as shown in FIG. 47B, a CMP process may be performed on the passivation layer 455 for a time duration required to expose the interconnection layer 442 of the through-via electrode 440. Due to the CMP process, the top surface of the interconnection metal layer 442 may be exposed.

Due to the CMP process, portions of the silicon nitride layer 455a and the first insulating layer 450 disposed at the highest level may be removed by polishing. Also, due to the CMP process, portions of the barrier metal layer 444a and the spacer insulating layer 445 overlying the interconnection metal layer 442a, which may extend parallel to the second surface 402, may be removed. Furthermore, a portion of a top end of the interconnection metal layer 442a may be removed by polishing.

Referring to FIGS. 45 and 47C, a through-via electrode pad 460 may be formed to be electrically connected to the exposed through-via electrode 440 (operation S7). Since a method of forming the through-via electrode pad 460 is described above with reference to FIG. 46F, detailed descriptions thereof are omitted here.

Also, a connection member 480 may be formed to be electrically connected to the electrode pad 470. Since methods of forming the metal pillar 482 and the micro-bump 484 are known to one of ordinary skill in the art, detailed descriptions thereof are not provided here.

As explained thus far, in a method of fabricating a semiconductor device having a protruding through-via electrode, it has been found that when a first insulating layer interposed between a passivation layer and a semiconductor substrate, more specifically, a silicon oxide layer, is provided, delamination of the passivation layer may be prevented and refresh characteristics of the semiconductor device may be improved.

In some embodiments, as shown in FIG. 46A, a semiconductor substrate 410a having a first surface 401 and a backside surface 402a opposite to each other is provided. Then, a semiconductor device unit 424 discussed above is formed on the first surface 401. As shown in FIG. 46B, a through-via electrode 440a and a spacer insulating layer 445, which may be collectively referred to as a through-via electrode structure, may be formed through the substrate 410a to be electrically connected to the semiconductor device unit 424. The through-via electrode structure may also include subsequent material layers formed on top of the through-via electrode 440a and the spacer insulating layer 445. The through-via electrode 440a may include an interconnection metal layer 442a and a barrier metal layer 444a surrounding a side surface of the interconnection metal layer 442a. Subsequently, a portion of the semiconductor substrate 410a is removed from the backside surface 402a to form a second surface 402 opposite to the first surface 401. As a result, a portion of the through-via electrode structure protrudes above the second surface 402 as indicated by a dotted line of FIG. 46C. At this time, the protruded portion of the through-via electrode structure may have an aspect ratio of greater than 1. According to some embodiments of the inventive concept, an aspect ratio of the protruded portion of the through-via electrode structure may be reduced to about 0.3 to about 0.7 as shown in FIG. 46D. Then, a top portion of the interconnection metal layer 442 is exposed. Next, a through-via electrode pad 460 is electrically connected to the interconnection metal layer 442.

Therefore, in some embodiments, an aspect ratio of the protruded portion of the through-via electrode structure may be substantially reduced (about 50% or more) by, for example, sequentially forming a first silicon oxide layer and a silicon nitride layer on the second surface 402 in a controlled manner. For example, the silicon oxide layer may have a greater thickness than that of the silicon nitride layer.

FIG. 48 is a side-sectional view of a semiconductor device 400c according to yet another example embodiment.

Referring to FIG. 48, the semiconductor device 400c may include a first insulating layer 450, a second insulating layer 455a, a third insulating layer 455b, and a fourth insulating layer 455e sequentially stacked on a second surface 402. Repeated descriptions will be omitted for the sake of brevity because the present embodiment is the same as the embodiment described with reference to FIG. 42A except that the semiconductor device 400e further includes the fourth insulating layer 455e formed on the third insulating layer 455b.

The fourth insulating layer 455e may be, for example, a silicon nitride layer. The fourth insulating layer 455e may be in direct contact with the third insulating layer 455b and extend in a direction parallel to the second surface 402.

As described above with reference to FIG. 41, the first insulating layer 450 may extend along the second surface 402 to a through-via electrode or a spacer insulating layer 445 surrounding the through-via electrode. Also, the second insulating layer 455a may extend along a surface of the first insulating layer 450 in a direction parallel to the second surface 402.

Also, the third insulating layer 455b may extend along a surface of the second insulating layer 455a in a direction substantially parallel to the second surface 402. Optionally, the third insulating layer 455b may be conformally formed. A thickness T4 of a horizontal portion of the third insulating layer 455b, which extends substantially parallel to the second surface 402, may be substantially equal to a width W3 of a vertical portion of the third insulating layer 455b, which may be in contact with a bottom surface of a through-via electrode pad 460.

Furthermore, the bottom surface of the through-via electrode pad 460 may be in direct contact with vertical portions of the first insulating layer 450, the second insulating layer 455a, the third insulating layer 455b, and the fourth insulating layer 455e. In one aspect of the present disclosure, a top surface of the fourth insulating layer 455e may be substantially coplanar with the bottom surface of the through-via electrode pad 460.

Also, a contact area between the fourth insulating layer 455e and the bottom surface of the through-via electrode pad 460 may be provided to a substantially constant width W4 along a sidewall of the through-via electrode pad 460. In plan view, the contact area between the fourth insulating layer 455e and the through-via electrode pad 460 may have a ring or circular shape and may be concentric with top surfaces of vertical portions of the first insulating layer 450, the second insulating layer 455a, and the third insulating layer 455b, which are in contact with the through-via electrode pad 460.

By providing the fourth insulating layer 455e on the third insulating layer 455b, the overall hardness of the resulting device may be improved, and diffusion of a hetero material, such as copper (Cu), may be inhibited. Also, under certain circumstances, moisture may easily permeate a silicon oxide layer, and cracks may easily occur in the silicon oxide layer under pressure caused by phase change when heat is applied to the silicon oxide layer. However, the exposed silicon oxide layer may be covered with a silicon nitride layer, thereby enabling manufacture of a highly reliable semiconductor device.

As described above, the first chip may be mounted on the parent substrate and then the first chip is thinned. The passivation layer may be formed on the etched surface of the thinned first chip. Thus, the first chip having the thick thickness may be mounted on the parent substrate and thus the first chip may be easily handled. Additionally, because the passivation layer is formed on the etched surface of the thinned first chip, the thinned first chip may be protected. As a result, the manufacturing yield of the semiconductor packages may increase, and manufacturing time of the semiconductor packages may be reduced. Thus, the productivity of the semiconductor packages may be improved. Additionally, the reliability of the semiconductor packages may be improved.

Additionally, the parent substrate may be bonded to the carrier substrate before the first chip is mounted on the parent substrate. Thus, even when the parent substrate is thin, the carrier substrate may support the parent substrate to substantially prevent or reduce the warpage of the parent substrate. Additionally, because the carrier substrate supports the parent substrate, it is possible to improve the process margin of the thinning process performed on the first chips disposed on the parent substrate. As a result, manufacturing yield of the semiconductor packages may increase, and manufacturing time of the semiconductor packages may be reduced. Thus, the productivity of the semiconductor packages may be improved. Additionally, the reliability of the semiconductor packages and/or the semiconductor package structures may be improved.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A semiconductor device comprising:
   a substrate including a first surface and a second surface opposite to each other;

a through-via electrode extending through the substrate, the through-via electrode having an interconnection metal layer and a barrier metal layer surrounding a side surface of the interconnection metal layer, one end of the through-via electrode protruding above the second surface;

a spacer insulating layer provided on an outer sidewall of the through-via electrode;

a through-via electrode pad connected to the through-via electrode and extending on the spacer insulating layer substantially parallel to the second surface; and a first silicon oxide layer and a silicon nitride layer stacked on the second surface, wherein a thickness of the first silicon oxide layer is greater than a thickness of the silicon nitride layer.

2. The device of claim 1, wherein the first silicon oxide layer is in direct contact with the second surface.

3. The device of claim 2, wherein the silicon nitride layer is in direct contact with the first silicon oxide layer.

4. The device of claim 2, wherein the first silicon oxide layer extends along a circumference of the through-via electrode from the second surface to a bottom surface of the through-via electrode pad.

5. The device of claim 4, wherein a top surface of the silicon nitride layer is substantially coplanar with the bottom surface of the through-via electrode pad.

6. The device of claim 4, wherein the first silicon oxide layer includes a horizontal portion extending along the second surface and a vertical portion in contact with the bottom surface of the through-via electrode pad, and wherein a thickness of the horizontal portion of the first silicon oxide layer is substantially equal to a width of the vertical portion of the first silicon oxide layer.

7. The device of claim 2, wherein the thickness of the first silicon oxide layer is about 2 to 8 times as great as the thickness of the silicon nitride layer.

8. The device of claim 1, wherein the first silicon oxide layer has a modulus of about 55 to 65 GPa.

9. The device of claim 1, wherein the first silicon oxide layer has a hardness of about 5.5 to 6.2 GPa.

10. The device of claim 1, further comprising a second silicon oxide layer provided directly on the second surface, wherein the silicon nitride layer and the first silicon oxide layer are sequentially provided on the second silicon oxide layer.

11. The device of claim 10, wherein the second silicon oxide layer extends along the circumference of the through-via electrode from the second surface to a bottom surface of the through-via electrode pad.

12. The device of claim 10, wherein a thickness of the second silicon oxide layer is smaller than the thickness of the silicon nitride layer.

13. The device of claim 10, wherein a bottom surface of the through-via electrode pad is in direct contact with the first silicon oxide layer, the silicon nitride layer, and the second silicon oxide layer.

14. The device of claim 13, wherein a portion of a top surface of the first silicon oxide layer is in contact with the bottom surface of the through-via electrode pad, and the remaining portion of the top surface of the first silicon oxide layer extends on the same plane surface as the bottom surface of the through-via electrode pad in a direction substantially parallel to the second surface.

15. The device of claim 13, wherein the silicon nitride layer is a first silicon nitride layer, the semiconductor device further comprising a second silicon nitride layer provided on a top surface of the first silicon oxide layer.

16. The device of claim 15, wherein at least a portion of the second silicon nitride layer is in contact with the bottom surface of the through-via electrode pad.

17. The device of claim 10, wherein the thickness of the first silicon oxide layer is about 10 to 30 times as great as the thickness of the silicon nitride layer.

18. A semiconductor device comprising:

a semiconductor substrate having a first surface and a second surface opposite to each other;

a through-via electrode extending through the semiconductor substrate, a portion of the through-via electrode protruding above the second surface;

a through-via electrode pad coupled to the through-via electrode;

a first oxide layer formed on the first surface; and a passivation layer overlying the first oxide layer, the passivation layer contacting at least a portion of a bottom surface of the through-via electrode pad, wherein the passivation layer includes a nitride layer, wherein the passivation layer includes the nitride layer in direct contact with the oxide layer and a second oxide layer formed on the nitride layer, and wherein a thickness of the second oxide layer is greater than a thickness of the first oxide layer and/or a thickness of the nitride layer.

19. A semiconductor package comprising:

a package substrate;

at least one semiconductor device of claim 1 mounted on the package substrate; and an encapsulant configured to encapsulate the semiconductor device.

20. An electronic system comprising:

a controller;

an input/output unit for inputting or outputting data;

a memory unit for storing the data;

an interface unit for transmitting or receiving data to or from an external device; and a bus for connecting the controller, the input/output unit, the memory unit, and the interface unit so as to communicate with each other;

wherein at least one of the controller and the memory unit comprises the semiconductor device of claims 1.

* * * * *